US012598913B2

(12) United States Patent
Li et al.

(10) Patent No.: US 12,598,913 B2
(45) Date of Patent: Apr. 7, 2026

(54) ORGANIC LIGHT EMITTING DEVICE AND DISPLAY APPARATUS

(71) Applicant: KunShan Go-Visionox Opto-Electronics Co., Ltd, Kunshan (CN)

(72) Inventors: Guomeng Li, Kunshan (CN); Yuewei Zhang, Kunshan (CN); Jinbei Wei, Kunshan (CN); Mengzhen Li, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 850 days.

(21) Appl. No.: 17/514,617

(22) Filed: Oct. 29, 2021

(65) Prior Publication Data

US 2022/0052266 A1 Feb. 17, 2022

Related U.S. Application Data

(63) Continuation of application No. PCT/CN2020/101652, filed on Jul. 13, 2020.

(30) Foreign Application Priority Data

Oct. 23, 2019 (CN) ........................ 201911013744.6

(51) Int. Cl.

| | |
|---|---|
| ***H10K 85/60*** | (2023.01) |
| ***H10K 50/11*** | (2023.01) |
| ***H10K 85/30*** | (2023.01) |
| ***H10K 101/10*** | (2023.01) |

(52) U.S. Cl.

CPC ......... *H10K 85/636* (2023.02); *H10K 85/324* (2023.02); *H10K 85/622* (2023.02); *H10K 85/624* (2023.02); *H10K 85/626* (2023.02); *H10K 85/633* (2023.02); *H10K 85/654* (2023.02); *H10K 85/6572* (2023.02); *H10K 85/6574* (2023.02); *H10K 85/658* (2023.02); *H10K 50/11* (2023.02); *H10K 2101/10* (2023.02)

(58) Field of Classification Search

CPC .. H10K 85/322; H10K 85/636; H10K 85/657; H10K 85/658; H10K 85/656

See application file for complete search history.

(56) References Cited

U.S. PATENT DOCUMENTS

| | | | | |
|---|---|---|---|---|
| 2020/0328352 A1* | 10/2020 | Ahn | ..................... | H10K 85/636 |
| 2020/0388770 A1* | 12/2020 | Lee | ...................... | H10K 85/654 |

FOREIGN PATENT DOCUMENTS

| | | | | |
|---|---|---|---|---|
| CA | 3017010 A1 * | 3/2019 | | |
| CN | 102428588 A | 4/2012 | | |
| CN | 107641096 A | 1/2018 | | |
| CN | 108948056 A | 12/2018 | | |
| CN | 109346614 A | 2/2019 | | |
| CN | 109411633 A | 3/2019 | | |
| CN | 109817818 A | 5/2019 | | |
| CN | 110317139 A | 10/2019 | | |
| CN | 110729408 A | 1/2020 | | |
| EP | 3054498 A1 | 8/2016 | | |
| WO | 2005075600 A1 | 8/2005 | | |
| WO | WO-2021008374 A1 * | 1/2021 | ............. | C07F 19/00 |

OTHER PUBLICATIONS

Machine Translation of WO2021008374A1 (Year: 2021).*

International Search Report issued on Oct. 16, 2020 in corresponding application No. PCT/CN2020/101652, 3 pgs.

* cited by examiner

*Primary Examiner* — Jenna N Chandhok

(74) *Attorney, Agent, or Firm* — Maier & Maier, PLLC

(57) ABSTRACT

An organic light emitting device and a display apparatus, where the organic light emitting device includes a light-emitting layer, the light-emitting layer includes a host material and a dye, the host material is a triplet-triplet annihilation material, and the dye is the boron-nitrogen material shown in Formula 1. The organic light emitting device has excellent light-emitting efficiency and color purity.

Formula 1

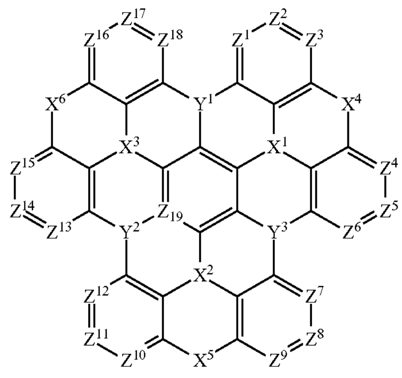

20 Claims, No Drawings

ORGANIC LIGHT EMITTING DEVICE AND DISPLAY APPARATUS

CROSS-REFERENCE TO RELATED APPLICATION

The disclosure is a continuation of International Application No. PCT/CN2020/101652, filed on Jul. 13, 2020, which claims priority to Chinese Patent Application No. 2019110137446, filed on Oct. 23, 2019. The disclosures of the aforementioned applications are hereby incorporated by reference in their entireties.

TECHNICAL FIELD

The present application relates to an organic light emitting device and a display apparatus, belonging to the technical field of organic light emitting.

BACKGROUND

Organic Light Emitting Diode (abbreviated as: OLED) is a device driven by current to achieve the light-emitting effect, and its main characteristics is derived from an organic light-emitting layer. Upon an appropriate voltage is applied, electrons and holes will combine to generate excitons in the organic light-emitting layer and emit light of different wavelengths according to the characteristics of the organic light-emitting layer.

At the present stage, the light-emitting layer is composed of host materials and dyes, and the dyes are mostly selected from traditional fluorescent materials and traditional phosphorescent materials. Although the traditional phosphorescent materials have high efficiency, they are expensive and have poor stability, and the traditional fluorescent materials are cheap but have extremely low efficiency.

Even if the traditional fluorescent material as dye matches the host material of a triplet-triplet annihilation material, the blue fluorescent device has a low the internal quantum efficiency, and there are still problems such as insufficient color purity of the device.

SUMMARY

The present application provides an organic light emitting device, which can effectively improve the light-emitting efficiency and color purity of the organic light emitting device by adjusting the composition of the light-emitting layer.

The present application also provides a display apparatus. The display apparatus has excellent light-emitting efficiency and color purity due to the presence of the above organic light emitting device.

The present application provides an organic light emitting device, including a light-emitting layer, the light-emitting layer including a host material and a dye, where the host material is a triplet-triplet annihilation material, and the dye is a boron-nitrogen material represented by Formula 1;

the singlet energy level of the triplet-triplet annihilation material is greater than that of the boron-nitrogen material, and the triplet energy level of the triplet-triplet annihilation material is less than that of the boron-nitrogen material;

Formula 1

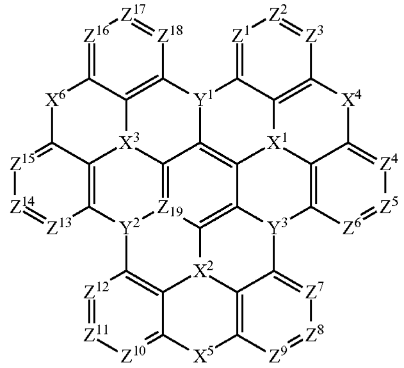

where, each of $Y^1$, $Y^2$ and $Y^3$ is independently selected from H or B, and not more than one of them is H;

each of $X^1$, $X^2$ and $X^3$ is independently selected from N or H, and not more than one of them is H;

each of $X^4$, $X^5$ and $X^6$ is independently selected from H, single bond, O, S or $CR_a$, and when each of $X^4$, $X^5$ and $X^6$ is independently selected from H, not more than two of them are H, where each $R_a$ is independently selected from one of the following groups: substituted or unsubstituted C1-C10 alkyl group, substituted or unsubstituted C6-C30 monocyclic or polycyclic aromatic hydrocarbon, substituted or unsubstituted C5-C30 monocyclic or polycyclic hetero-aromatic hydrocarbon;

each of $Z^1$, $Z^3$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$, where each $R^b$ is independently selected from hydrogen, deuterium, halogen, cyano, or one of the following groups: substituted or unsubstituted C1-C36 alkyl, substituted or unsubstituted C2-C6 alkenyl, substituted or unsubstituted C1-C6 alkoxy or thioalkoxy, substituted or unsubstituted C6-C48 monocyclic or polycyclic aromatic hydrocarbon, and substituted or unsubstituted C3-C48 monocyclic or polycyclic hetero-aromatic hydrocarbon, and two adjacent $R_b$ groups are independent to each other or at least two adjacent $R_b$ groups are bonded to each other to form C3-C10 cycloalkane, C6-C30 aromatic hydrocarbon or C5-C30 hetero-aromatic hydrocarbon;

$Z_{19}$ is selected from N or C;

if substituents exist in the above groups, each of the substituents is independently selected from one of deuterium, cyano, halogen, C1-C10 alkyl or cycloalkyl, C2-C6 alkenyl or cycloalkenyl, C1-C6 alkoxy or thioalkoxy, nitro, amido, carbonyl, carboxyl, ester, C6-C30 aryl, and C3-C30 heteroaryl.

Optionally, the boron-nitrogen material has a structure represented by Formula 1-1 or 1-2, Formula 1-1

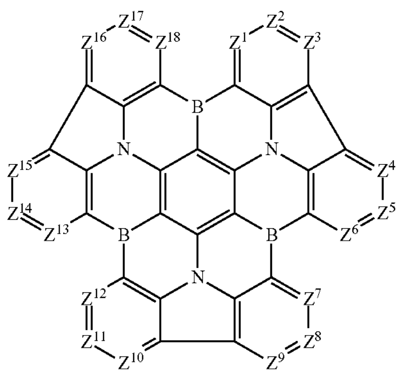

Formula 1-2

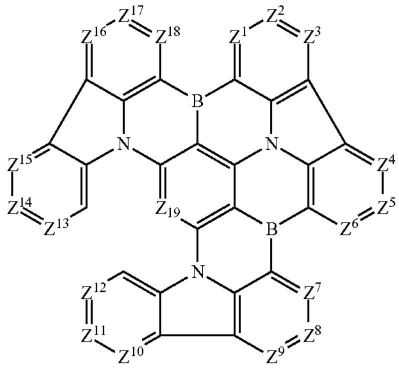

where, each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ is independently selected from N or $CR_b$;

$Z_{19}$ is selected from N or C.

Optionally, not more than six of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ are N atom.

Optionally, not more than three of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ are N atom.

Optionally, in Formula 1-1 and Formula 1-2, at least one of $Z^2$, $Z^5$, $Z^8$, $Z^{11}$, $Z^{14}$, and $Z^{17}$ is N atom.

Optionally, each $R^b$ is independently selected from one of hydrogen, deuterium, methyl, ethyl, n-propyl, isopropyl, n-butyl, isobutyl, sec-butyl, tert-butyl, 2-methylbutyl, n-pentyl, sec-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, methoxy, phenyl, naphthyl, anthryl, benzoanthryl, phenanthryl, benzophenanthryl, pyrenyl, cavity group, peryl, fluoranthenyl, tetracenyl, pentacenyl, benzopyrenyl, biphenyl, bisphenyl, terphenyl, triphenyl, quaterphenyl, fluorenyl, spirobifluorenyl, dihydrophenanthryl, dihydropyrenyl, tetrahydropyrenyl, cis or trans indenofluorenyl, trimetric indenyl, isotrimeric indenyl, spirotrimeric indenyl, spiroisotrimeric indenyl, furanyl, benzofuranyl, isobenzofuranyl, dibenzofuranyl, thienyl, methyl-substituted thienyl, benzothienyl, isobenzothienyl, dibenzothienyl, pyrrolyl, isoindolyl, carbazolyl, indenocarbazolyl, pyridyl, methyl-substituted pyridyl, quinolinyl, isoquinolinyl, acridinyl, phenanthridinyl, benzo-5,6-quinolinyl, benzo-6,7-quinolinyl, benzo-7,8-quinolinyl, pyrazolyl, indazolyl, imidazolyl, benzimidazolyl, naphthoimidazolyl, phenanthroimidazolyl, pyridoimidazolyl, pyrazinoimidazolyl, quinoxalinoimidazolyl, oxazolyl, benzoxazolyl, naphtho-oxazolyl, anthraoxazolyl, phenanthro-oxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthryl, 2,7-diazapyrenyl, 2,3-diazapyrenyl, 1,6-diazapyrenyl, 1,8-diazapyrenyl, 4,5-diazapyrenyl, 4,5,9,10-tetraazaperyl, pyrazinyl, phenazinyl, phenothiazinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, 9,9-dimethylacridinyl, (poly)halobenzene, (poly) cyanobenzene, (poly)trifluoromethylbenzene, or a combination of the above two substituent groups.

Optionally, the boron-nitrogen material is selected from a compound having one of the structures represented by A-1 to A-150 in the present application.

Optionally, the dye has a mass proportion of 0.1-20% in the light-emitting layer.

Optionally, the singlet energy level of the triplet-triplet annihilation material is greater than that of the boron-nitrogen material, and the triplet energy level of the triplet-triplet annihilation material is less than that of the boron-nitrogen material.

The present application also provides a display apparatus, including any one of the above organic light emitting devices.

The organic light emitting device of the present application uses a triplet-triplet annihilation material as the host material to sensitize the boron-nitrogen material of the structure represented by Formula 1 to emit light. The boron-nitrogen material has an extremely narrow emission spectrum due to its special structure, and thus it is beneficial to improve the color purity of the organic light emitting device. In addition, there is very small difference between the singlet state energy level and the triplet state energy level of the boron-nitrogen material, and the combination of the boron-nitrogen material with the triplet-triplet annihilation material can effectively suppress the TPA (triple polaron annihilation) phenomenon and further improve the exciton utilization rate, thereby beneficial to increase the light-emitting efficiency of the device.

DETAILED DESCRIPTION OF THE EMBODIMENTS

In order to make the purpose, technical solutions and advantages of the present application clearer, the technical solutions in the embodiments of the present application will be clearly and completely described below in conjunction with the embodiments of the present application. Obviously, the described embodiments are part of the embodiments of the present application, not all embodiments. Based on the embodiments in the present application, all other embodiments obtained by those of ordinary skill in the art without creative work shall fall within the protection scope of the present application.

The organic light emitting device of the present application includes an anode, a hole transport region, a light-emitting layer, an electron transport region, and a cathode, which are sequentially deposited on a substrate.

Where, the substrate, the anode, the hole transport region, the electron transport region, and the cathode may use materials commonly used in the art. For example, the substrate may use glass or polymer materials with excellent mechanical strength, thermal stability, water resistance, and transparency; the anode material may use indium tin oxide (ITO), indium zinc oxide (IZO), tin oxide ($SnO_2$), zinc oxide (ZnO), other oxide transparent conductive material, and any combination thereof; and the cathode may use magnesium (Mg), silver (Ag), aluminum (Al), aluminum-lithium (Al—Li), calcium (Ca), magnesium-indium (Mg—In), magnesium-silver (Mg—Ag), other metal or alloy, and any combination thereof.

Hereinafter, the light-emitting layer will be described in detail.

The light-emitting layer of the present application includes a host material and a dye, where the host material is a triplet-triplet annihilation material, and the dye is a boron-nitrogen material represented by Formula 1.

The singlet energy level of the triplet-triplet annihilation material is greater than that of the boron-nitrogen material, and the triplet energy level of the triplet-triplet annihilation material is smaller than that of the boron-nitrogen material;

Formula 1

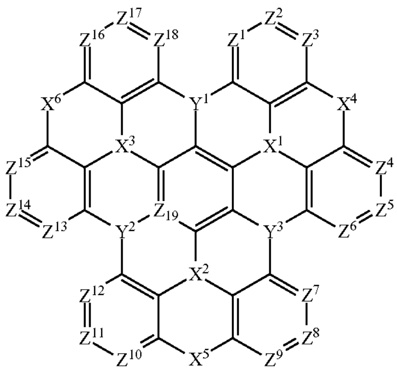

Where each of $Y^1$, $Y^2$, and $Y^3$ is independently selected from H or B, and not more than one of them is H.

Each of $X^1$, $X^2$, and $X^3$ is independently selected from N or H, and not more than one of them is H.

Each of $X^4$, $X^5$, and $X^6$ is independently selected from H, single bond, O, S or $CR_a$, when each of $X^4$, $X^5$, and $X^6$ is independently selected from H, not more than two of them are H, where $R_a$ is independently selected from one of the following groups: substituted or unsubstituted C1-C10 alkyl, substituted or unsubstituted C6-C30 monocyclic or polycyclic aromatic hydrocarbon, and substituted or unsubstituted C5-C30 monocyclic or polycyclic hetero-aromatic hydrocarbon.

Each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$, where each $R_b$ is independently selected from hydrogen, deuterium, halogen, cyano, or one of the following groups: substituted or unsubstituted C1-C36 alkyl, substituted or unsubstituted C2-C6 alkenyl, substituted or unsubstituted C1-C6 alkoxy or thioalkoxy, substituted or unsubstituted C6-C48 monocyclic or polycyclic aromatic hydrocarbon, substituted or unsubstituted and C3-C48 monocyclic or polycyclic hetero-aromatic hydrocarbon, and two adjacent $R_b$ groups are independent of each other or at least two adjacent $R_b$ groups are bonded to each other to form C3-C10 cycloalkane, C6-C30 aromatic hydrocarbon or C5-C30 hetero-aromatic hydrocarbon.

$Z_{19}$ is selected from N or C.

If substituents exist in the above groups, the substituents are independently selected from one of deuterium, cyano, halogen, C1-C10 alkyl or cycloalkyl, C2-C6 alkenyl or cycloalkenyl, C1-C6 alkoxy or thioalkoxy, nitro, amido, carbonyl, carboxyl, ester, C6-C30 aryl, and C3-C30 heteroaryl.

In Formula 1, at least two of $Y^1$, $Y^2$, and $Y^3$ are B atom, and at least two of $X^1$, $X^2$, and $X^3$ are N atom.

When each of $X^4$, $X^5$, and $X^6$ is independently selected from H atom, not more than two of them may be hydrogen atom at the same time, that is, at least one of them is a single bond, O, S or $CR_a$.

$Z_{19}$ is selected from N or C atom. It can be understood that when $Z_{19}$ is selected from N atom, $Z_{19}$ is not connected to any group except for the heteroatom of the central pyridine.

Further, each $R^b$ is independently selected from hydrogen, deuterium, halogen, cyano, or one of the following groups: substituted or unsubstituted C1-C36 alkyl, further, substituted or unsubstituted C1-C10 alkyl; substituted or unsubstituted C2-C6 alkenyl; substituted or unsubstituted C1-C6 alkoxy or thioalkoxy; substituted or unsubstituted C6-C48 monocyclic or polycyclic aromatic hydrocarbon, further, substituted or unsubstituted C6-C30 monocyclic or polycyclic aromatic hydrocarbon; substituted or unsubstituted C3-C48 monocyclic or polycyclic hetero-aromatic hydrocarbon, further, substituted or unsubstituted C3-C30 monocyclic or polycyclic hetero-aromatic hydrocarbon; and two adjacent $R_b$ groups may be independent to each other without any connection relationship, or, at least two adjacent $R_b$ groups may be bonded to each other to form a C3-C10 cycloalkane, C6-C30 aromatic hydrocarbon or C5-C30 hetero-aromatic hydrocarbon, where the two adjacent $R_b$ groups mean that there is a bonding relationship between the carbon atoms connected to the two $R_b$ groups.

When $R_a$ and $R_b$ have substituents, each of the substituents is independently selected from one of deuterium, cyano, halogen, C1-C10 alkyl or cycloalkyl, C2-C6 alkenyl or cycloalkenyl, C1-C6 alkoxy or thioalkoxy, nitro, amine, carbonyl, carboxyl, ester, C6-C30 aryl (including monocyclic or polycyclic aryl), and C3-C30 heteroaryl (including monocyclic or polycyclic heteroaryl).

According to the above description, it can be understood that the boron-nitrogen material represented by Formula 1 of the present application can be divided into three kinds. Where the first kind is that $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ are all independently selected from $CR_b$; the second kind is that $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ are all selected from N; and the third kind is that $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ contain both N atom and same or different $CR_b$. In specific applications, the boron-nitrogen material may be any one of the above three kinds of materials.

According to the technical solution provided by the present application, by using the triplet-triplet annihilation material as the host material and the dye of the above composition as the light-emitting layer, the blue light color purity and light-emitting efficiency of the organic light emitting device can be significantly improved. Based on the analysis of this phenomenon, the applicant believes that it may be that the boron-nitrogen material of the present application simultaneously introduces 2-3 boron atoms at positions 2, 4, and 6 of the benzene ring or pyridine ring, which increases the electron withdrawing ability of molecule to a certain extent, to form a buckle ring with the adjacent carbazole derivative donor, so that centralized molecular structure HOMO-LOMO and good planar conjugation are achieved, and there is no obvious intramolecular charge transfer excited state inside the molecule, thereby obtaining a narrower emission spectrum which helps to narrow the spectrum of the device and improve the color purity of the device. At the same time, the donors of rigid carbazole, phenoxazine or phenoxazine and its derivative are introduced into the 1, 3 and 5 positions of the benzene ring or pyridine ring in the center of the boron-nitrogen material respectively, which increases the rigidity of the molecule after matching with 2-3 boron atoms and is beneficial to further reduce its vibration relaxation and blue shift in the spectrum; moreover, when not more than two of $X^4$, $X^5$, and $X^6$ are hydrogen atom, it can further increase the coordination rigidity of the ligand and the central boron atom, reduce unnecessary vibrational-rotational energy loss, and improve the light-emitting efficiency of the device by increasing the external quantum light-emitting efficiency.

In addition, compared with a single boron atom, the energy level difference between the singlet state and the triplet state of the above boron-nitrogen material with 2-3 boron atoms introduced is smaller, so that more triplet excitons are prone to up-conversion and shifting to singlet state, resulting in delayed fluorescence. Therefore, compared with combination of the traditional fluorescent dye and triplet-triplet annihilation material, the boron-nitrogen material of the present application as a dye can increase the utilization rate of excitons and further improve the light-emitting efficiency of the device; moreover, since the triplet energy level of the boron-nitrogen material is higher than that of the triplet-triplet annihilation material, part of the triplet excitons that fail to perform up-conversion will also migrate to the triplet energy level of the low-energy triplet-triplet annihilation material, thereby solving the problem of self-quenching of the triplet excitons of the boron-nitrogen material, and being conducive to the improvement of the light-emitting efficiency of the device.

Moreover, when the boron-nitrogen material is selected from the above second or third kind of materials, it has a more significant improvement in the light-emitting efficiency of the device, which may be due to the introduction of a type of ligand containing N heterocycle in the boron-nitrogen material; after the ligand is matched with the B atom, it is beneficial to increase the electronegativity of the molecule, and has a regulating effect on the HOMO/LUMO energy level of the compound, which can change the electron transport ability of the molecule to a large extent and be conducive to further improving the efficiency of the device.

Further, the boron-nitrogen material of the present application may have a structure represented by Formula 1-1 or Formula 1-2, Formula 1-1

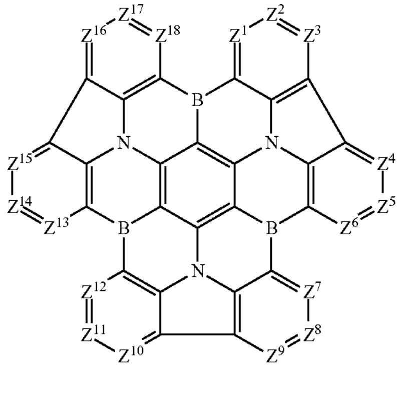

-continued

Formula 1-2

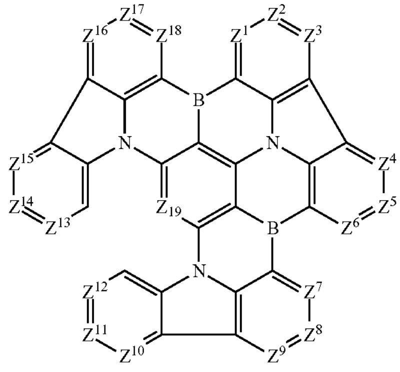

Where each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$, and $R_b$ is same as the previous definition, and will not be explained here.

In Formula 1-2, $Z_{19}$ is selected from N or C.

Specifically, in Formula 1-1, $Y^1$, $Y^2$, and $Y^3$ are all selected from B atom, and $X^1$, $X^2$, and $X^3$ are all selected from N atom.

In Formula 1-2, two of $Y^1$, $Y^2$, and $Y^3$ are selected from B atom and the other one is H atom, and $X^1$, $X^2$, and $X^3$ are all selected from N atom.

In one embodiment, when $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ in Formula 1, Formula 1-1, and Formula 1-2 contain N atoms, not more than six nitrogen atoms are included therein, and the remaining are $CR_b$. Compounds of this structure can further improve the electron transport performance of the material, thereby improving the performance of the device. If there are too many N heteroatoms, it will be more difficult to coordinate with B atom and the stability of the molecular structure will not be sufficient; and it is difficult to synthesize, and is not conducive to large-scale production. Furthermore, when $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, $Z^{18}$, and $Z_{19}$ in Formula 1, Formula 1-1, and Formula 1-2 contain N atoms, and not more than three nitrogen atoms are included therein.

In order to optimize the degree of coordination between the N heterocyclic ligand and the B atom in the boron-nitrogen material, the applicant adjusted the N heterocyclic ligand and found that when the N atom in the N heterocyclic ligand is disposed at γ position in the carbazolyl group, the N ligand with N heteroatom at a special position and the B atom have the best coordination degree, which is extremely beneficial to improve the electron transport ability of the molecule, and thus further improves the light-emitting efficiency of the device. Specifically, in Formula 1, Formula 1-1, and Formula 1-2, at least one of $Z^2$, $Z^5$, $Z^8$, $Z^{11}$, $Z^{14}$, and $Z^{17}$ is N atom.

When at least one of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ in the present application is $CR_b$, $R_b$ is each independently selected from: one of hydrogen, deuterium, methyl, ethyl, n-propyl, isopropyl, n-butyl, isobutyl, sec-butyl, tert-butyl, 2-methylbutyl, n-pentyl, sec-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, methoxy, phenyl, naphthyl, anthryl, benzoanthryl, phenanthryl, benzophenanthryl, pyrenyl, cavity group, peryl, fluoranthenyl, tetracenyl, pentacenyl, benzopyrenyl, biphenyl, bisphenyl, terphenyl, triphenyl, quaterphenyl, fluorenyl, spirobifluorenyl, dihydrophenanthryl, dihydropyrenyl, tetrahydropyrenyl, cis or trans indenofluorenyl, trimetric indenyl, isotrimeric indenyl, spirotrimeric indenyl, spiroisotrimeric indenyl, furanyl, benzofuranyl, isobenzofuranyl, dibenzofuranyl, thienyl, methyl-substituted thienyl, benzothienyl, isobenzothienyl, dibenzothienyl, pyrrolyl, isoindolyl, carbazolyl, indenocarbazolyl, pyridyl, methyl-substituted pyridyl, quinolinyl, isoquinolinyl, acridinyl, phenanthridinyl, benzo-5,6-quinolinyl, benzo-6,7-quinolinyl, benzo-7,8-quinolinyl, pyrazolyl, indazolyl, imidazolyl, benzimidazolyl, naphthoimidazolyl, phenanthroimidazolyl, pyridoimidazolyl, pyrazinoimidazolyl, quinoxalinoimidazolyl, oxazolyl, benzoxazolyl, naphtho-oxazolyl, anthraoxazolyl, phenanthro-oxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthryl, 2,7-diazapyrenyl, 2,3-diazapyrenyl, 1,6-diazapyrenyl, 1,8-diazapyrenyl, 4,5-diazapyrenyl, 4,5,9,10-tetraazaperyl, pyrazinyl, phenazinyl, phenothiazinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, 9,9-dimethylacridinyl, (poly)halobenzene, (poly) cyanobenzene, (poly)trifluoromethylbenzene, or a combination of the above two substituent groups.

Specifically, the boron-nitrogen material of the present application is preferably a compound having one of the following structures:

A-1

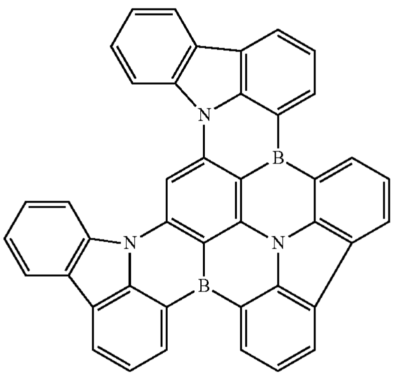

A-2

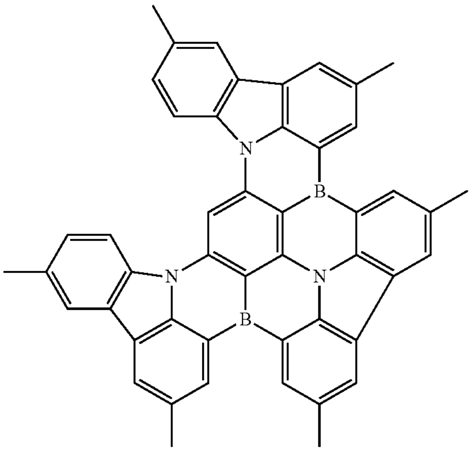

-continued

A-3

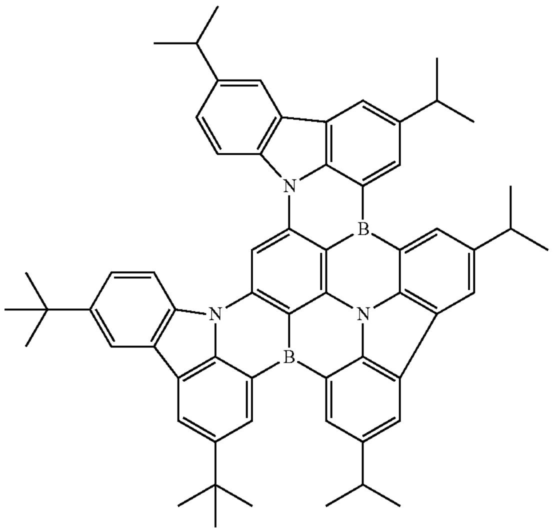

A-4

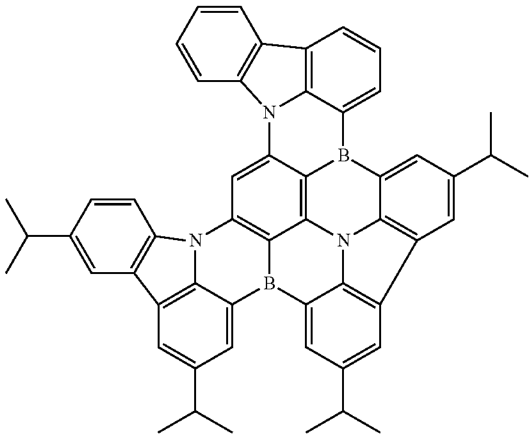

A-5

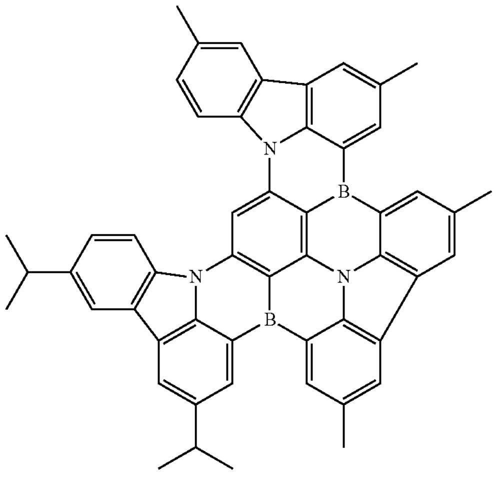

-continued
A-6
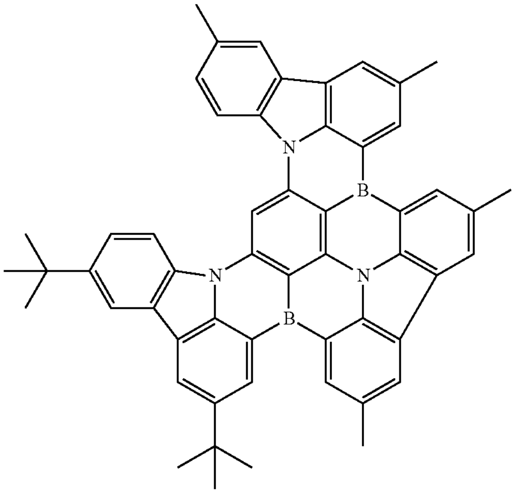
A-7
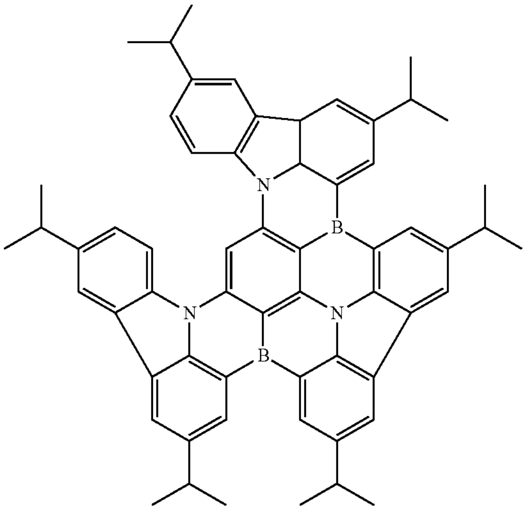
A-8
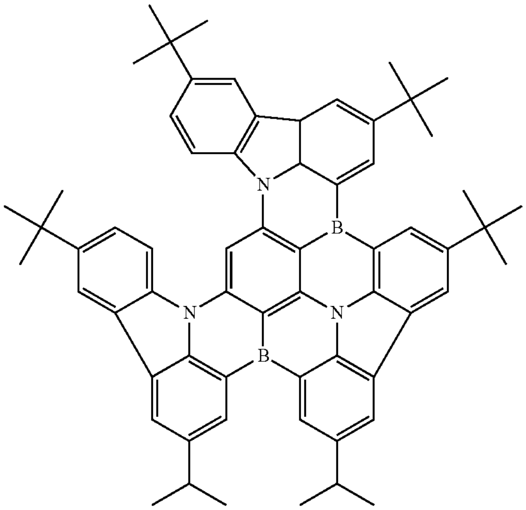
-continued
A-9
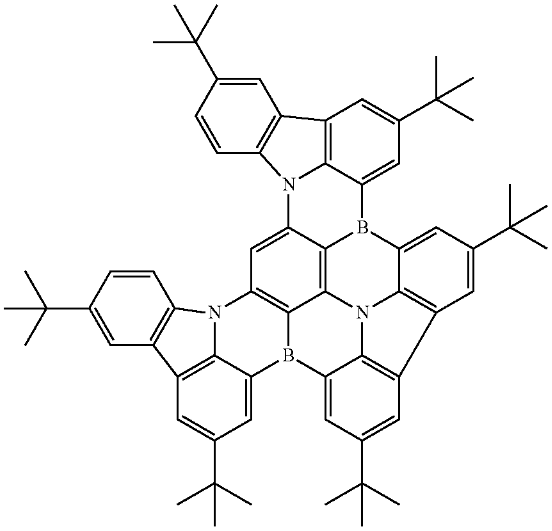
A-10
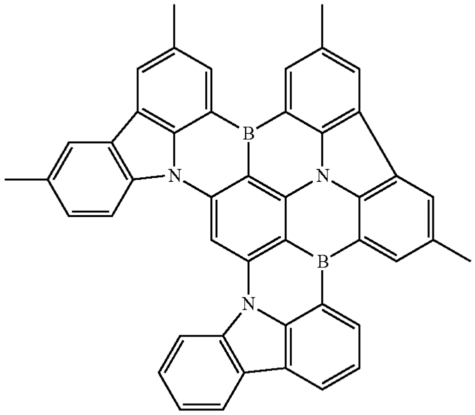
A-11
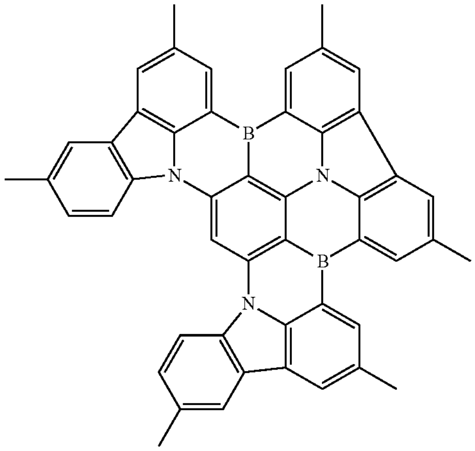

-continued
A-12
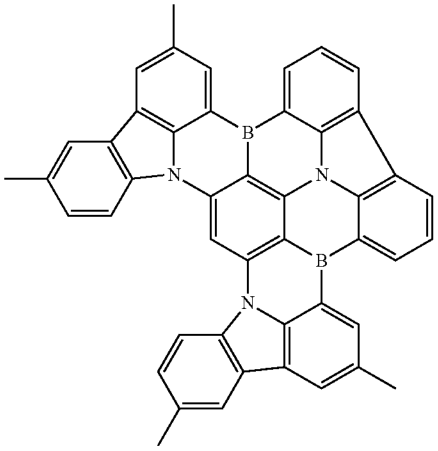
A-13
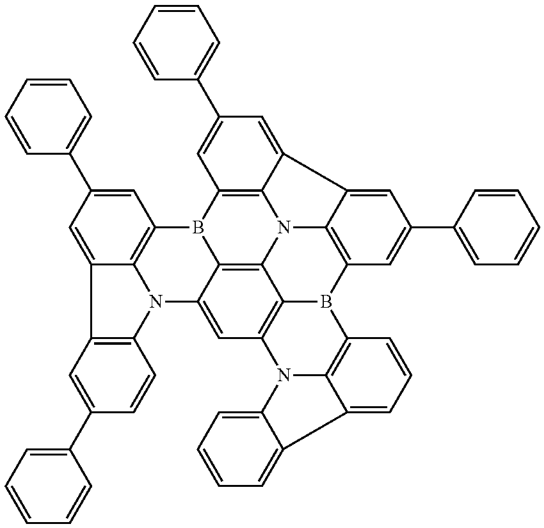
A-14
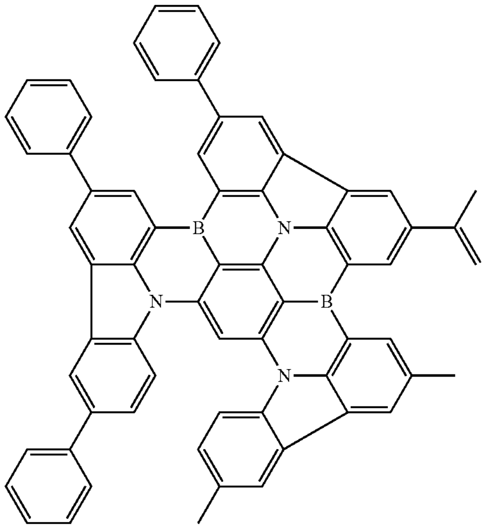
-continued
A-15
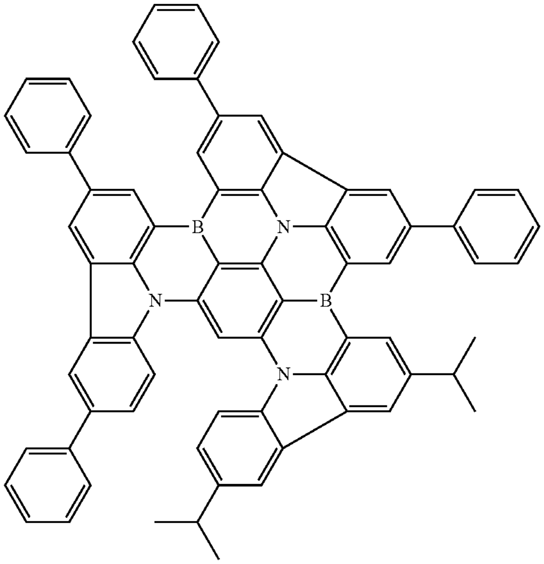
A-16
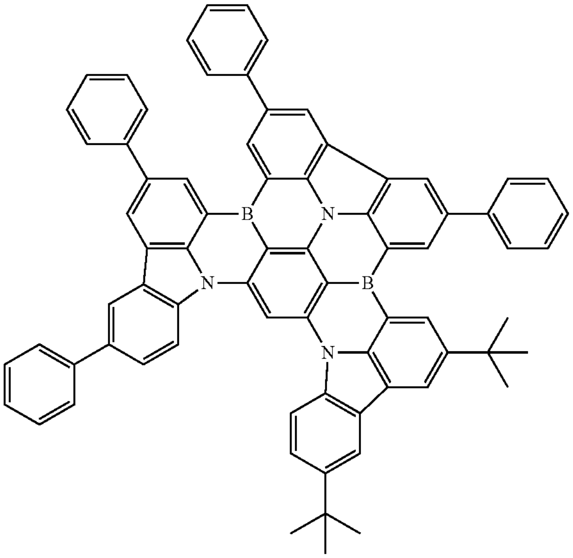

-continued
A-17
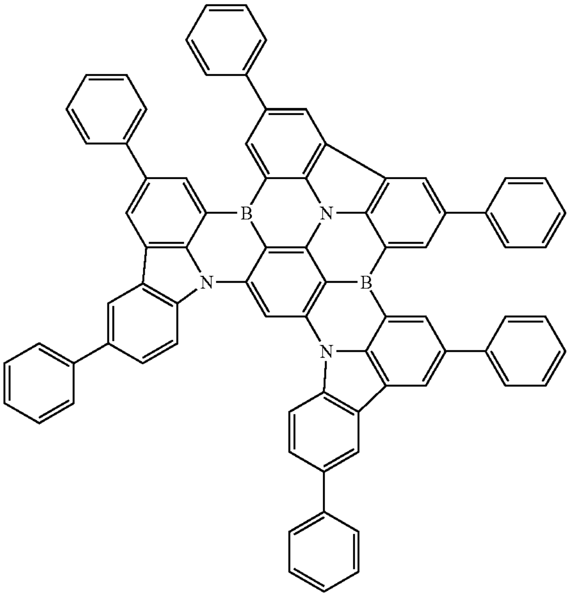
A-18
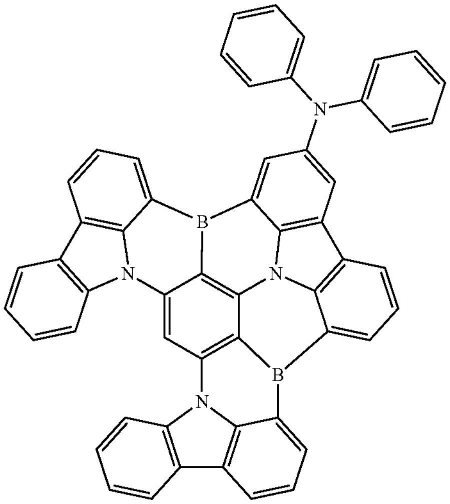
A-19
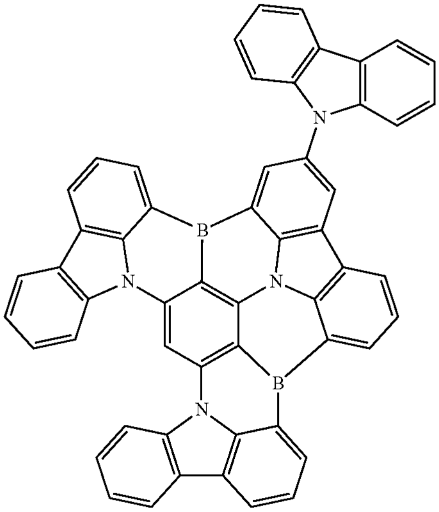
-continued
A-20
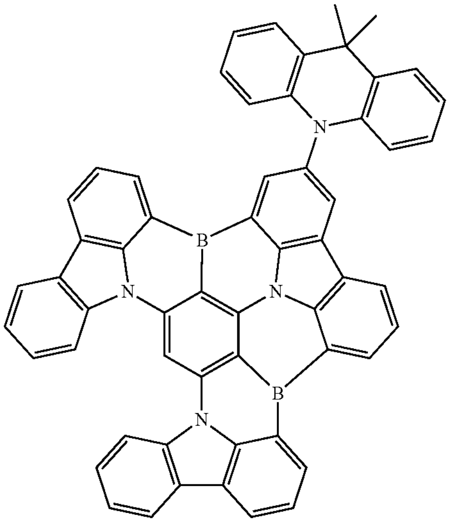
A-21
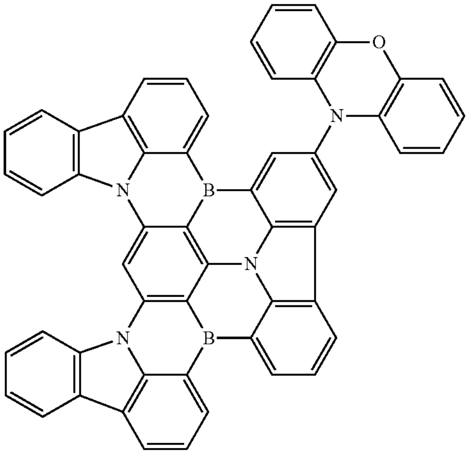
A-22
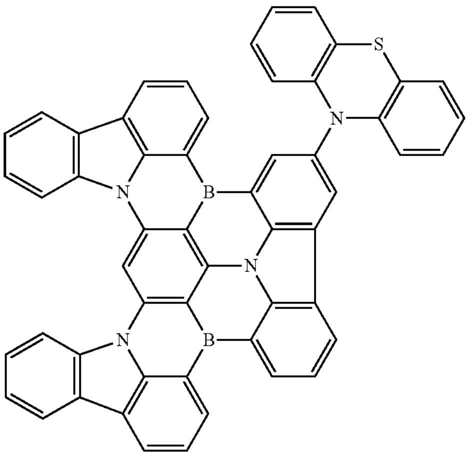

-continued
A-23
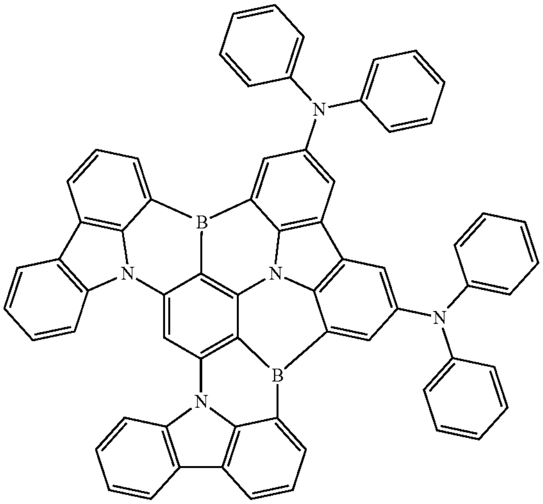
A-24
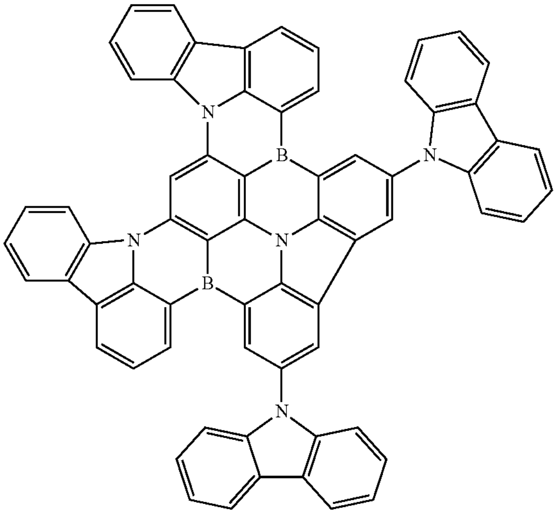
A-25
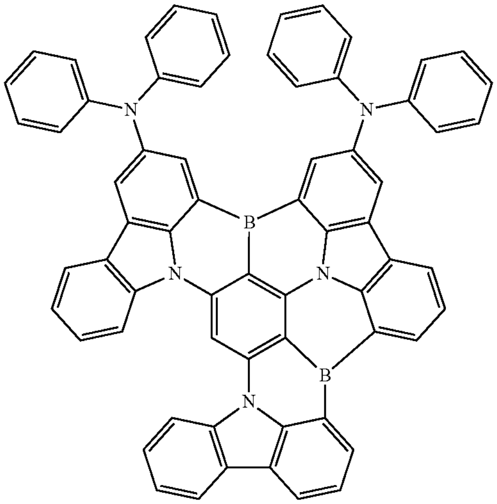
-continued
A-26
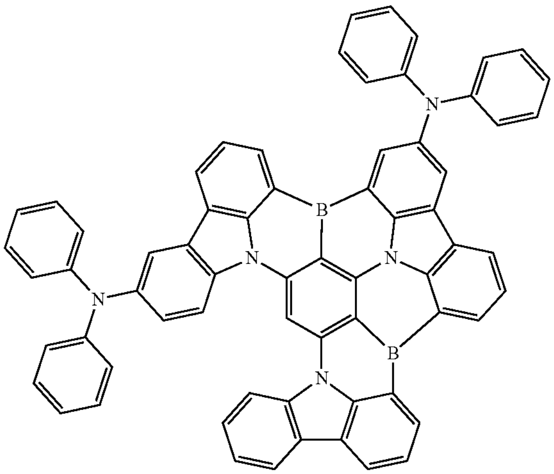
A-27
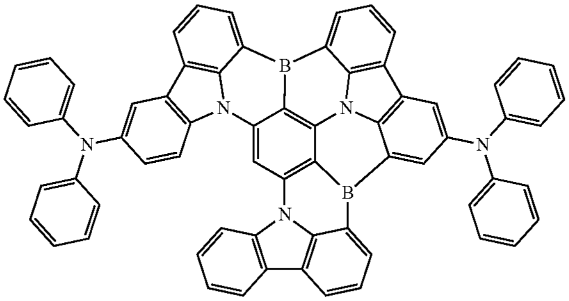
A-28
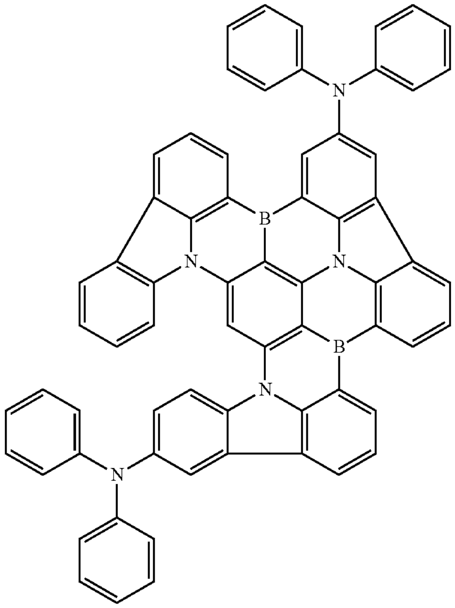

-continued
A-29
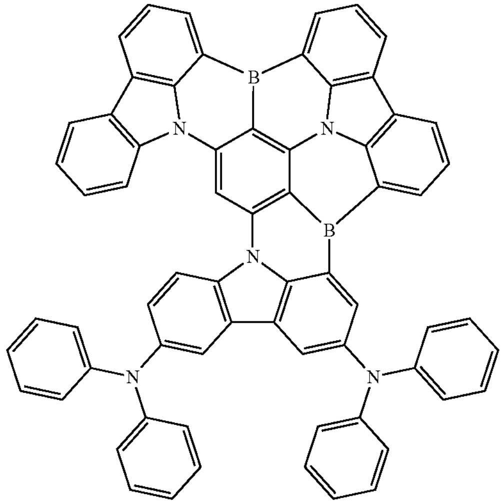
A-30
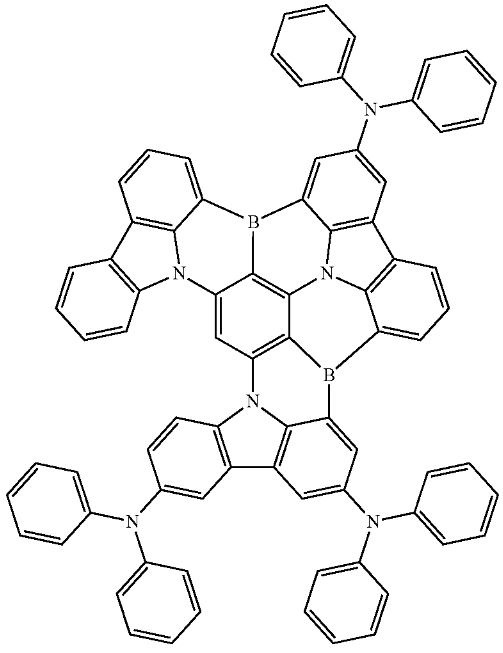
A-31
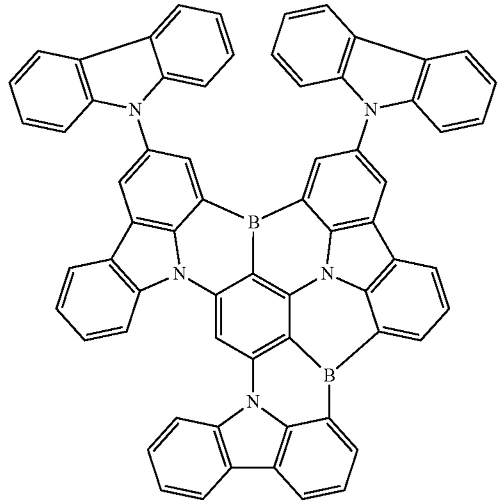
-continued
A-32
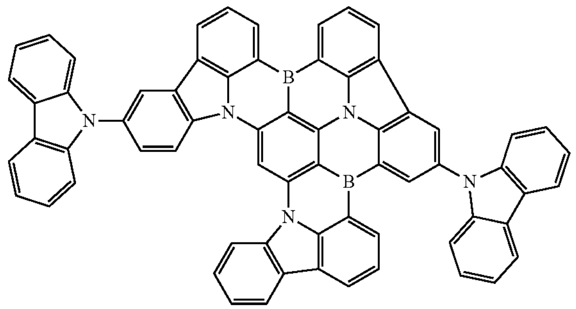
A-33
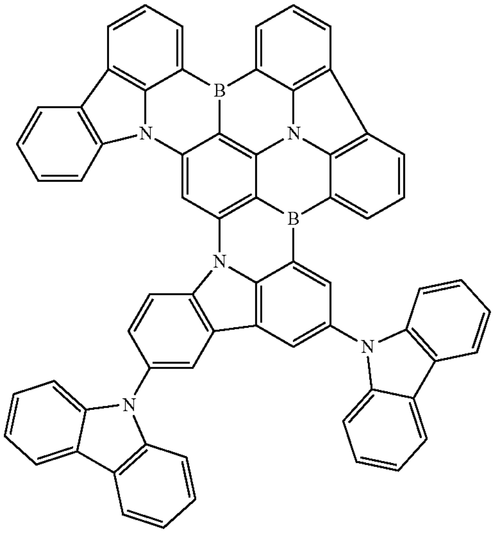
A-34
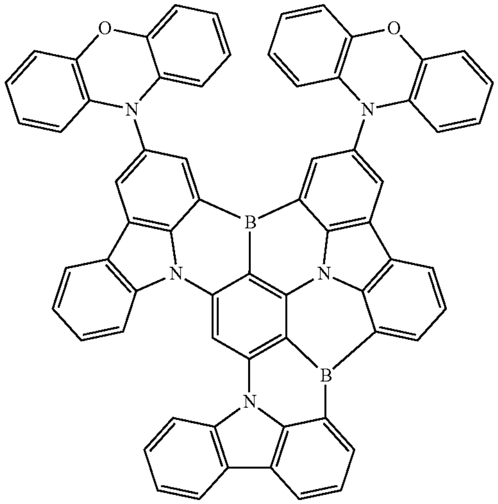

-continued
A-35
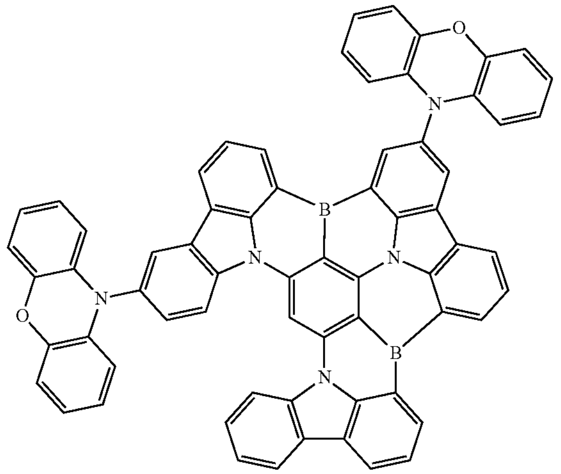
A-36
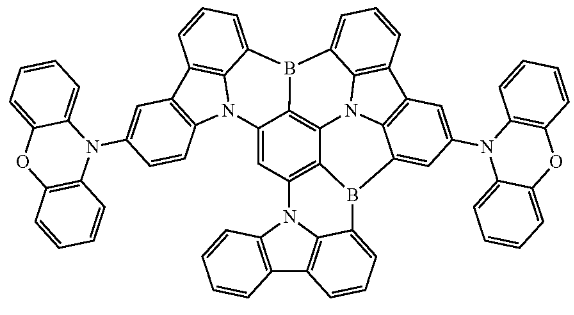
A-37
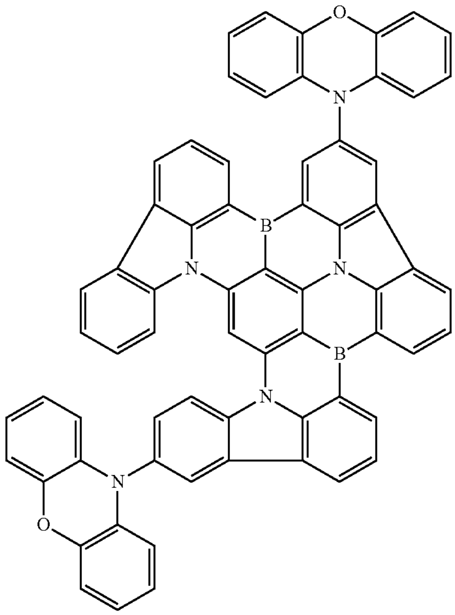
-continued
A-38
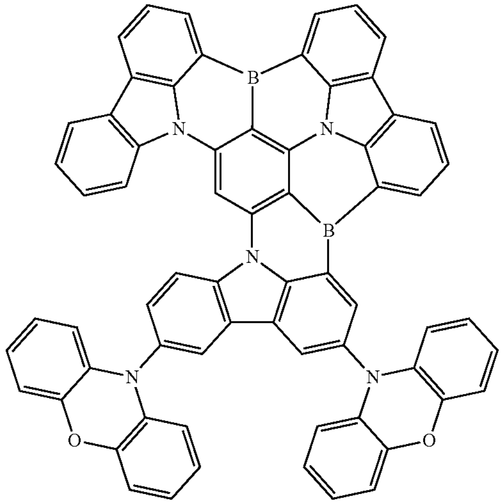
A-39
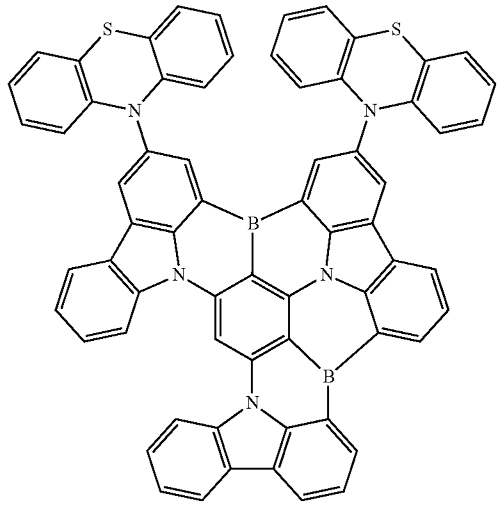
A-40
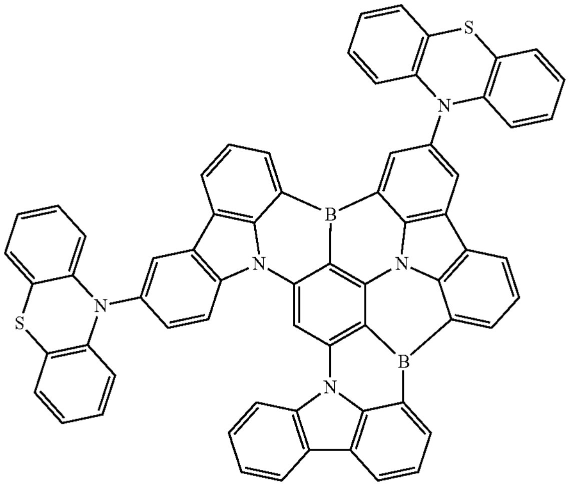

-continued
A-41
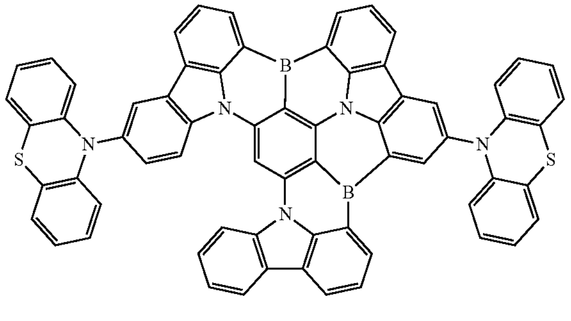
A-42
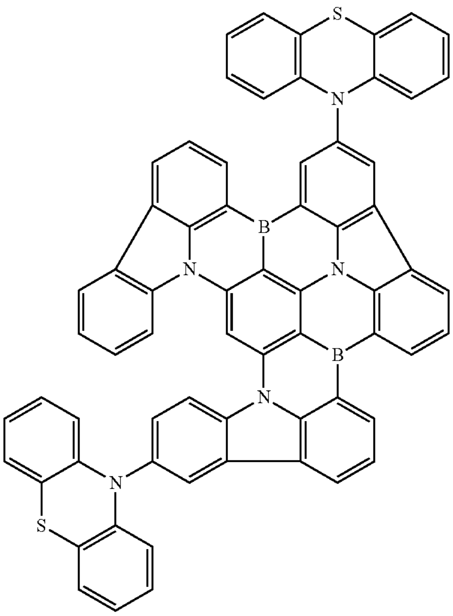
A-43
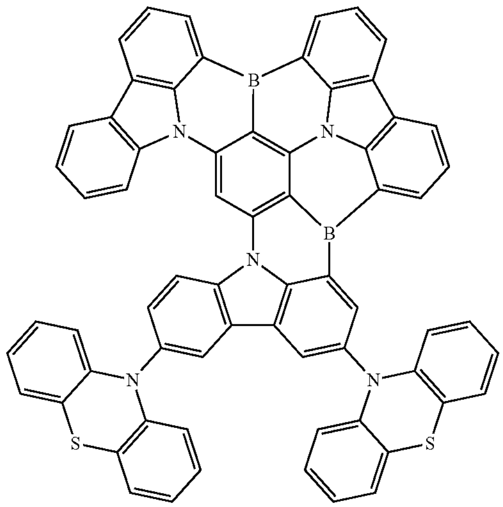
-continued
A-44
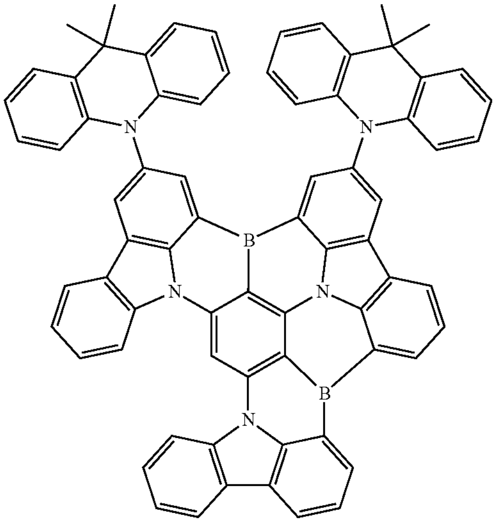
A-45
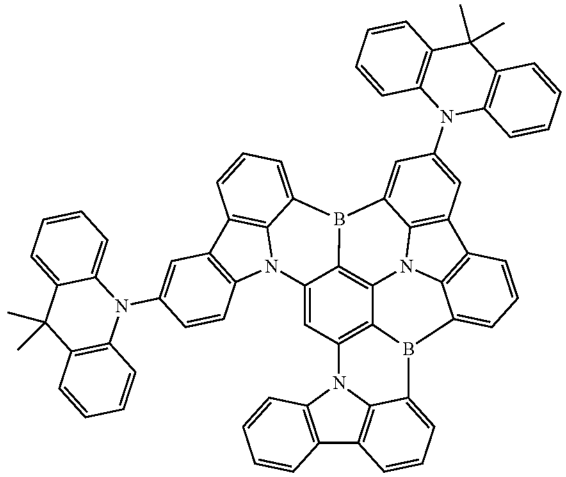
A-46
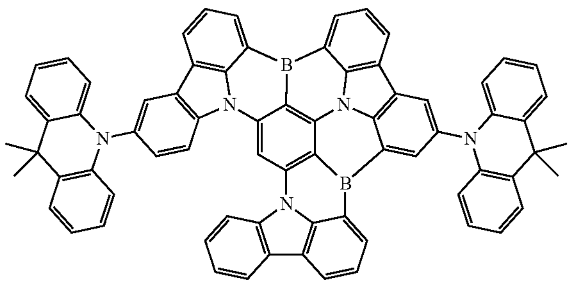

-continued
A-47
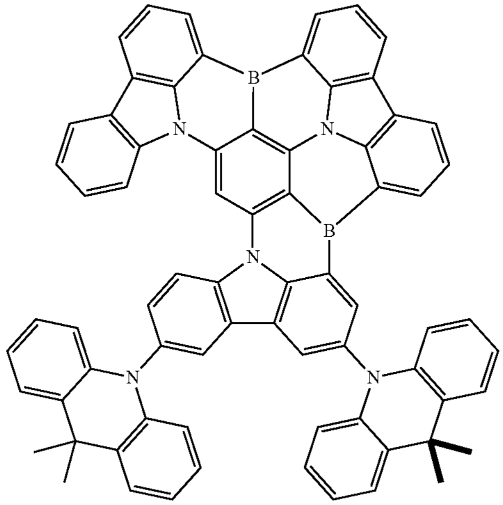
A-48
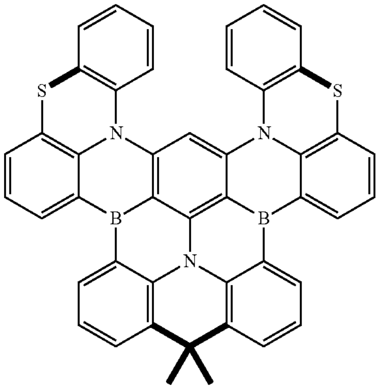
A-49
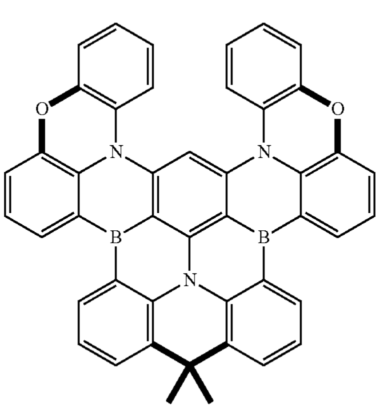
-continued
A-50
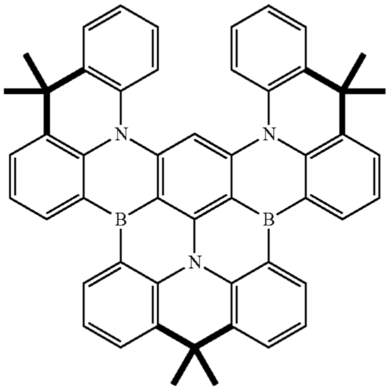
A-51
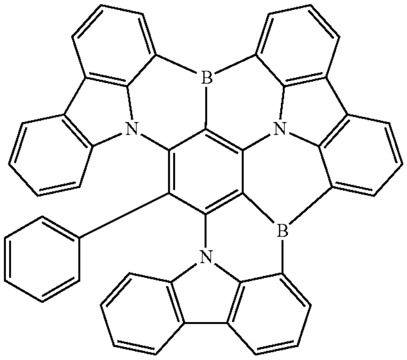
A-52
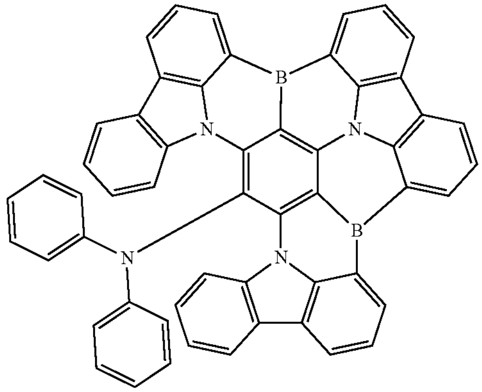
A-53
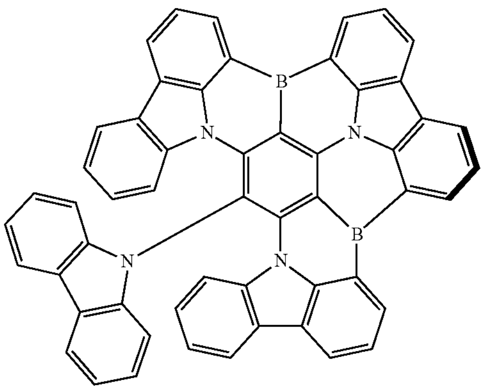

-continued
A-54
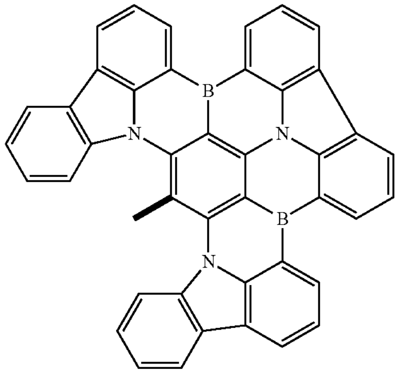
A-55
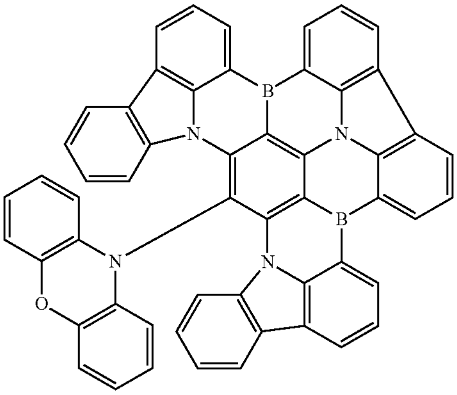
A-56
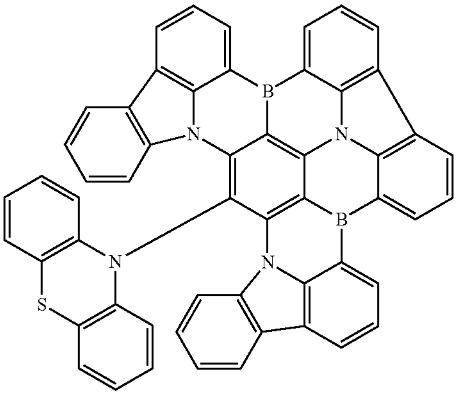
-continued
A-57
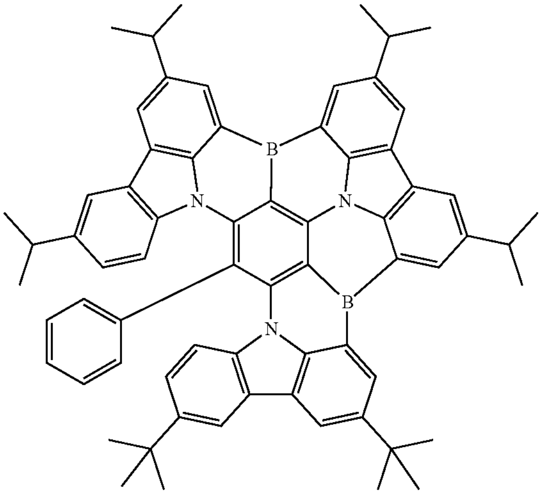
A-58
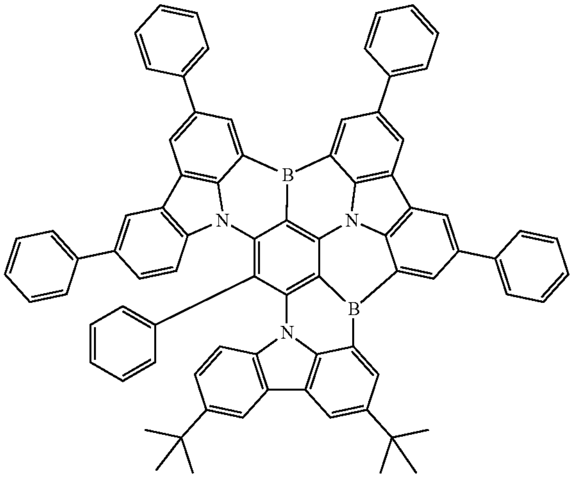
A-59
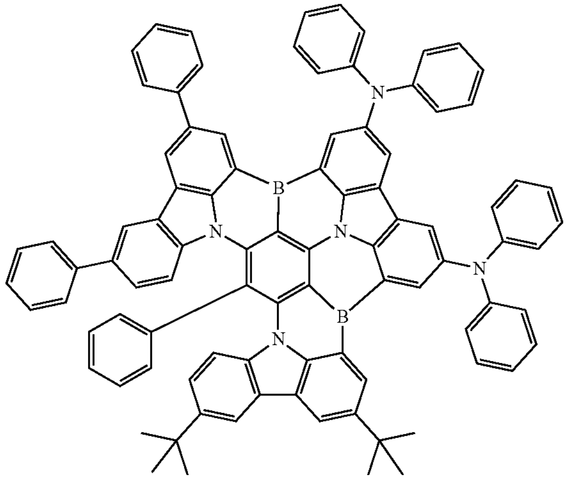

-continued
A-60
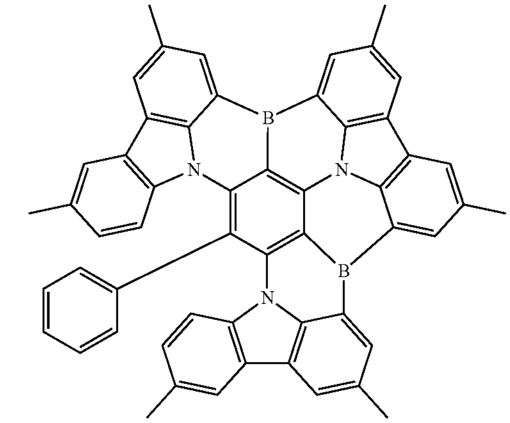
A-61
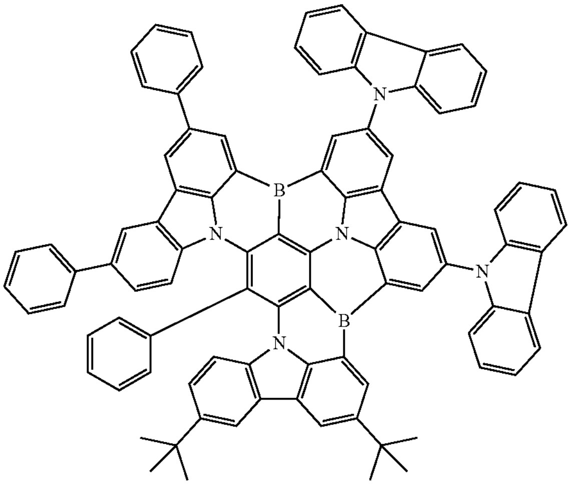
A-62
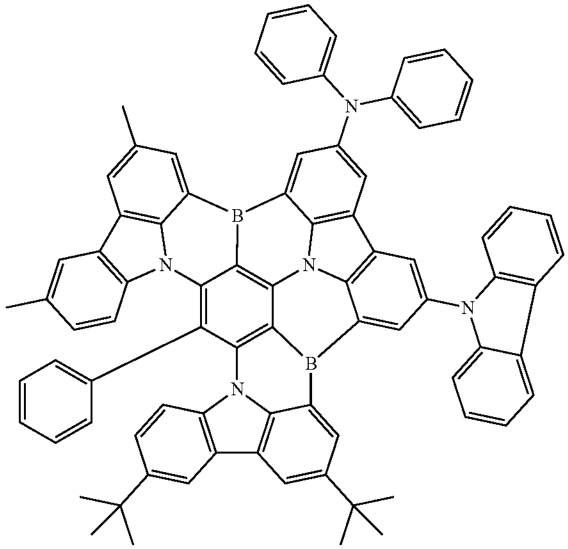
-continued
A-63
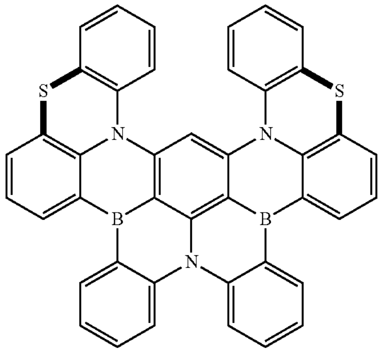
A-64
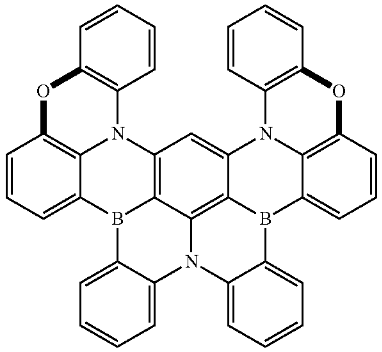
A-65
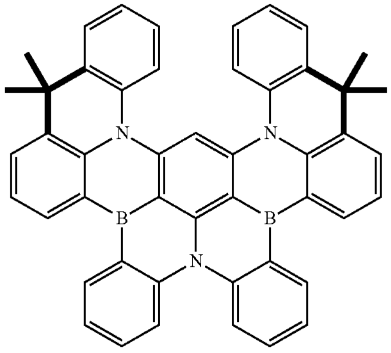
A-66
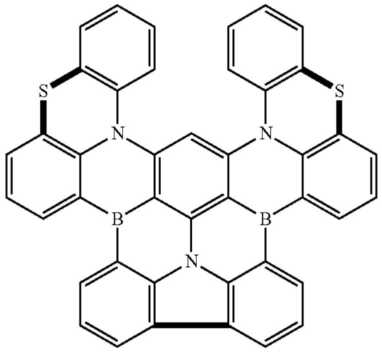

-continued
A-67
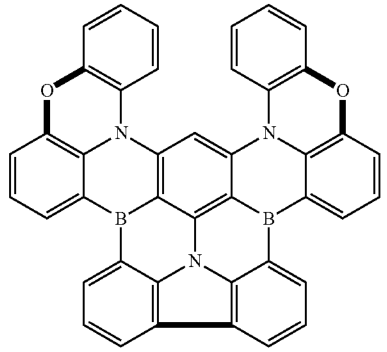
A-68
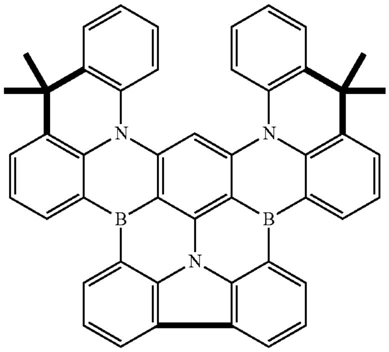
A-69
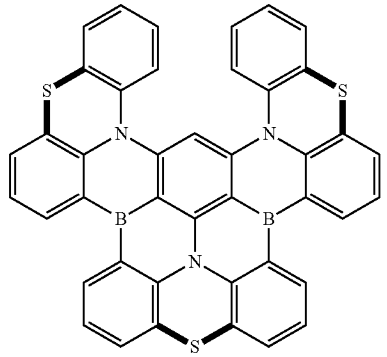
A-70
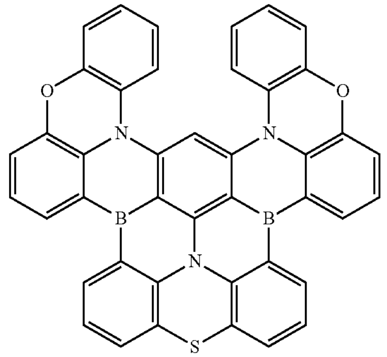
-continued
A-71
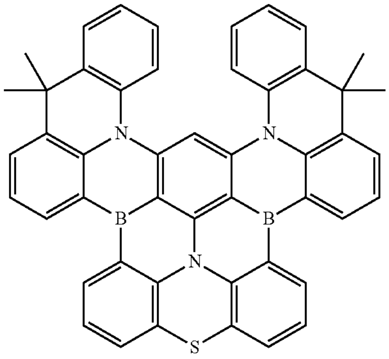
A-72
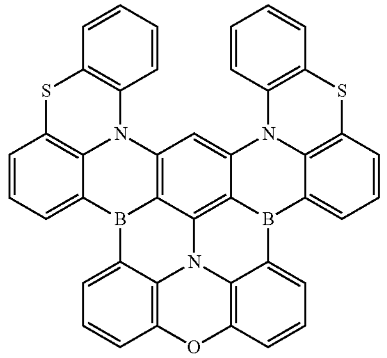
A-73
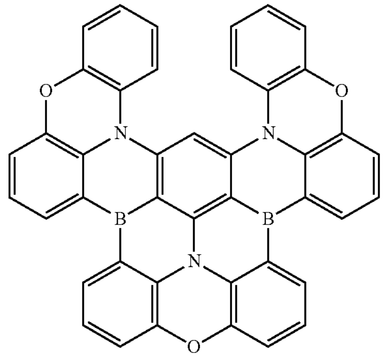
A-74
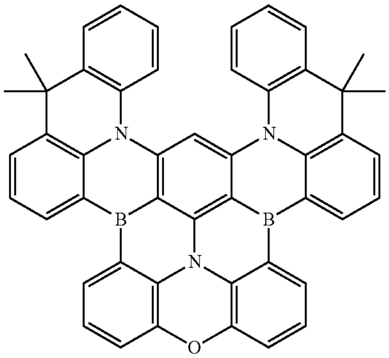

-continued
A-75
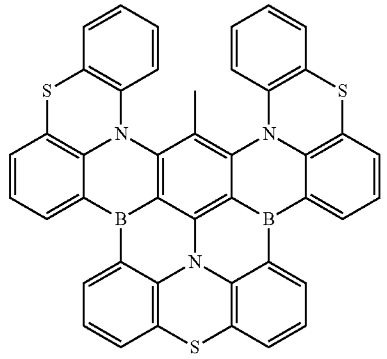
A-76
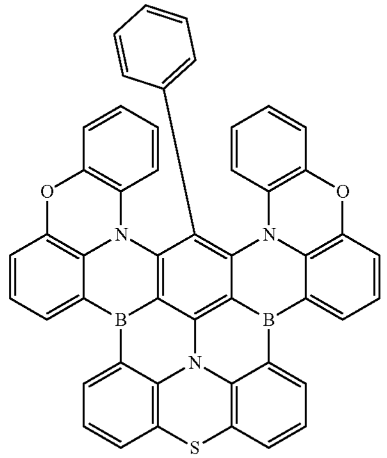
A-77
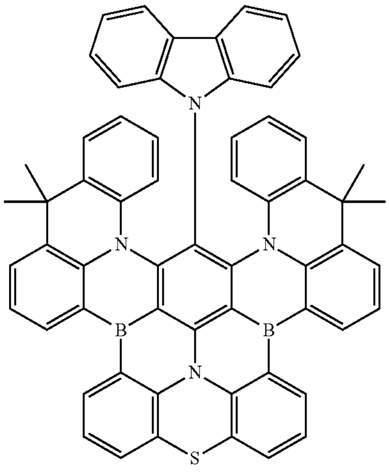
A-78
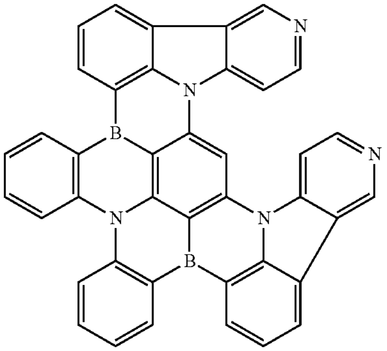
-continued
A-79
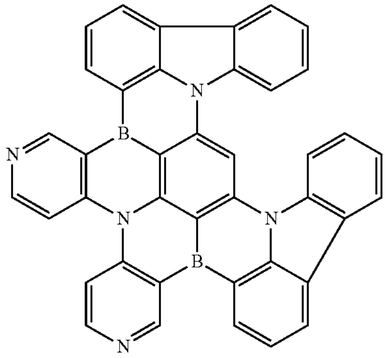
A-80
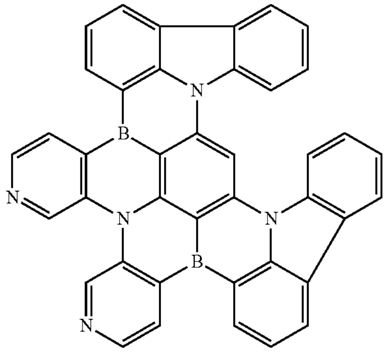
A-81
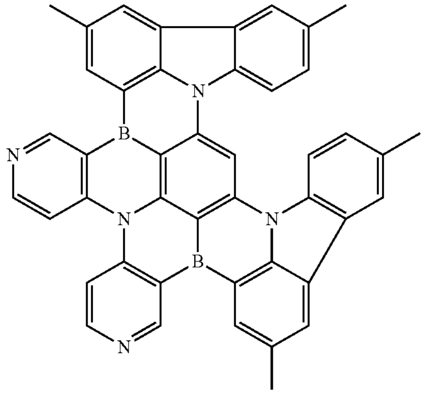
A-82
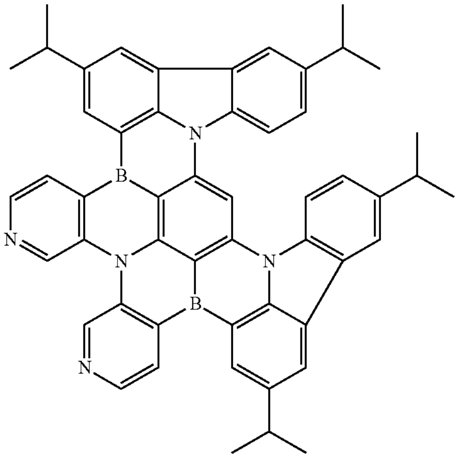

-continued
A-83
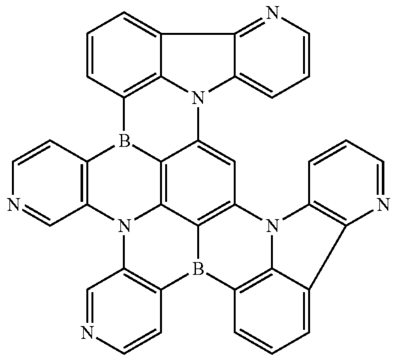
A-84
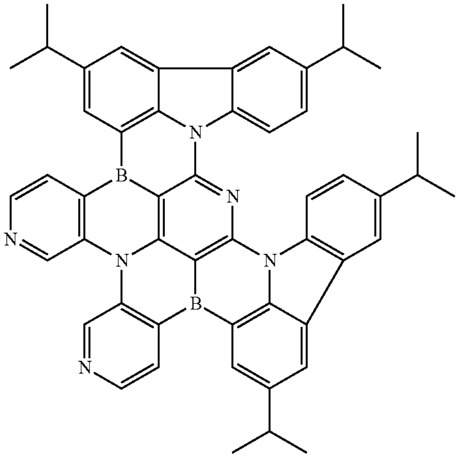
A-85
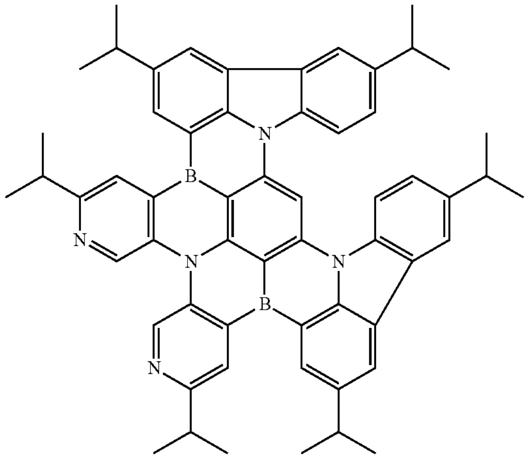
-continued
A-86
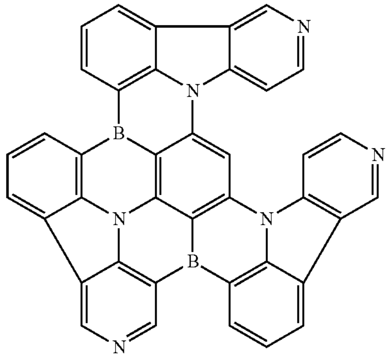
A-87
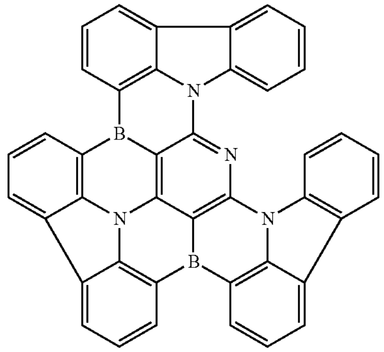
A-88
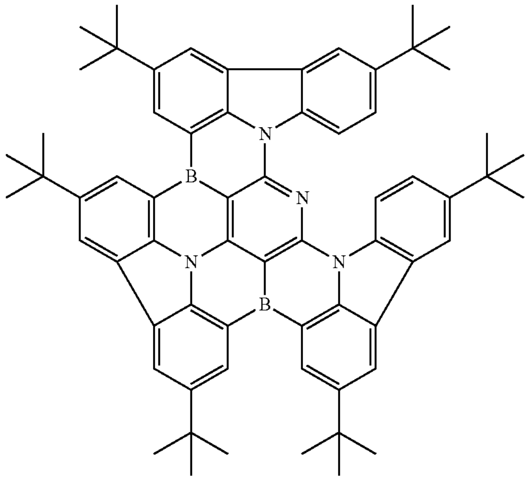
A-89
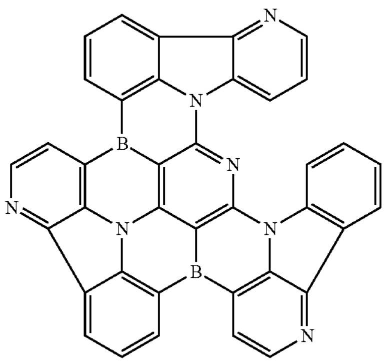

-continued
A-90
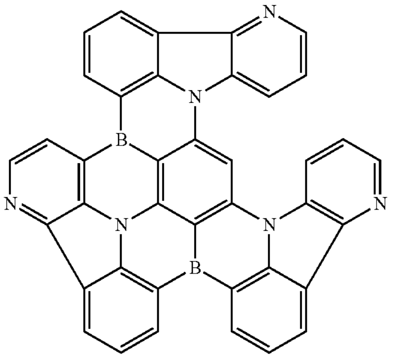
A-91
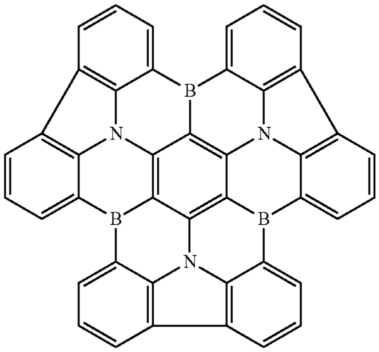
A-92
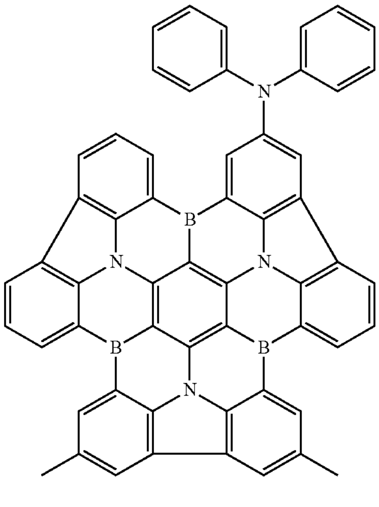
-continued
A-93
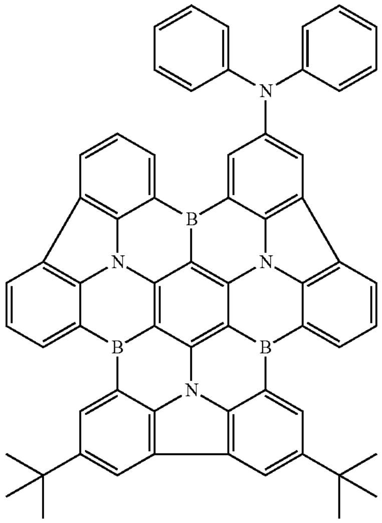
A-94
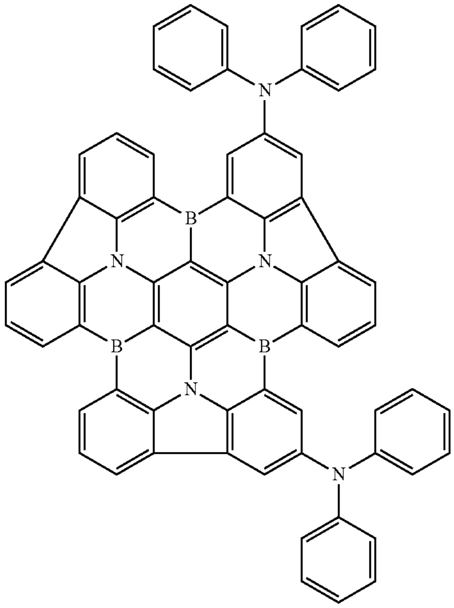
A-95
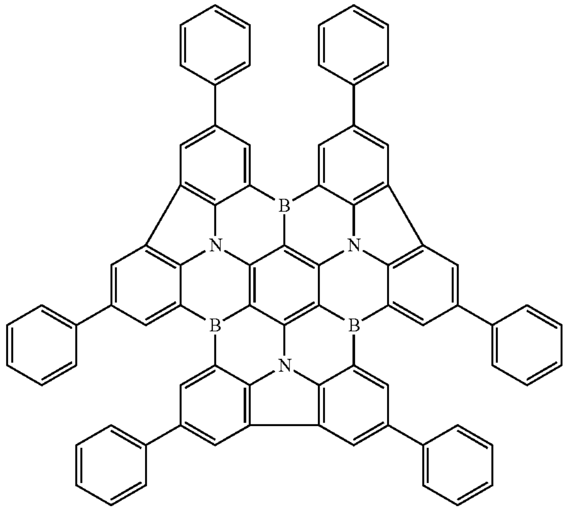

-continued
A-96
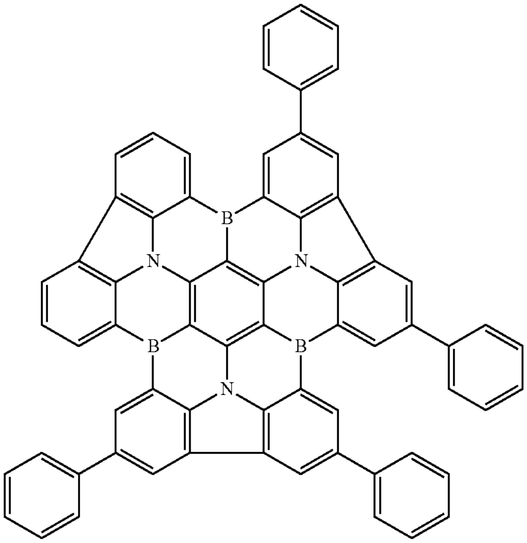
A-97
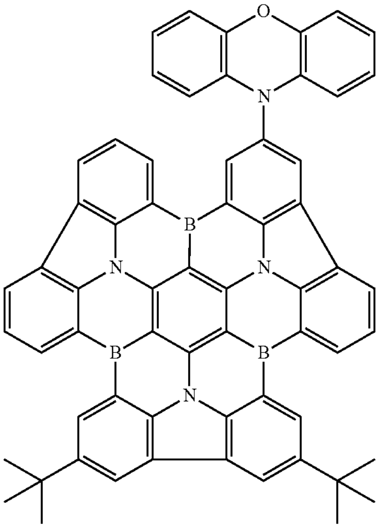
A-98
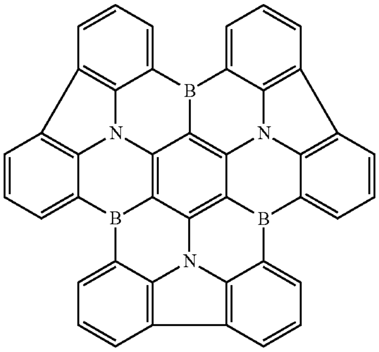
-continued
A-99
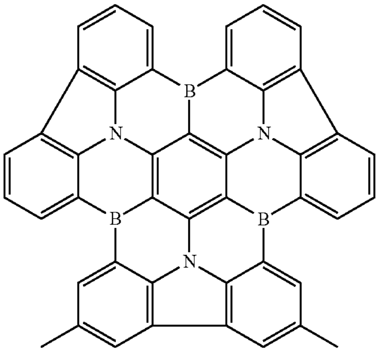
A-100
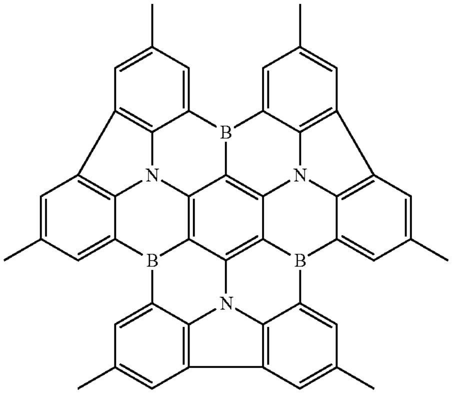
A-101
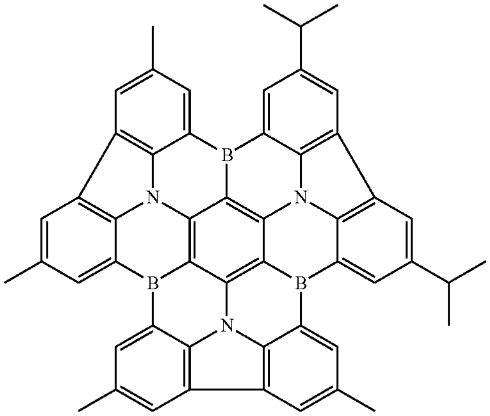
A-102
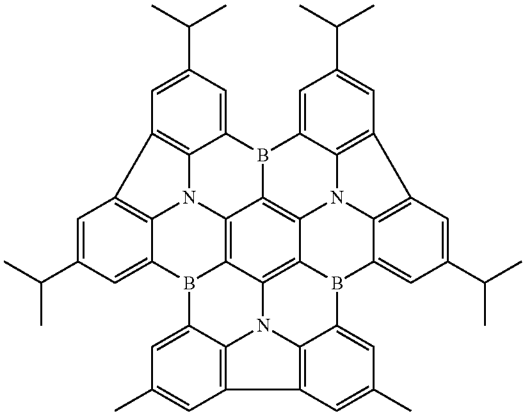

-continued
A-103
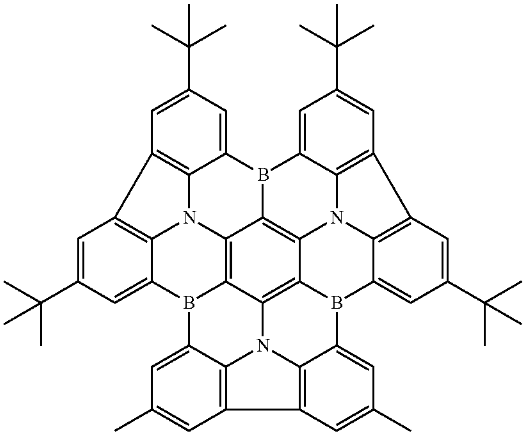
A-104
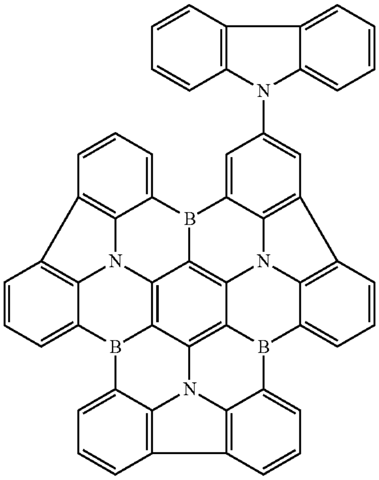
A-105
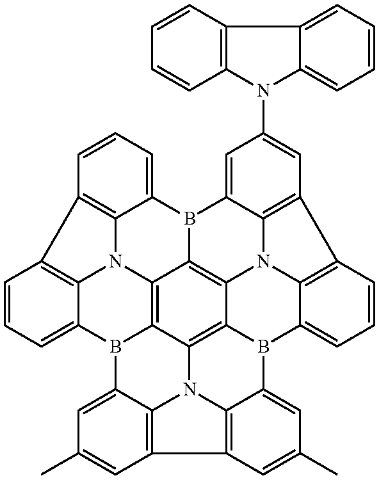
-continued
A-106
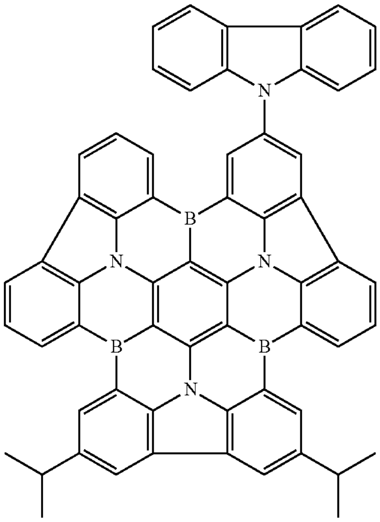
A-107
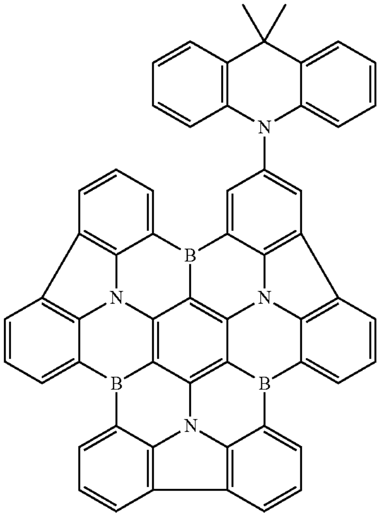
A-108
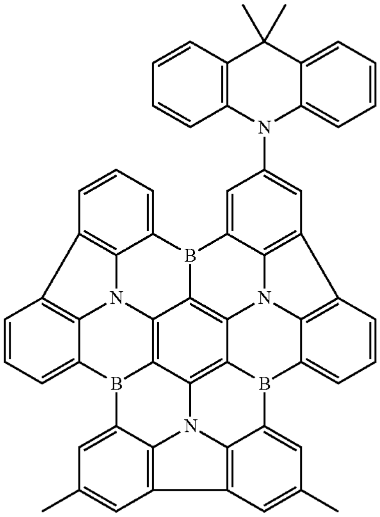

-continued
A-109
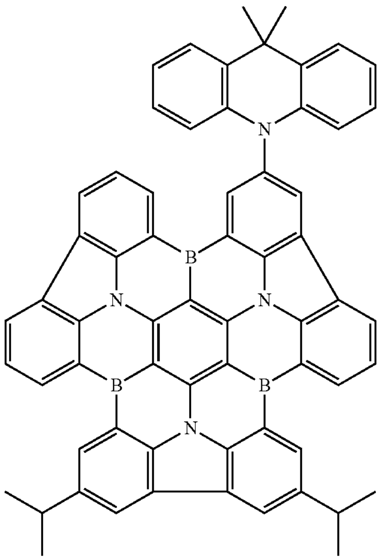
A-110
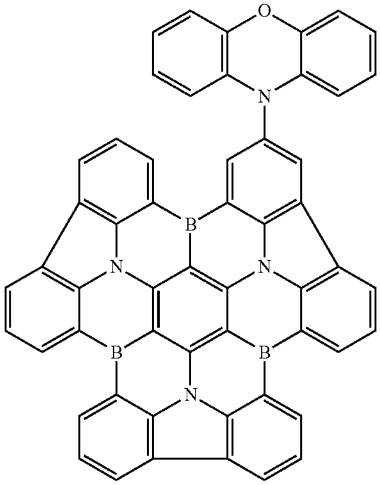
A-111
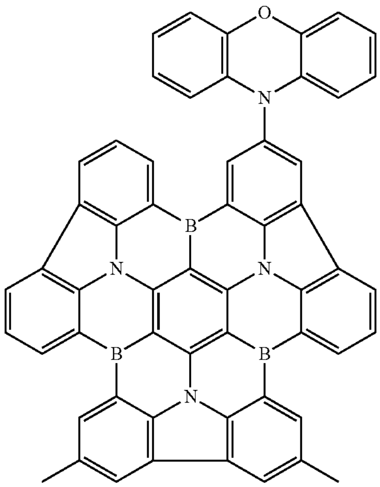
-continued
A-112
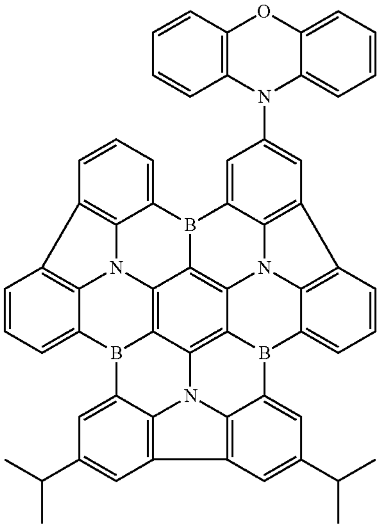
A-113
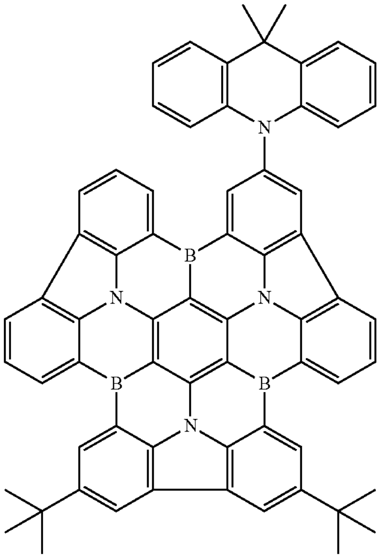
A-114
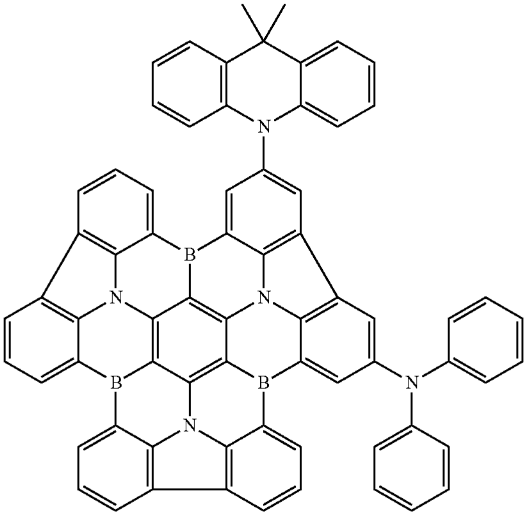

-continued
A-115
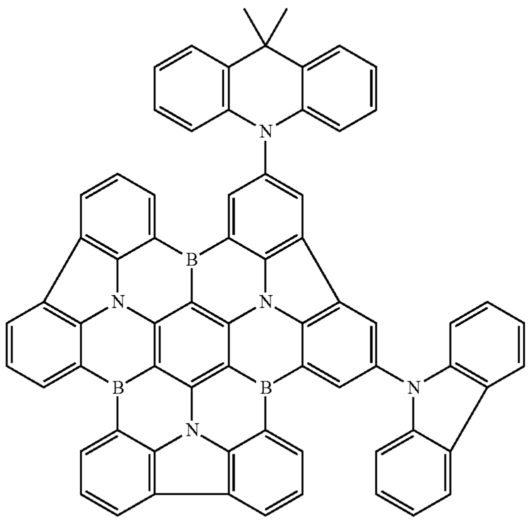
A-116
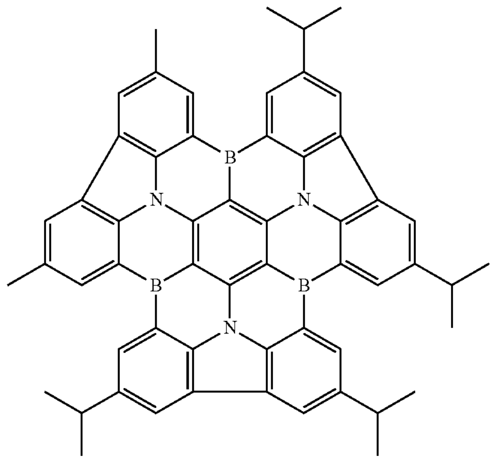
A-117
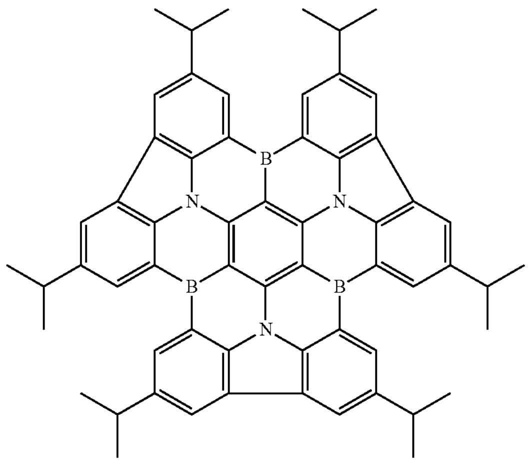
-continued
A-118
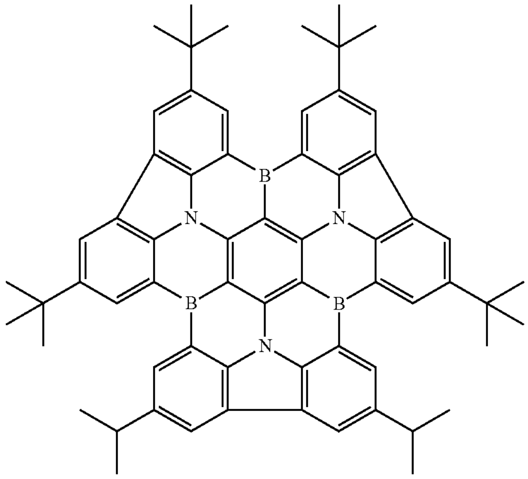
A-119
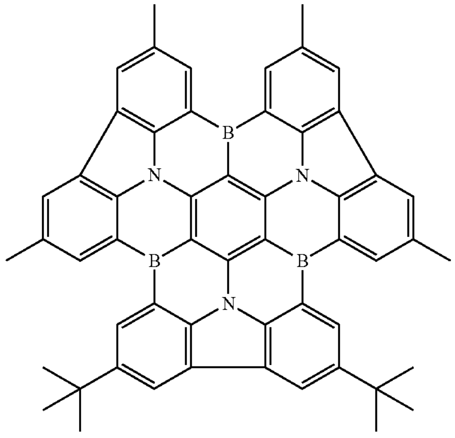
A-120
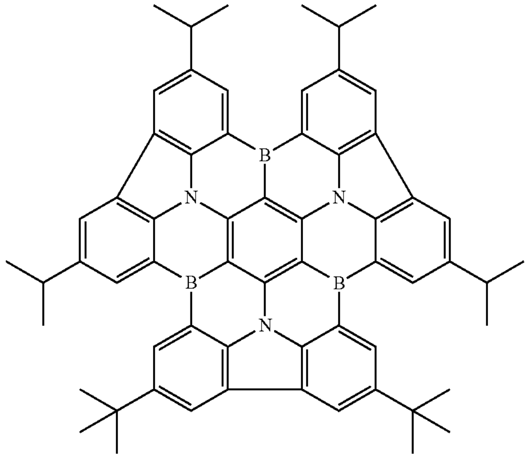

-continued
A-121
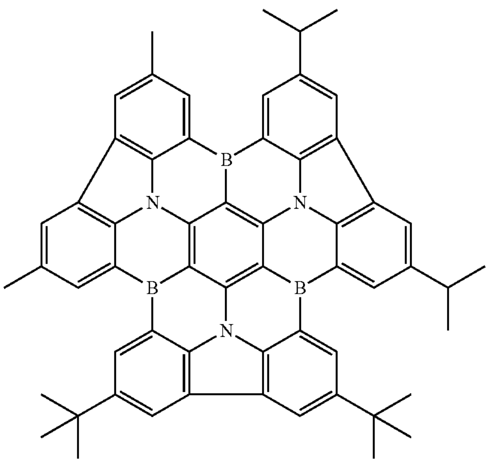
A-122
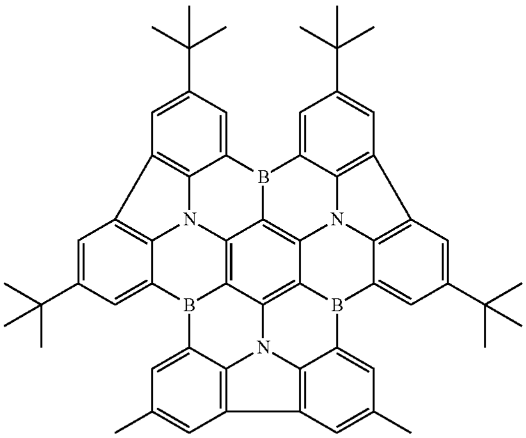
A-123
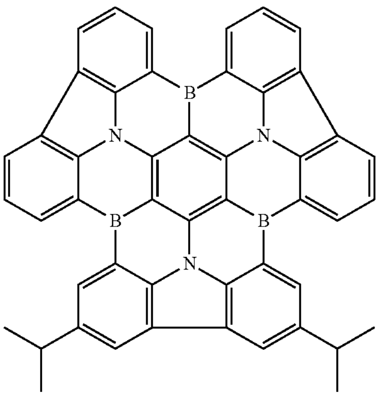
-continued
A-124
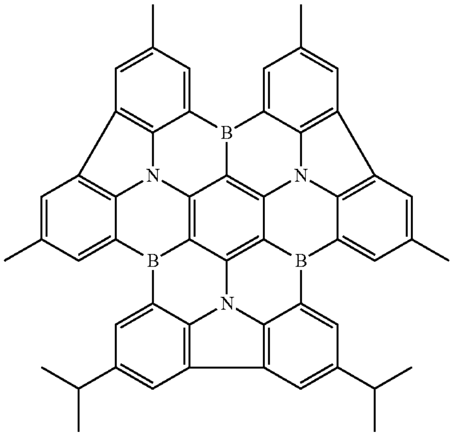
A-125
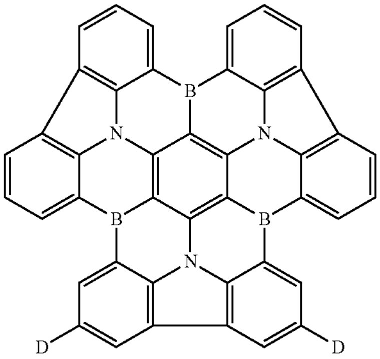
A-126
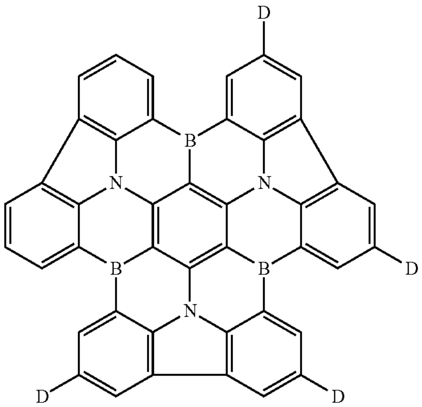
A-127
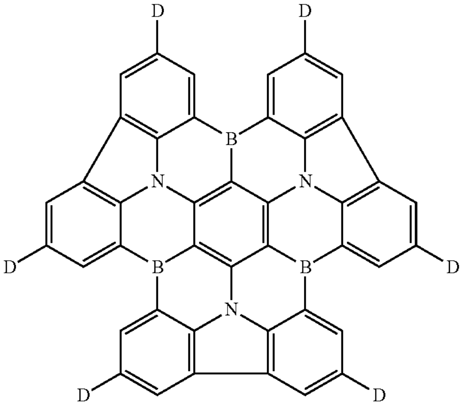

-continued
A-128
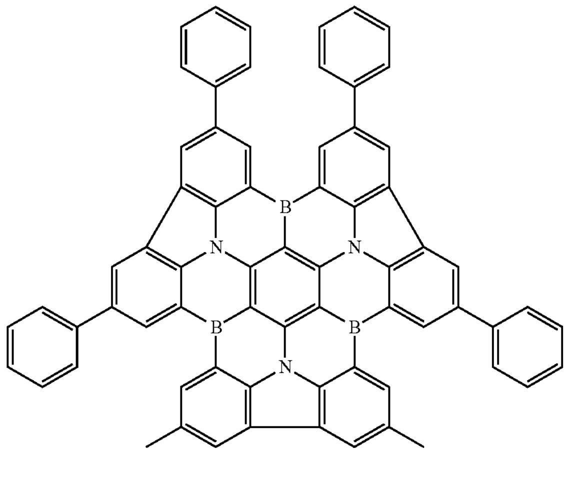
A-129
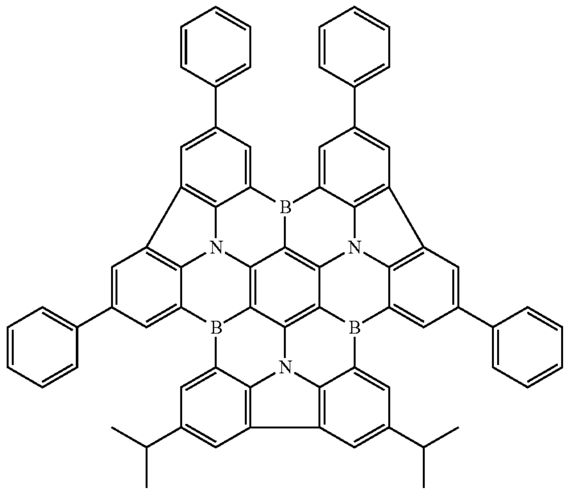
A-130
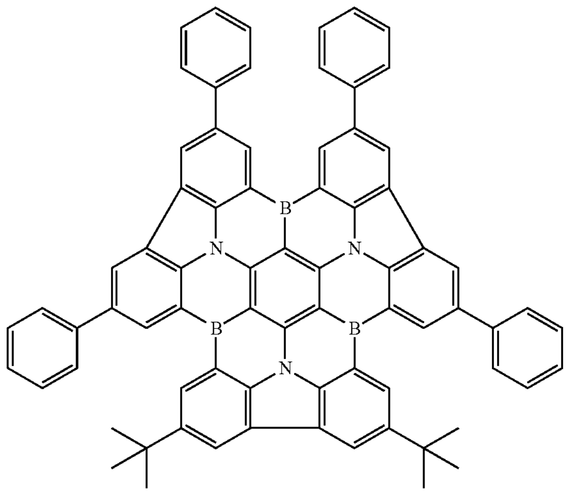
-continued
A-131
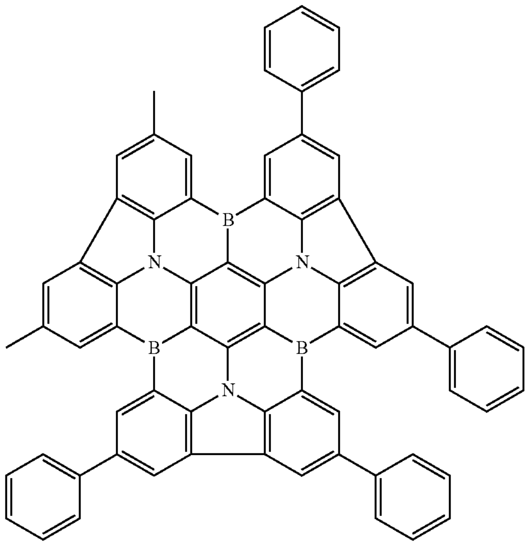
A-132
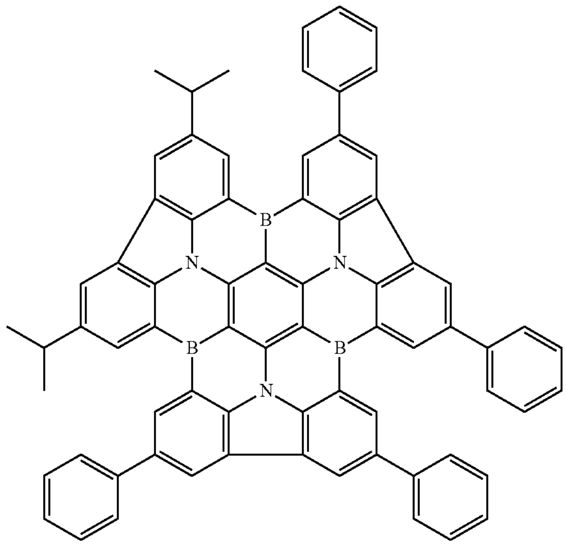

A-133
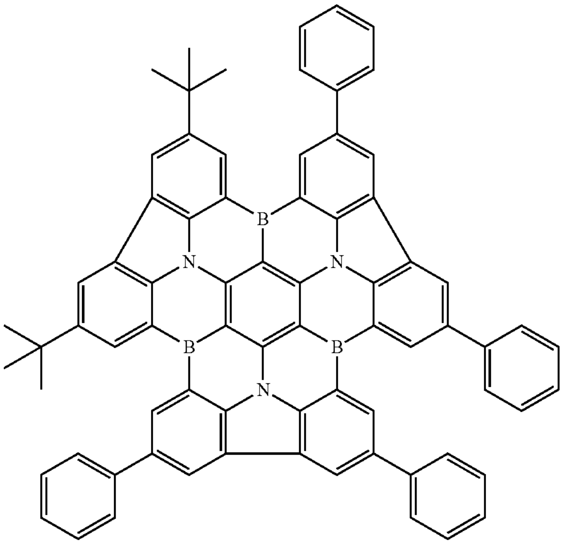
A-134
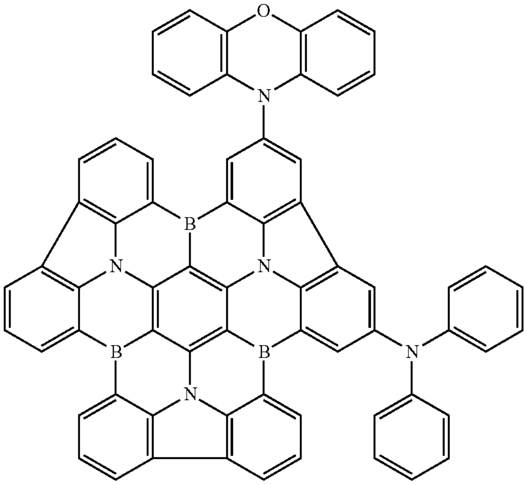
A-135
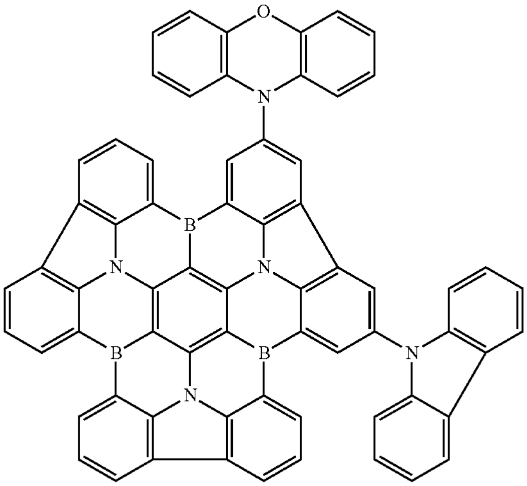
A-136
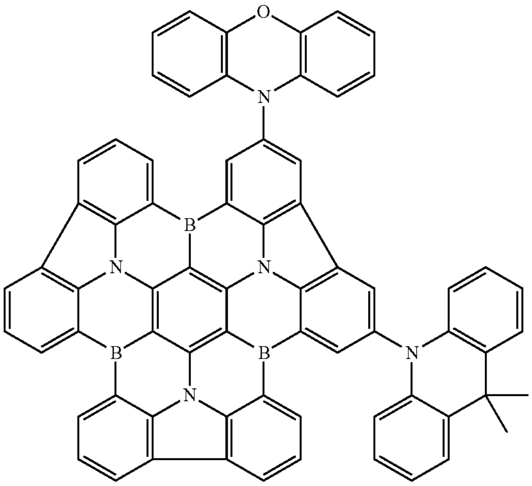
A-137
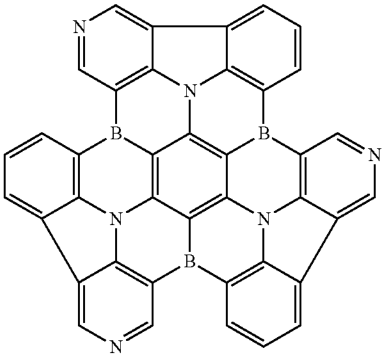
A-138
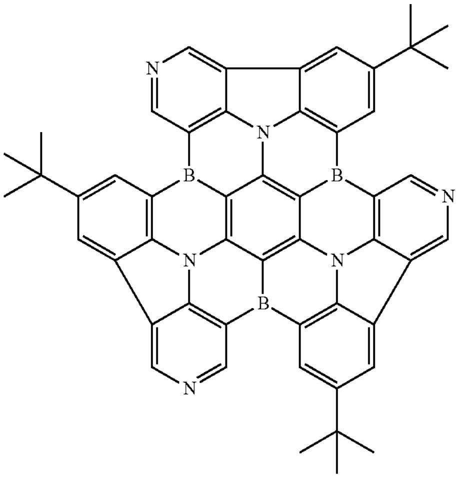

-continued
A-139
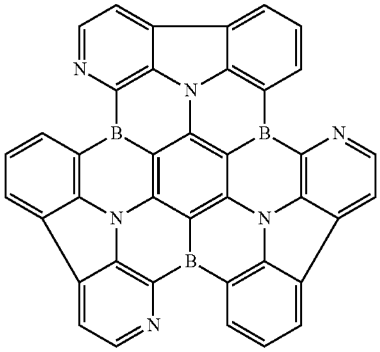
A-140
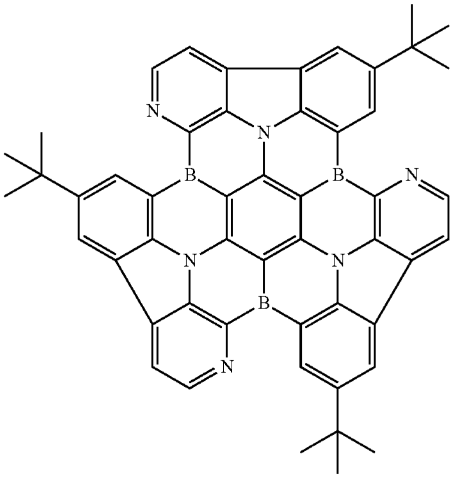
A-141
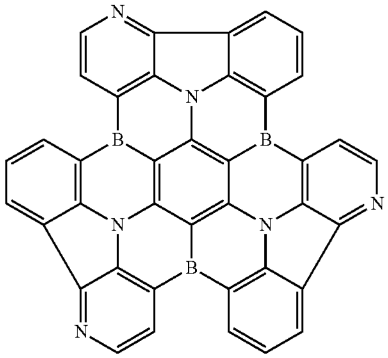
A-142
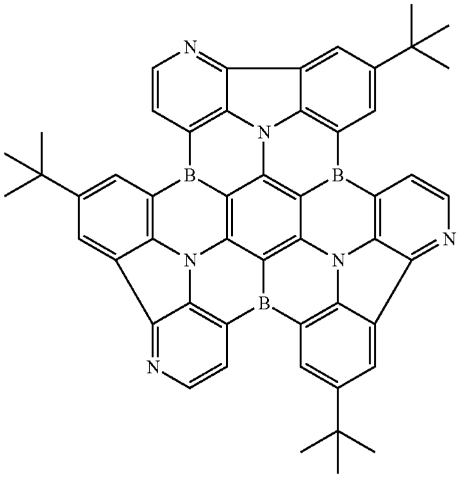
A-143
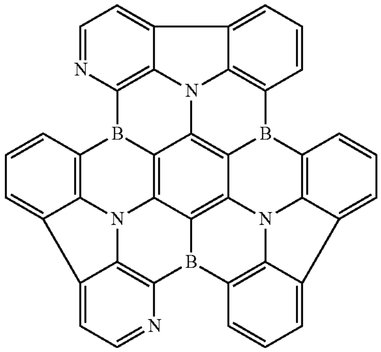
A-144
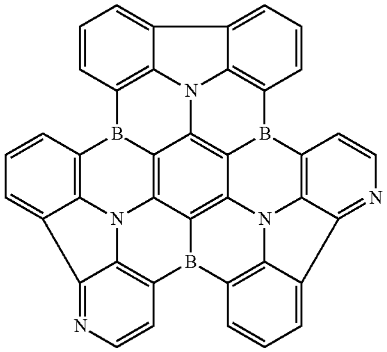
A-145
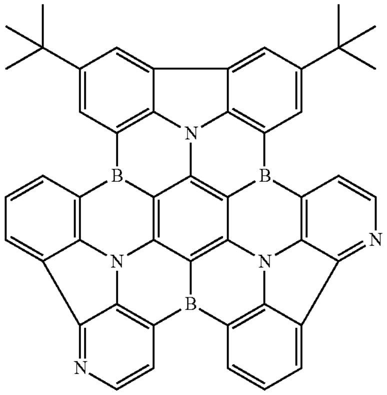

-continued

A-146

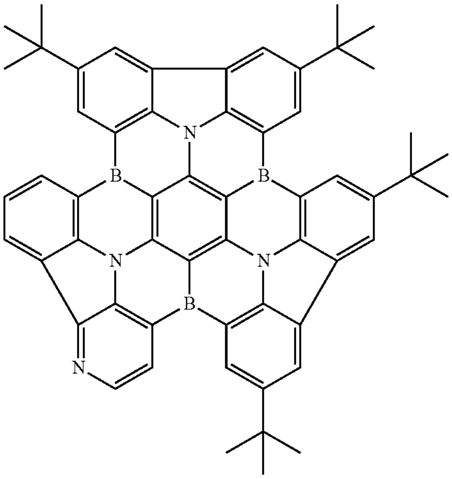

A-147

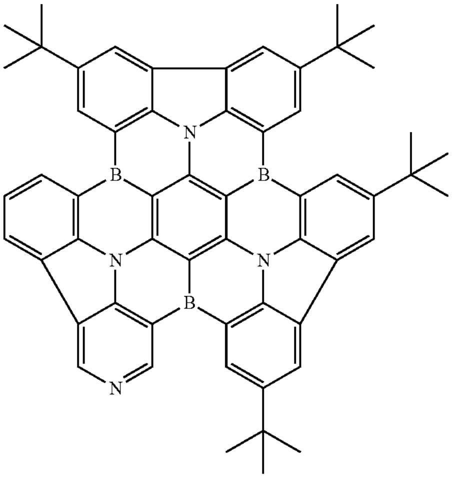

A-148

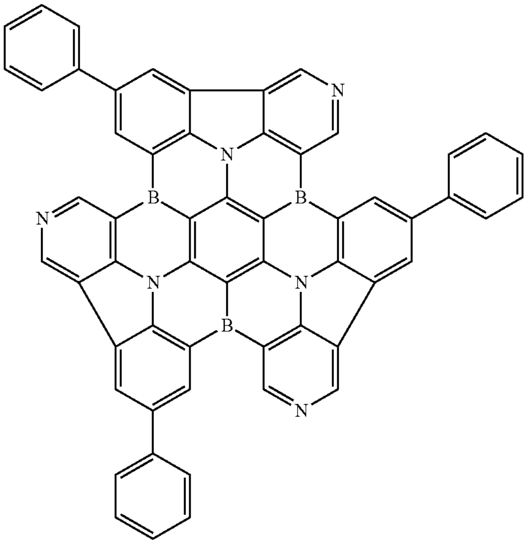

-continued

A-149

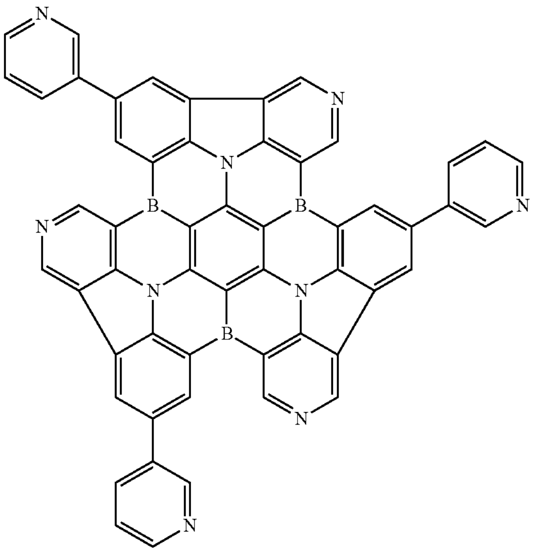

A-150

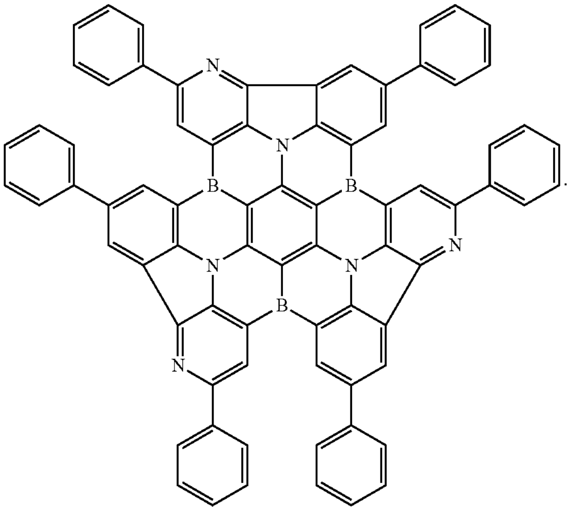

.

In addition, the performance of the device can be further optimized by controlling the mass proportion of the dye in the light-emitting layer.

In the specific implementation process of the present application, the mass proportion of the dye in the light-emitting layer is generally controlled to be 0.01% or more. Reasonable control of the amount of dye doped in the light-emitting layer is beneficial to further improve the efficiency and color purity of the device, so the quality content of the dye can be controlled 0.1% or more. The applicant found that as the proportion of the dye in the light-emitting layer increases within a certain range, the efficiency and color purity of the device will be gradually improved, and then basically remain unchanged or show a slight downward trend. Therefore, considering its excellent performance and preparation economy, the mass proportion of the dye in the light-emitting layer is generally controlled to be in the range of 0.1%-20%.

Of course, different host materials and dyes in the light-emitting layer of the organic light emitting device of the present application will all have an influence on the performance of the device. Therefore, generally, for different host materials and dyes, when the mass proportion of the dye in the light-emitting layer is controlled to be 0.5% to 5%, it is possible to basically ensure that the device has excellent efficiency and color purity.

The host material of the present application is a triplet-triplet annihilation material, the singlet energy level of which is higher than that of the boron-nitrogen material, so that the singlet excitons of the host material can migrate to the singlet state of the dye, which is conducive to the sensitized luminescence of the host material to the dye; the triplet energy level of the host material is lower than that of the boron-nitrogen material, so that the migration of the triplet excitons of the dye to the triplet state of the host material can occur, which inhibits the quenching of excitons of dye itself, and is conducive to the improvement of device efficiency.

Further, the host material of the present application may preferably be a compound having one of the following structures:

H1

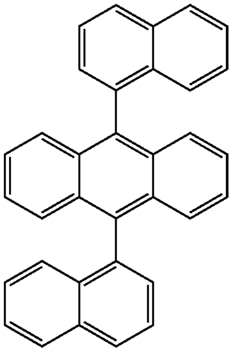

,

H2

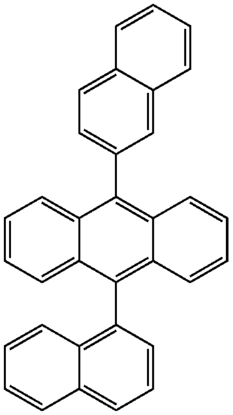

,

-continued

H3

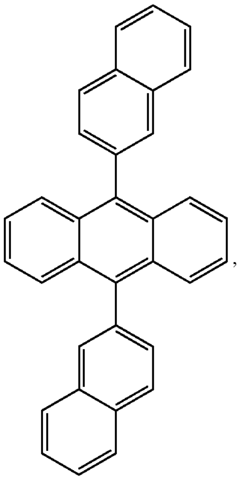

,

H4

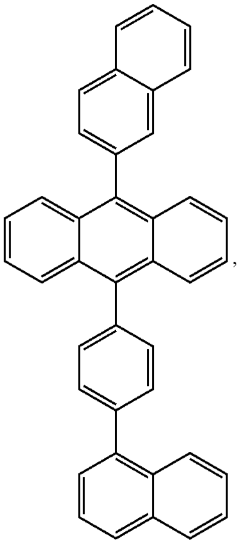

,

H5

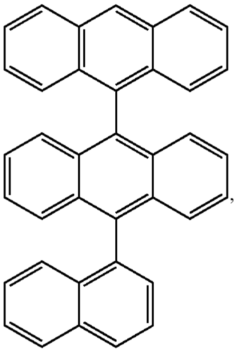

,

-continued
H6
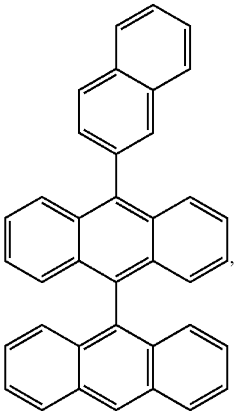,
H7
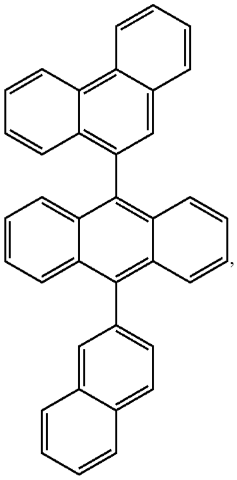,
H8
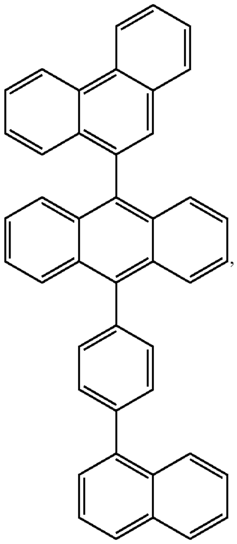,
-continued
H9
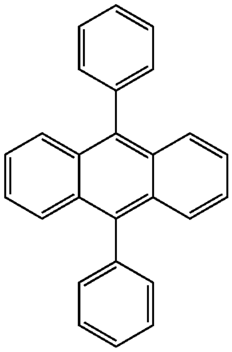,
H10
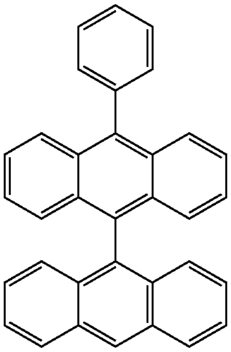,
H11
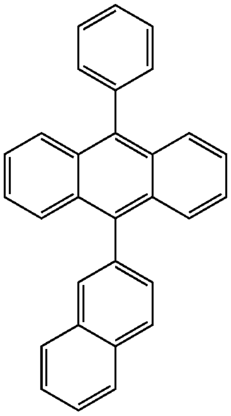, -continued
H12
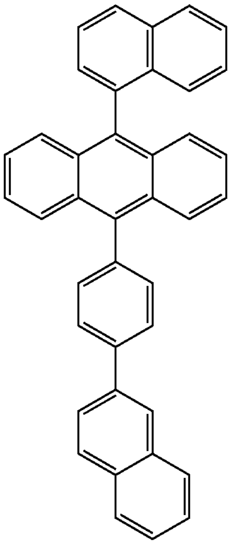
,
H13
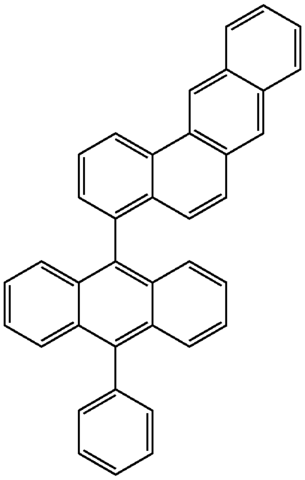
,
H14
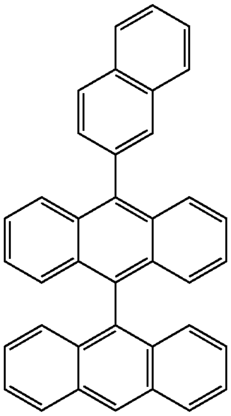
,
-continued
H15
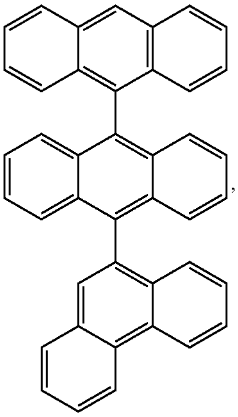
,
H16
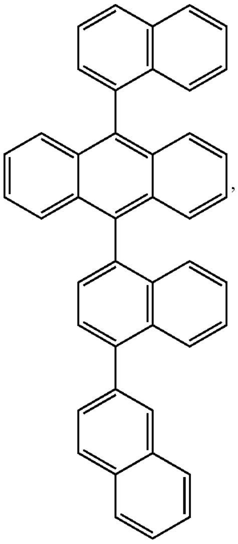
,
H17
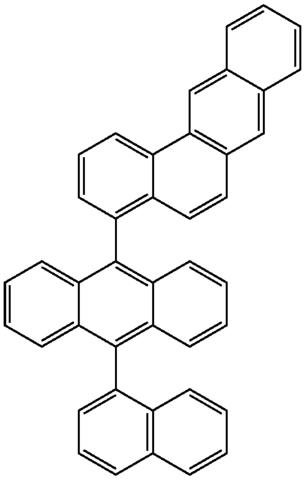
, -continued
H18
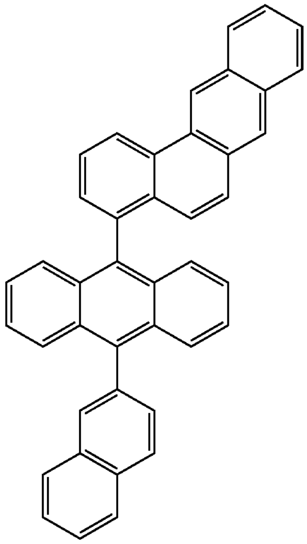
,
H19
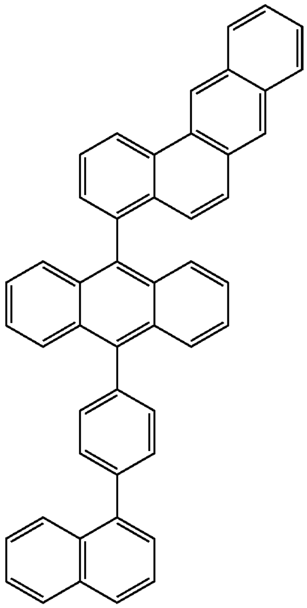
,
-continued
H20
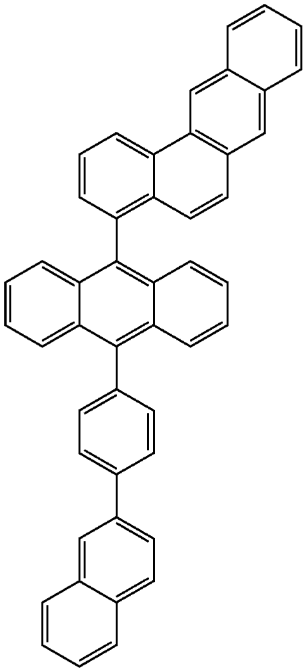
,
H21
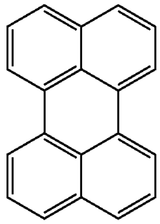
,
H22
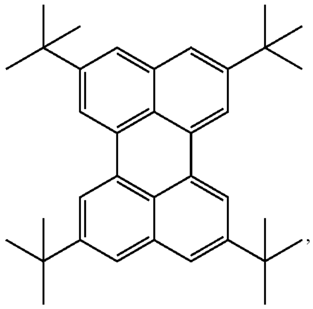
,
H23
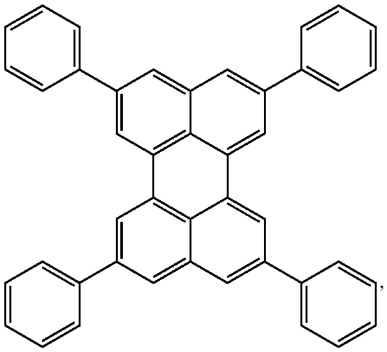
, -continued
H24
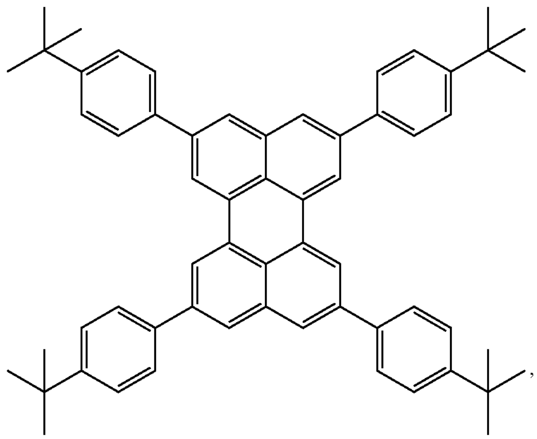
,
H25
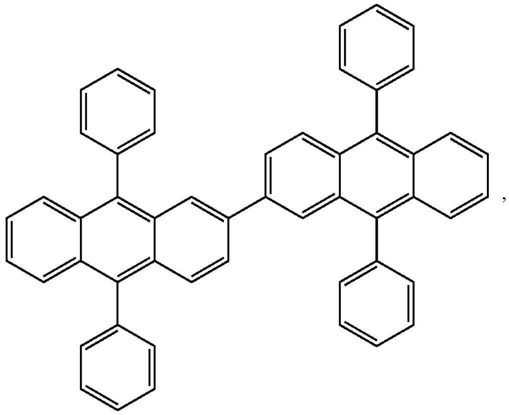
,
H26
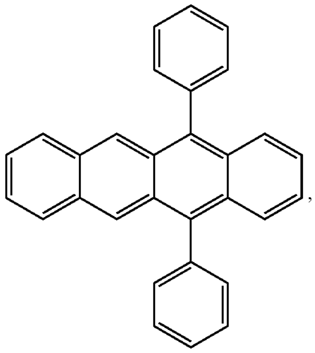
,
H27
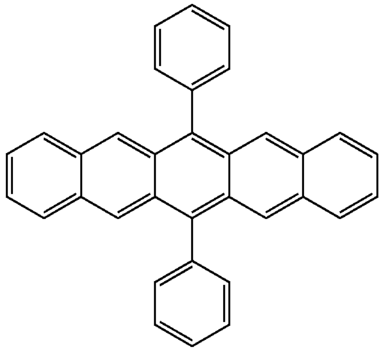
,
-continued
H28
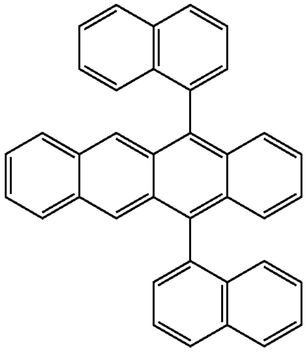
,
H29
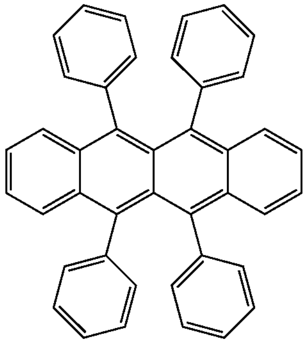
,
H30
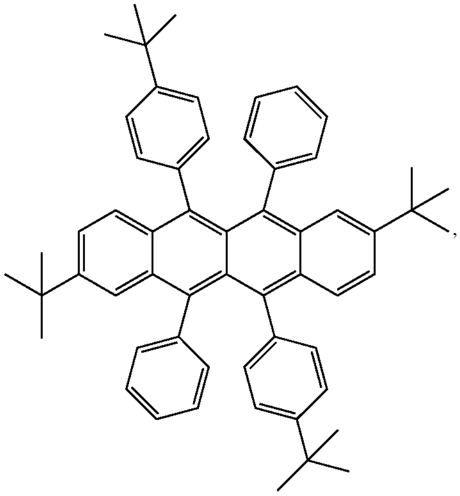
, -continued
H31
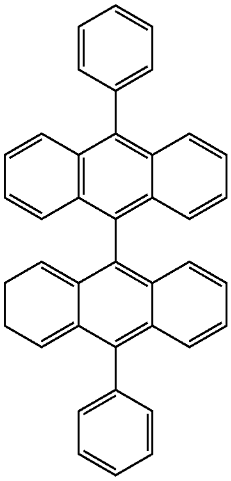
,
H32
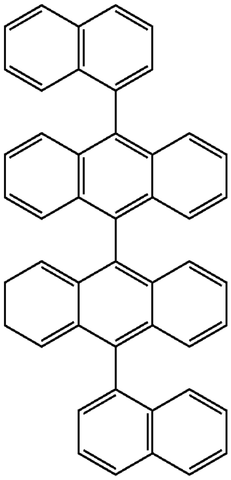
,
H33
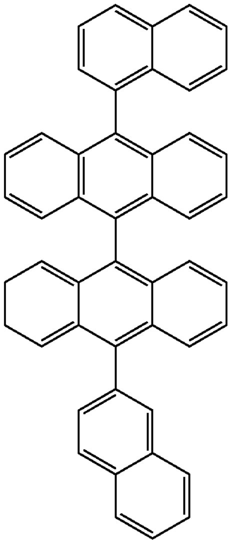
,
-continued
H34
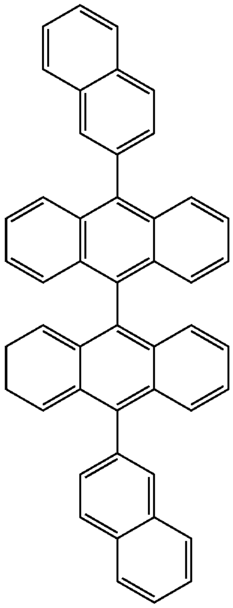
,
H35
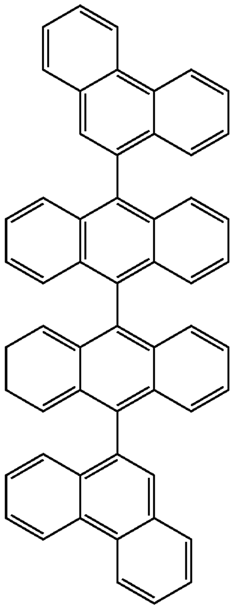
,
H36
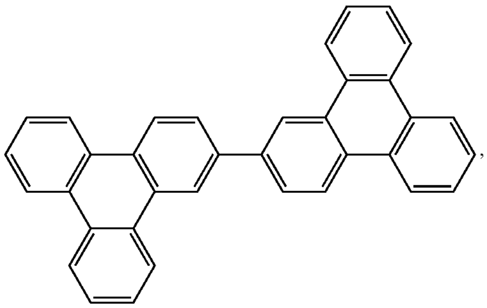
, -continued
H37
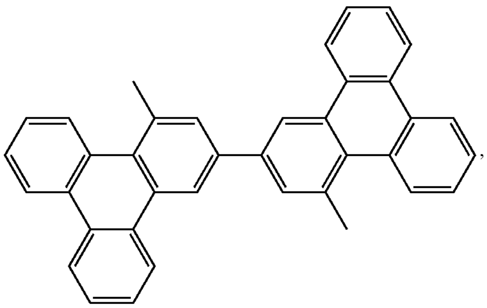
,
H38
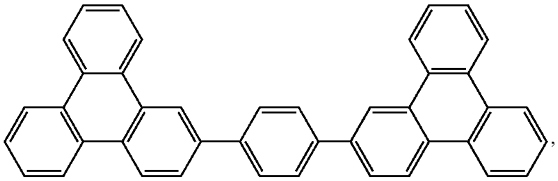
,
H39
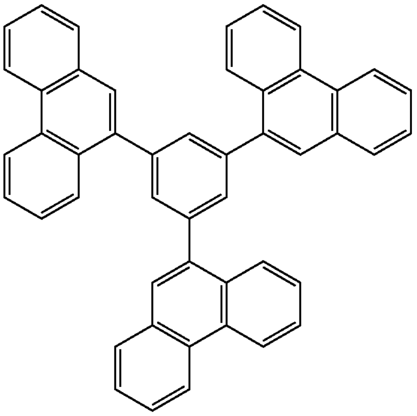
,
H40
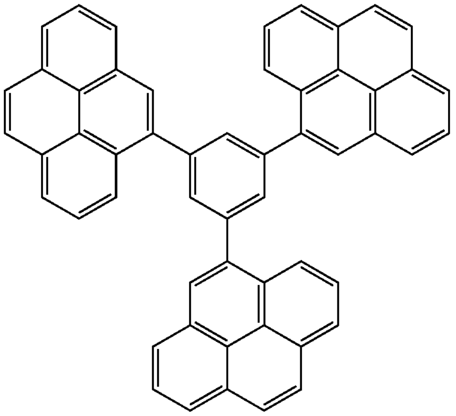
,
H41
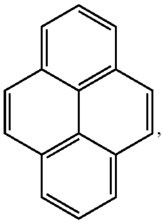
,
-continued
H42
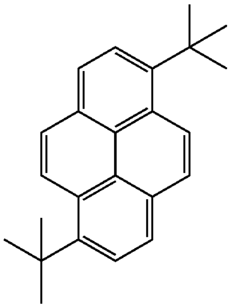
,
H43
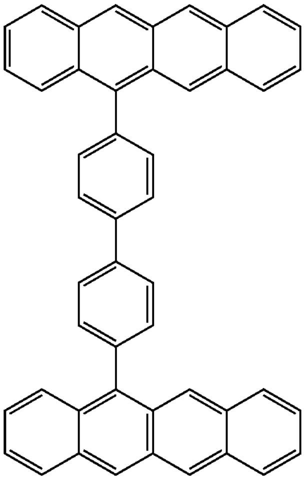
,
H44
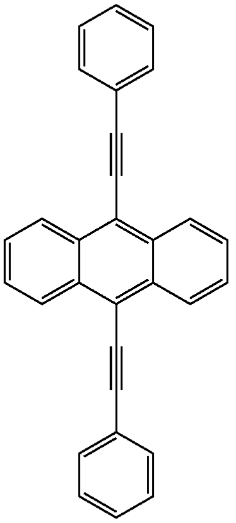
,
H45
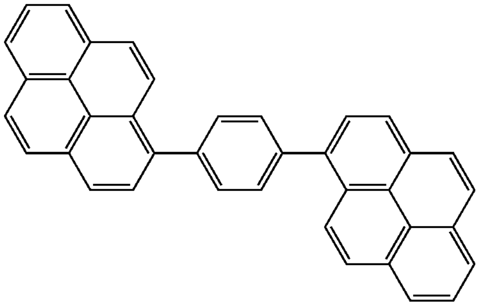
, -continued
H46
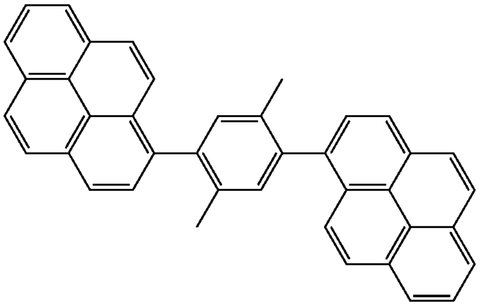
,
H47
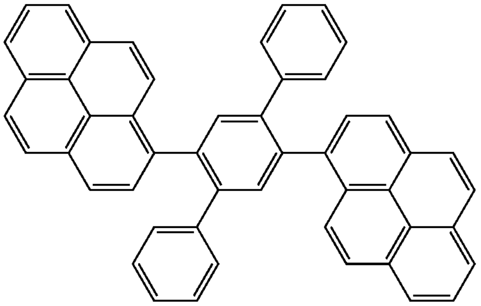
,
H48
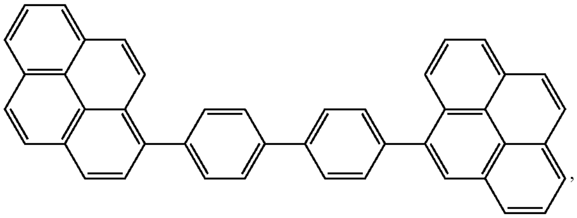
,
H49
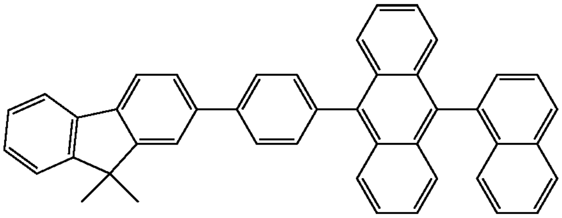
,
H50
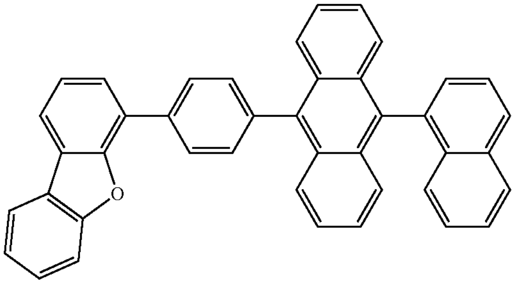
,
-continued
H-51
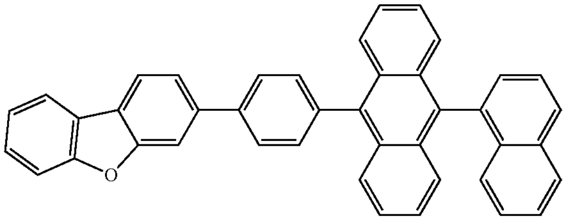
,
H-52
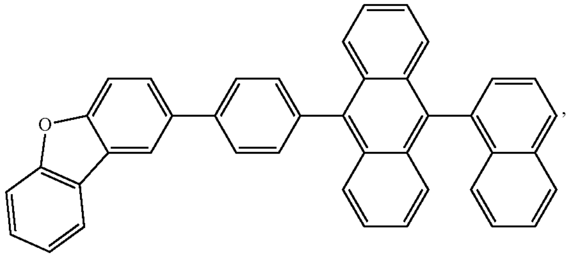
,
H-53
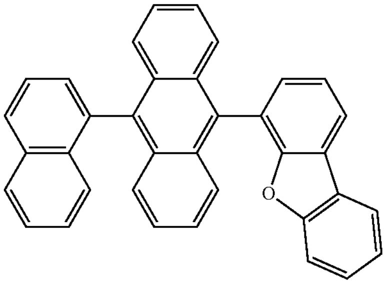
,
H-54
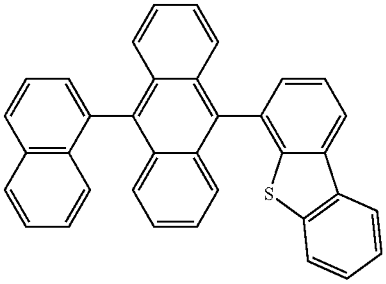
,
H-55
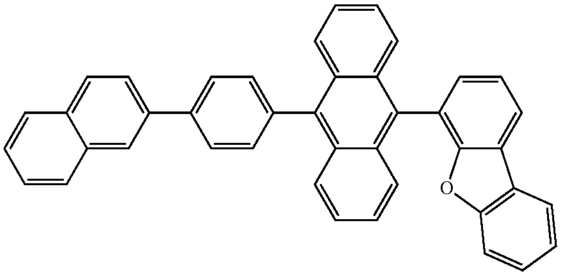
, -continued
H-56
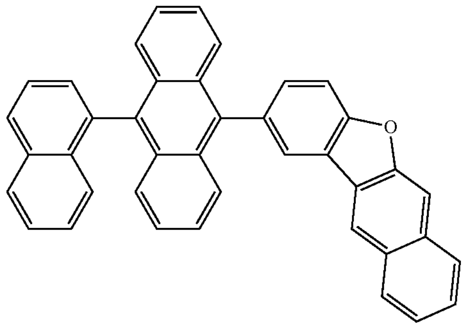
,
H-57
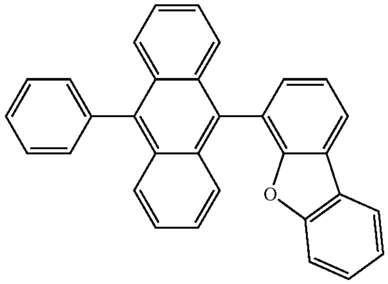
,
H-58
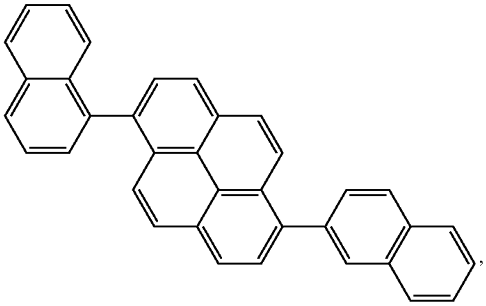
,
H-59
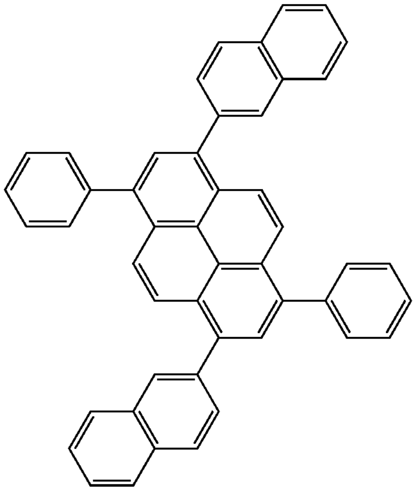
,
H-60
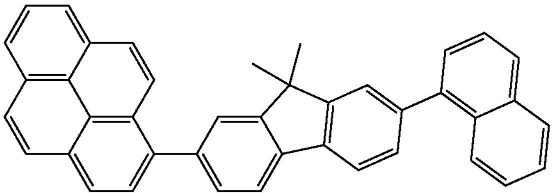
,
-continued
H-61
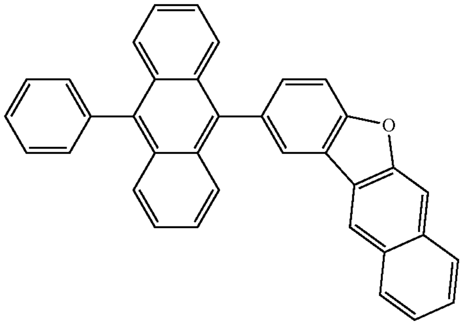
,
H62
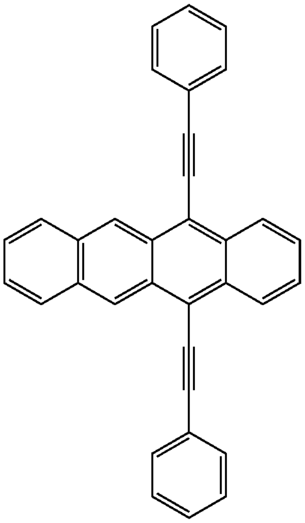
,
H63
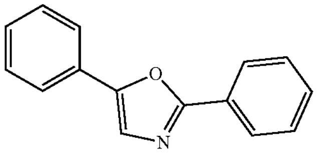
,
H64
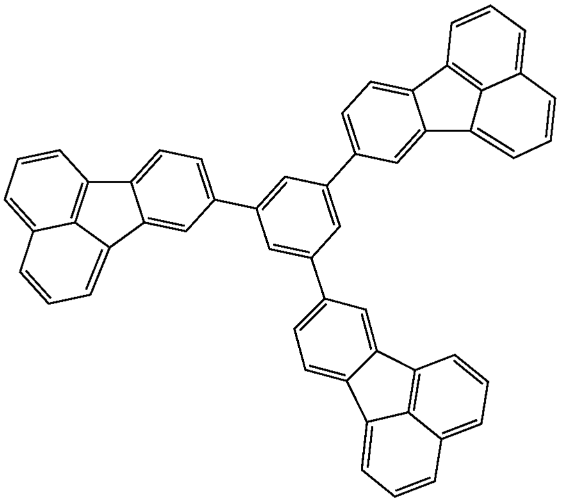
, -continued

H65

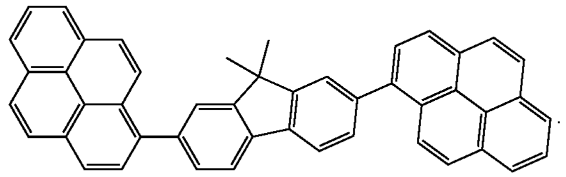

Hereinafter, the hole transport region, electron transport region, and cathode of the present application will be described. The hole transport region is located between the anode and the light-emitting layer. The hole transport region May be a single-layered hole transport layer (HTL), including a single-layer hole transport layer containing only one compound and a single-layer hole transport layer containing multiple compounds. The hole transport region may also be a multilayer structure including at least two of a hole injection layer (HIL), a hole transport layer (HTL), and an electron blocking layer (EBL).

The material of the hole transport region (including HIL, HTL and EBL) may be selected from, but not limited to, a phthalocyanine derivative such as CuPc, a conductive polymer or a polymer containing a conductive dopant such as polyphenylene vinylene, polyaniline/dodecylbenzene sulfonic acid (Pani/DBSA), poly(3,4-ethylenedioxythiophene)/poly(4-styrene sulfonate) (PEDOT/PSS), polyaniline/camphorsulfonic acid (Pani/CSA), polyaniline/poly(4-styrene sulfonate) (Pani/PSS), and an aromatic amine derivative.

Where the aromatic amine derivatives are the compounds as represented by HT-1 to HT-34 below. If the material of the hole transport region is an aromatic amine derivative, it may be one or more of the compounds represented by HT-1 to HT-34.

HT-1

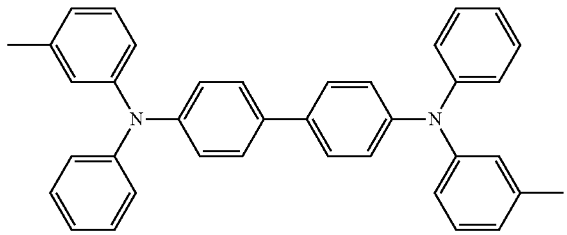

HT-2

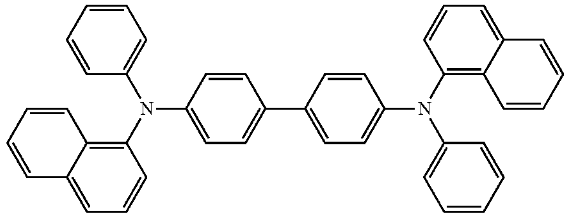

-continued

HT-3

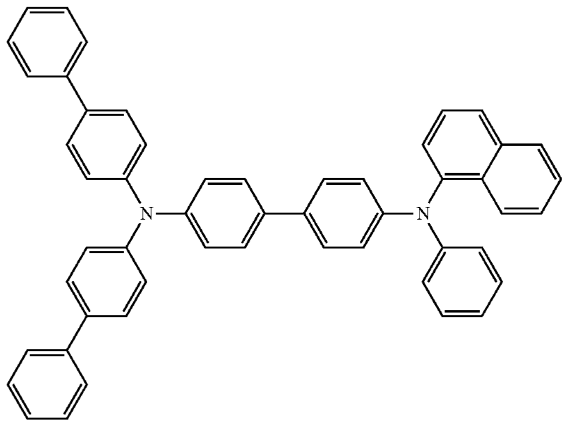

HT-4

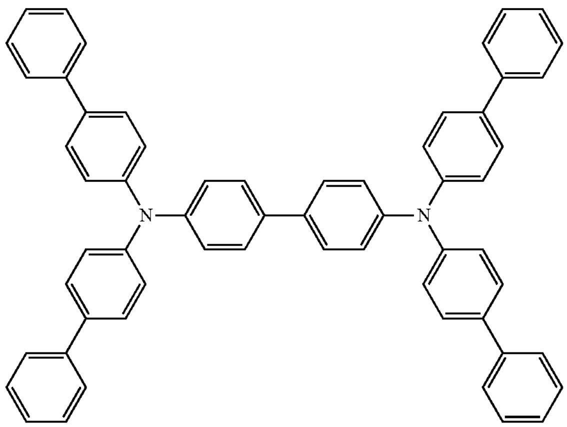

HT-5

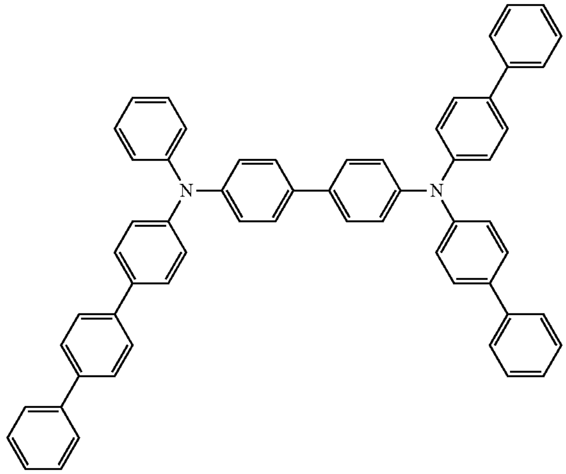

-continued
HT-6
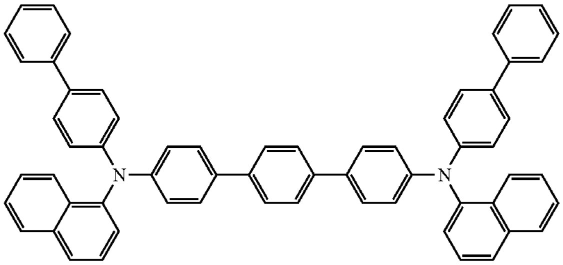
HT-7
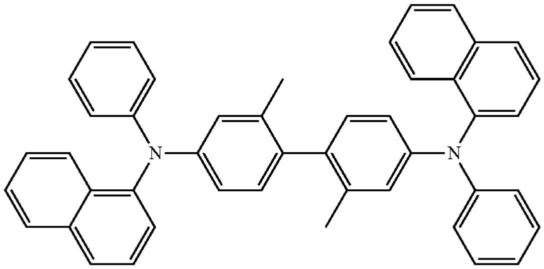
HT-8
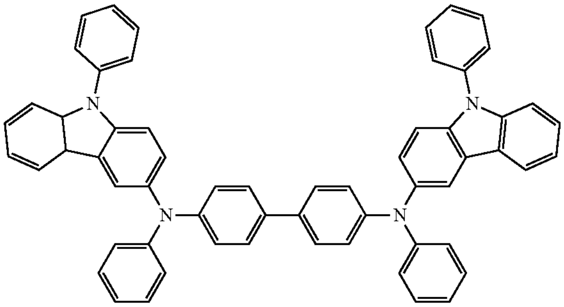
HT-9
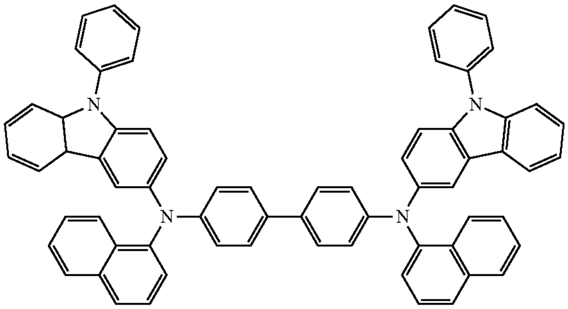
HT-10
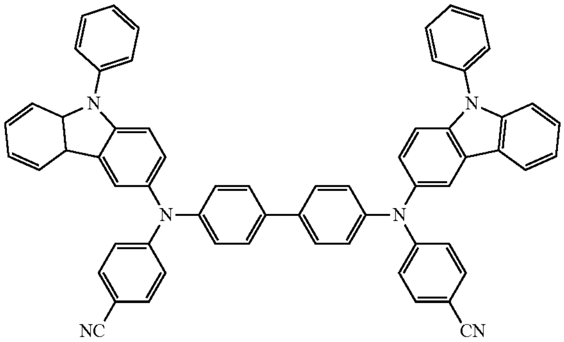
-continued
HT-11
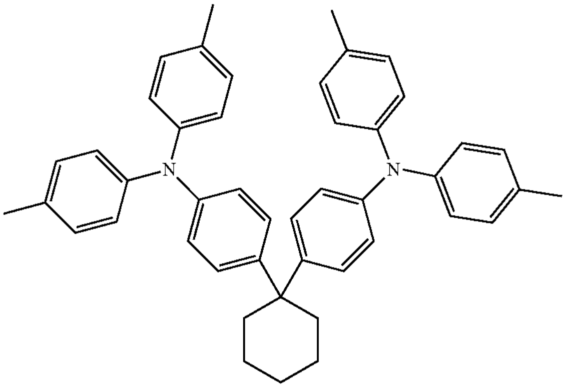
HT-12
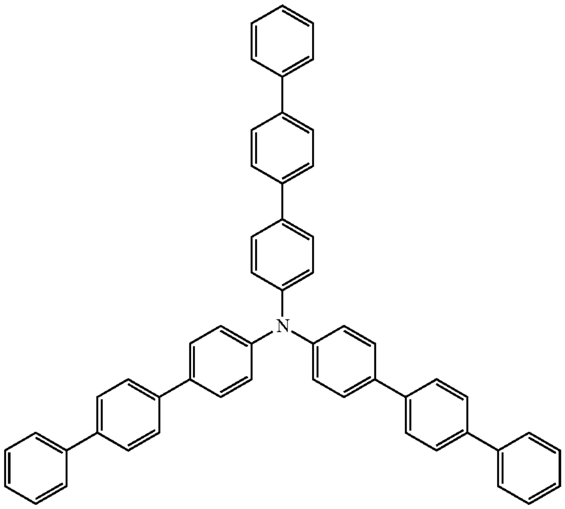
HT-13
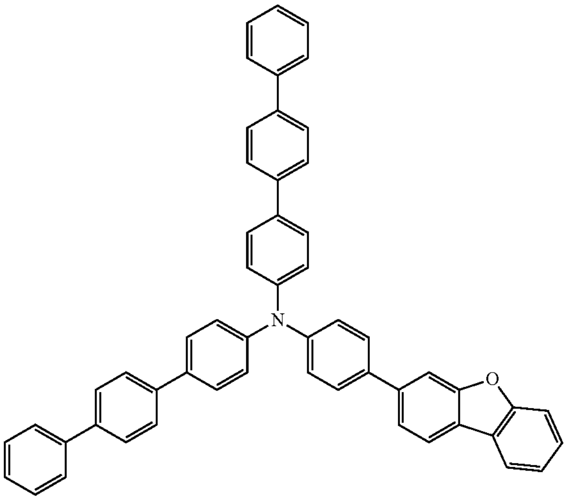

-continued
HT-14
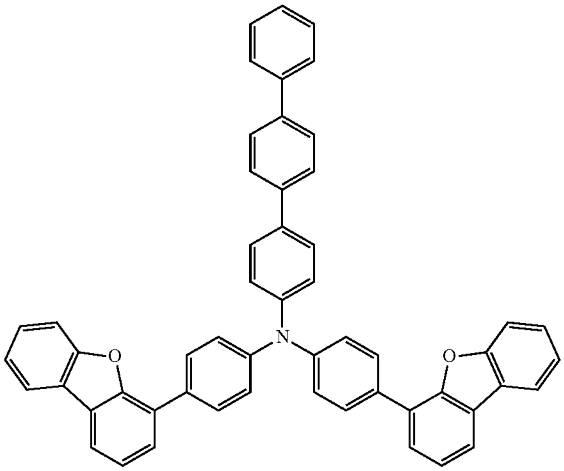
HT-15
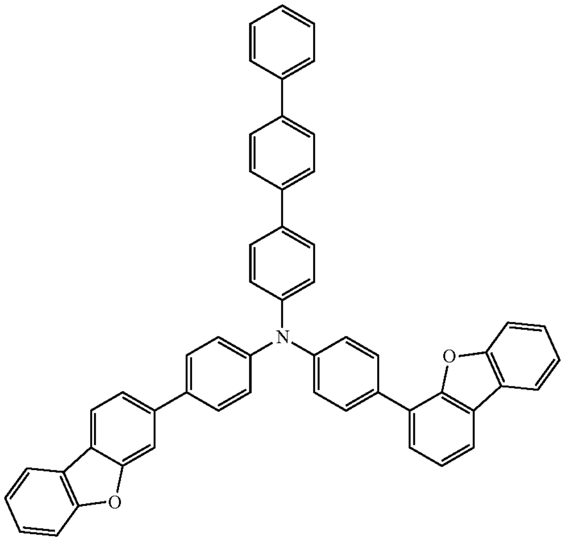
HT-16
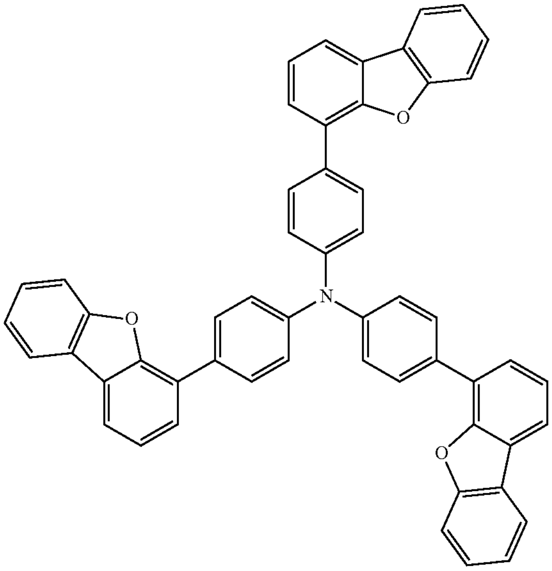
-continued
HT-17
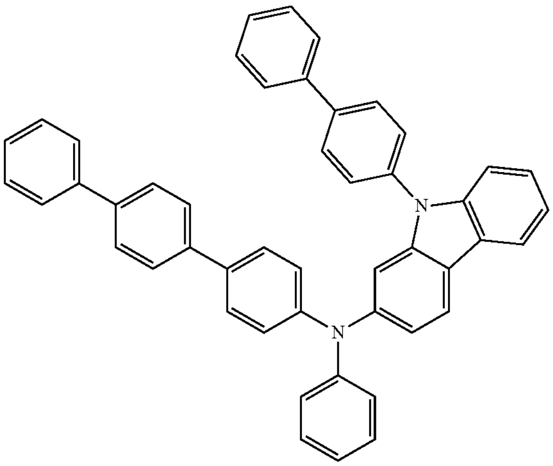
HT-18
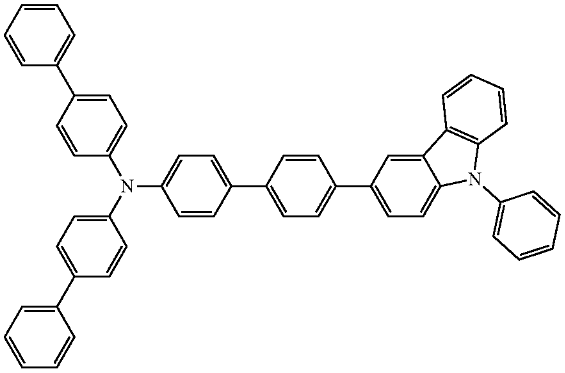
HT-19
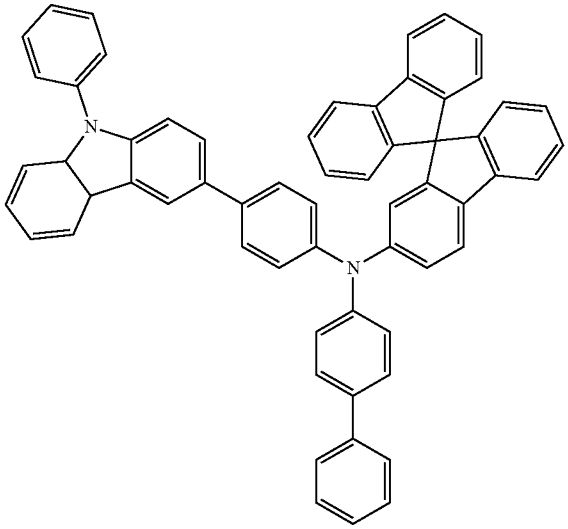

-continued
HT-20
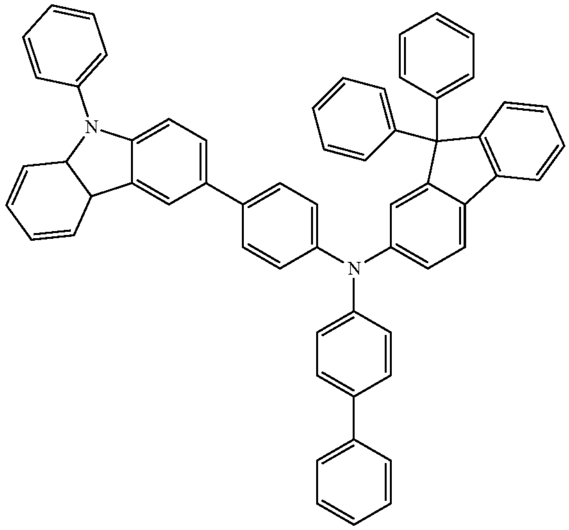
HT-21
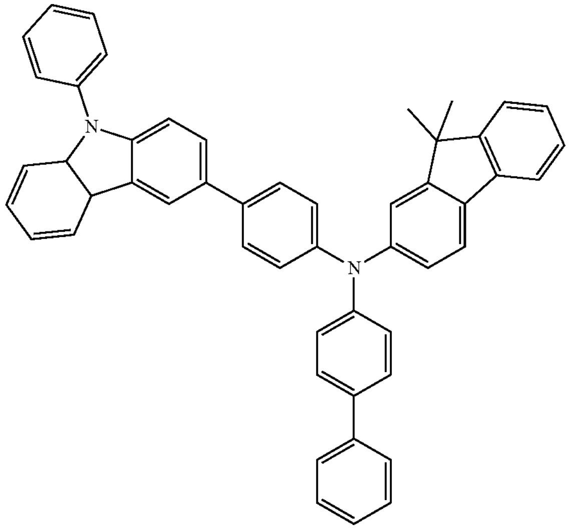
HT-22
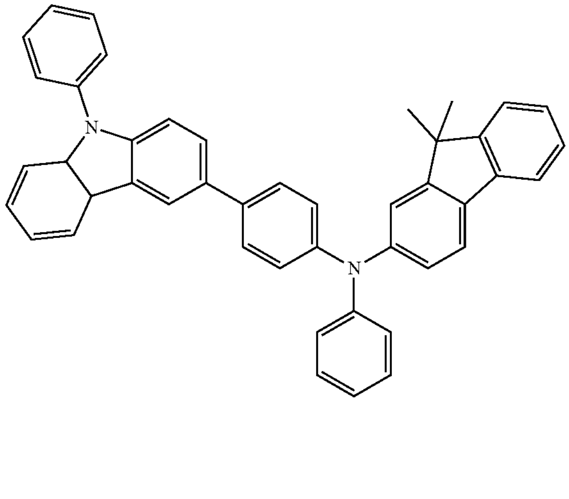
-continued
HT-23
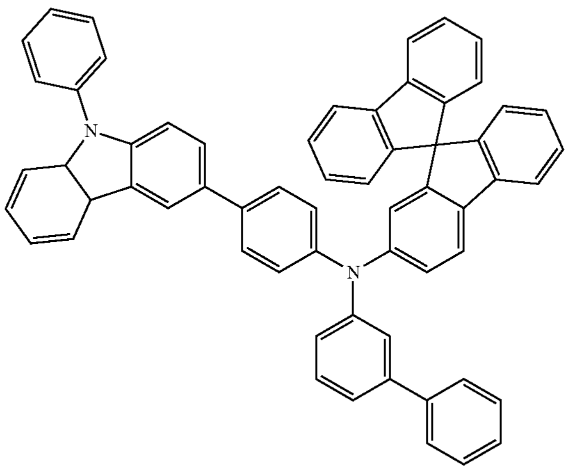
HT-24
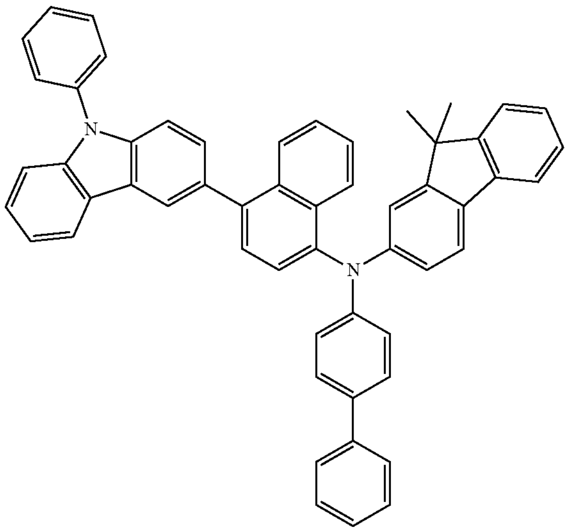
HT-25
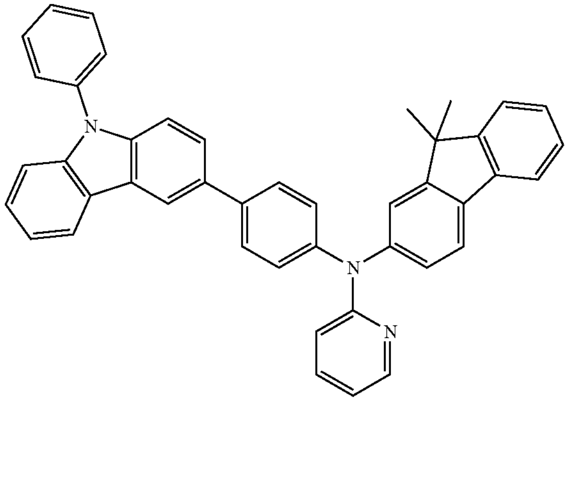

-continued
HT-26
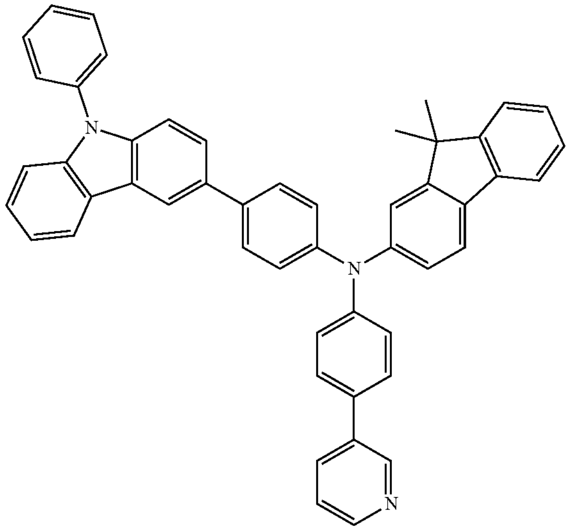
HT-27
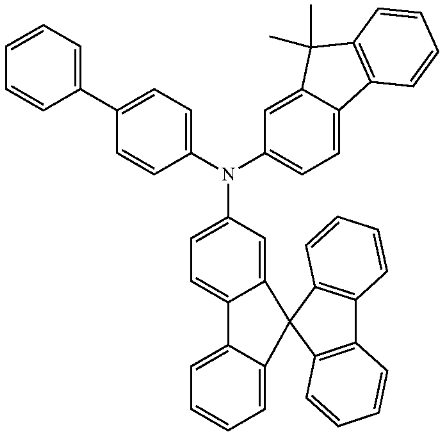
HT-28
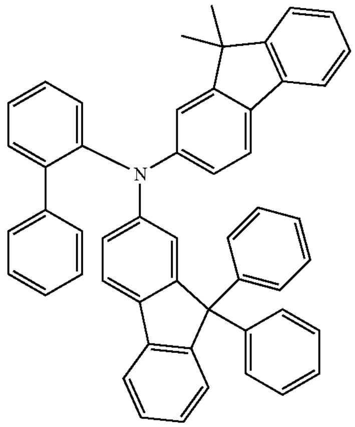
-continued
HT-29
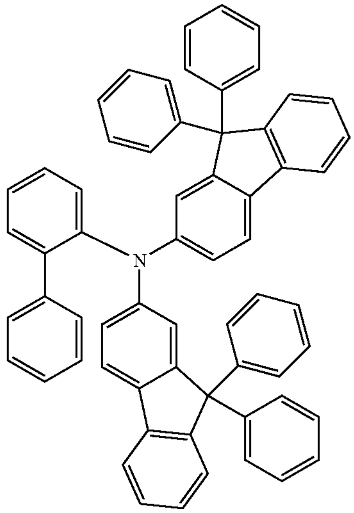
HT-30
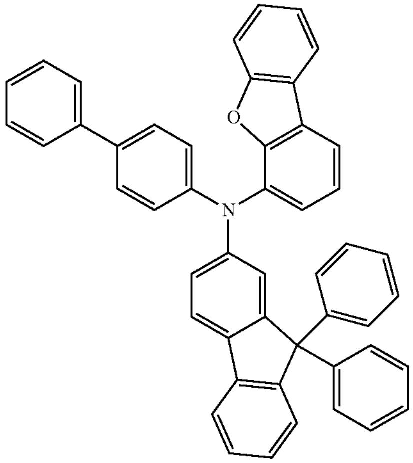
HT-31
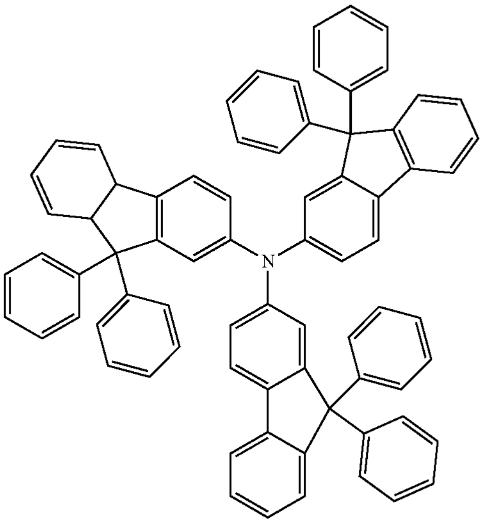

-continued

HT-32

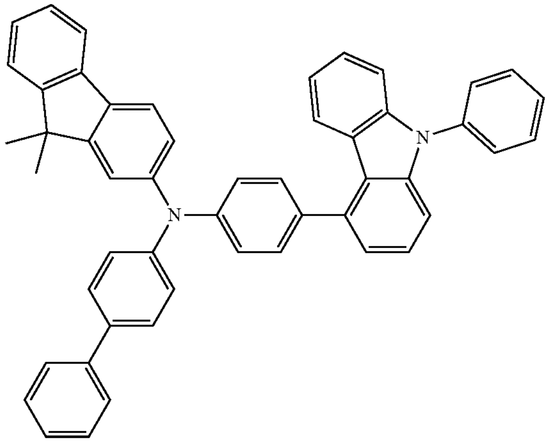

HT-33

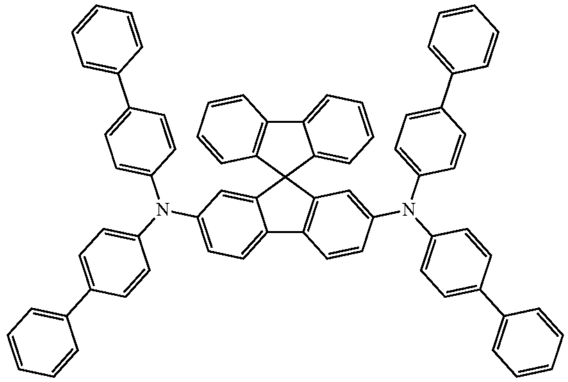

HT-34

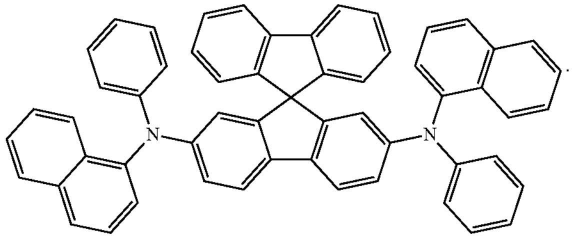

HI-1

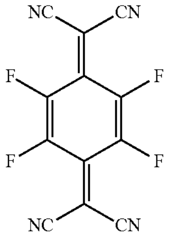

HI-2

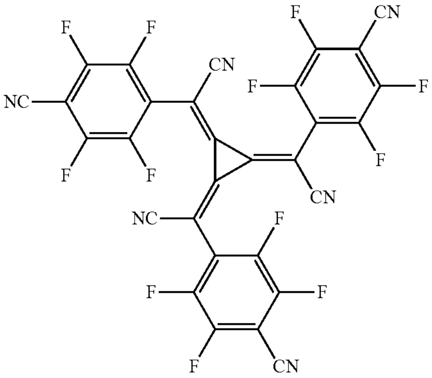

HI-3

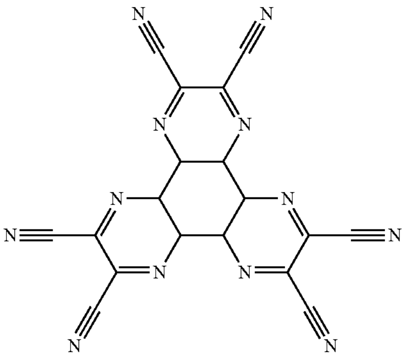

The hole injection layer is located between the anode and the hole transport layer. The hole injection layer may be a single compound material or a combination of multiple compounds. For example, the hole injection layer may use one or more of the above HT-1 to HT-34 compounds, or use one or more of the following HI-1-HI-3 compounds; it may also use one or more of the HT-1 to HT-34 compounds doped with one or more of the following HI-1 to HI-3 compounds.

The electron transport region may be a single-layered electron transport layer (ETL), including a single-layer electron transport layer containing only one compound and a single-layer electron transport layer containing multiple compounds. The electron transport region may also be a multilayer structure including at least two of an electron injection layer (EIL), an electron transport layer (ETL), and a hole blocking layer (HBL).

In one aspect of the present application, the material of electron transport layer may be selected from, but not limited to, one or more of ET-1 to ET-57 listed below.

ET-1
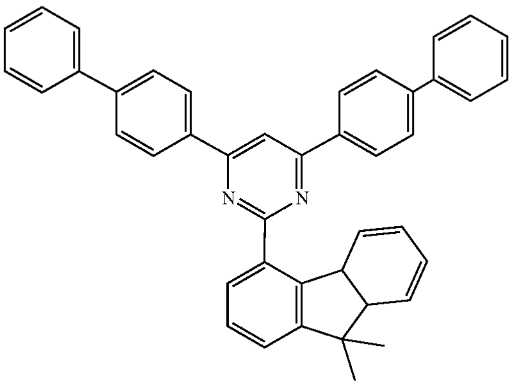
ET-2
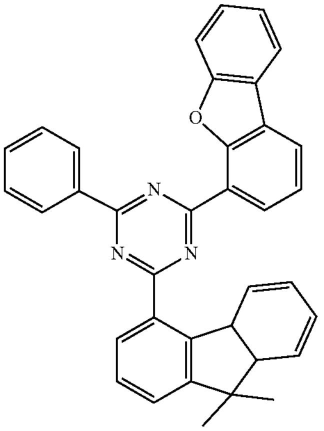
ET-3
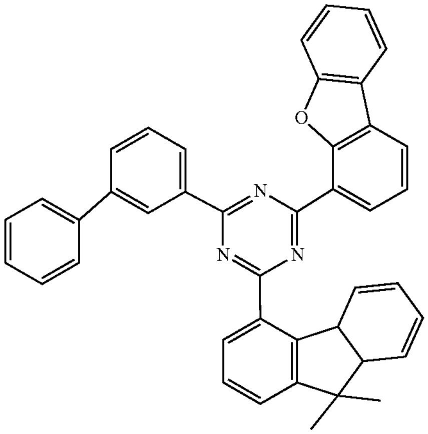
-continued
ET-4
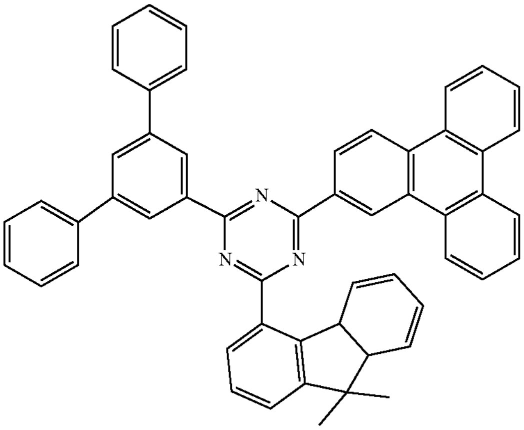
ET-5
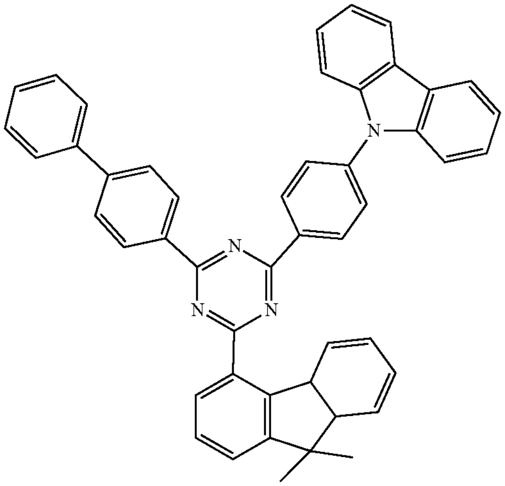
ET-6
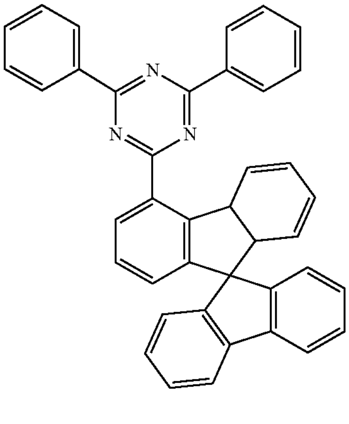

-continued
ET-7
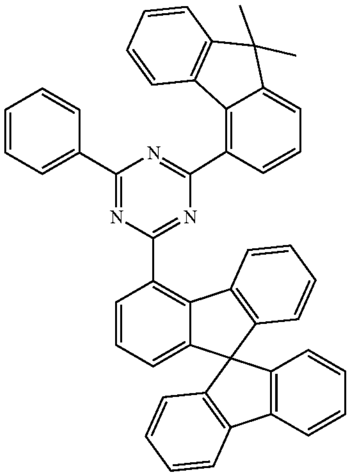
ET-8
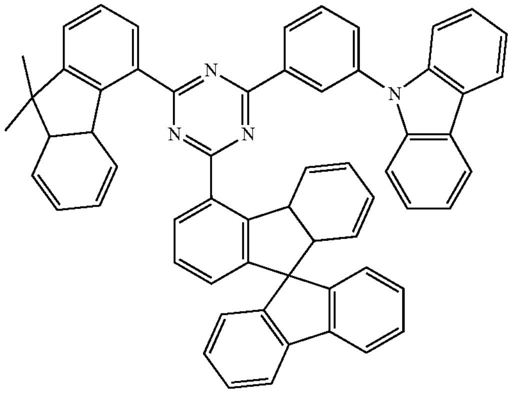
ET-9
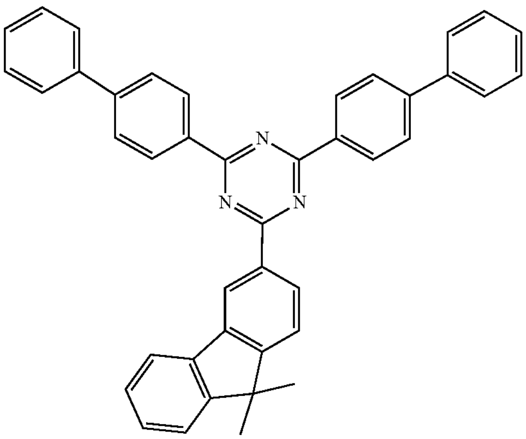
-continued
ET-10
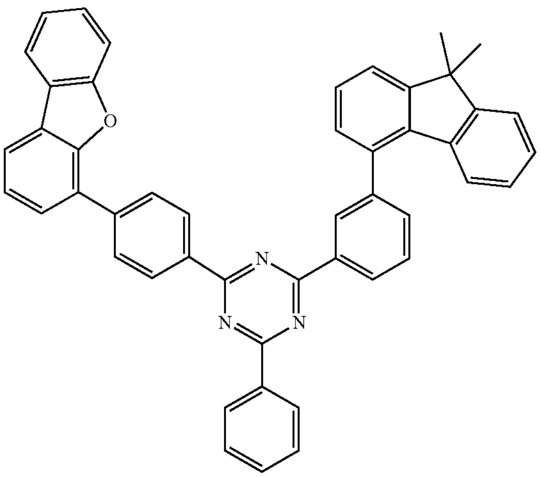
ET-11
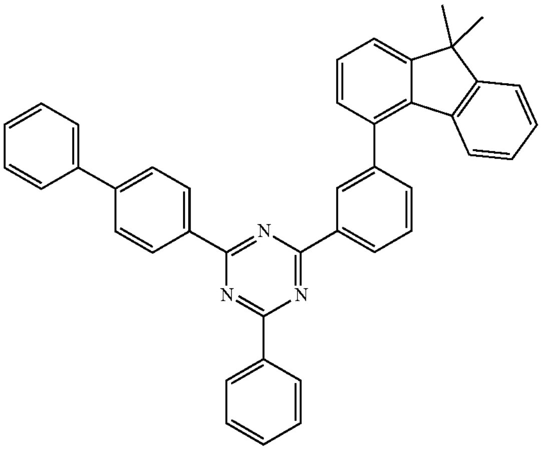
ET-12
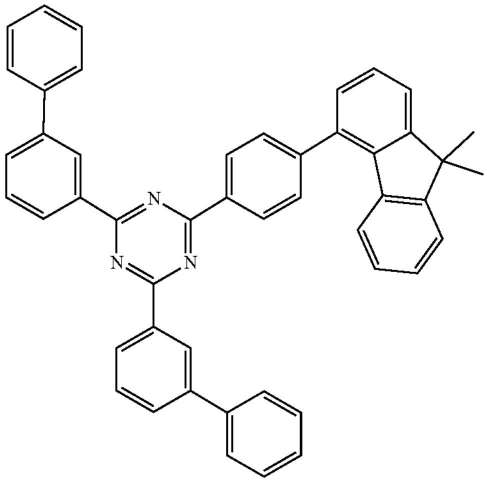

-continued
ET-13
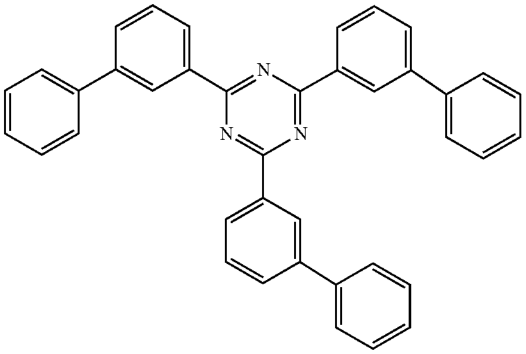
ET-14
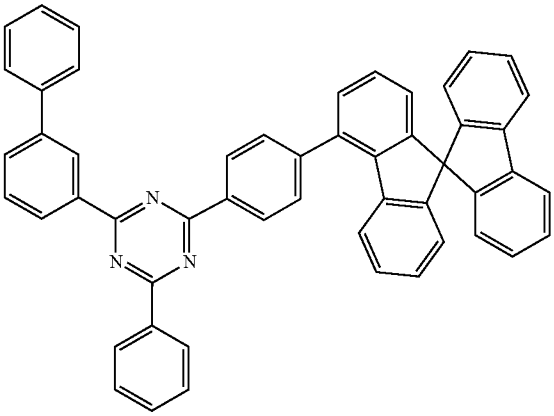
ET-15
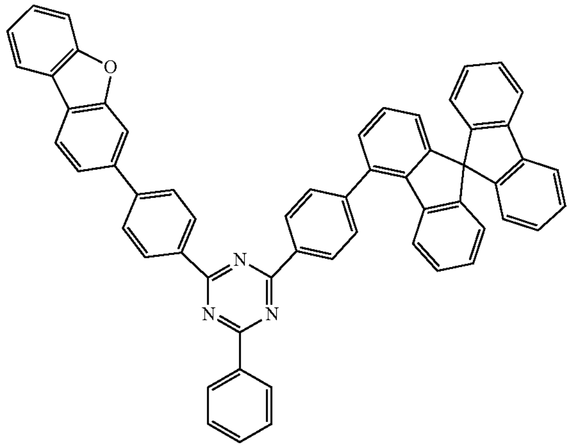
-continued
ET-16
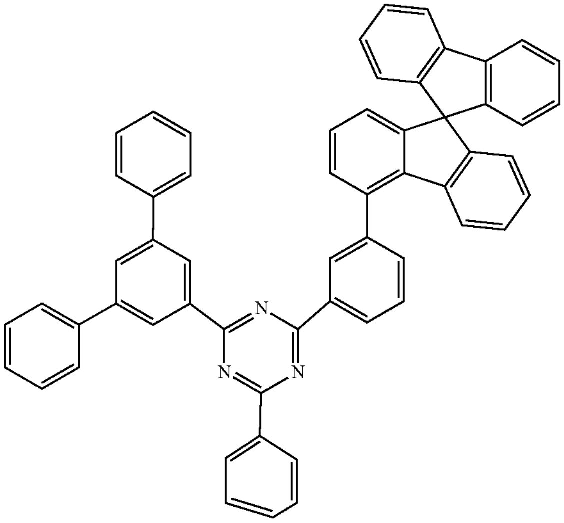
ET-17
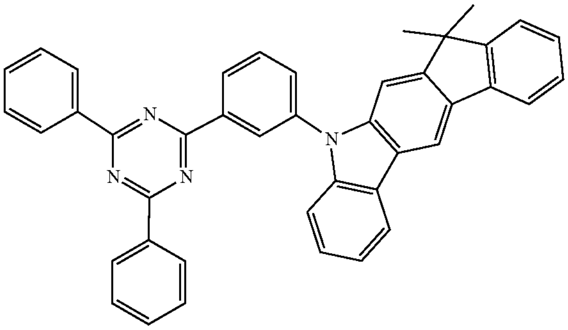
ET-18
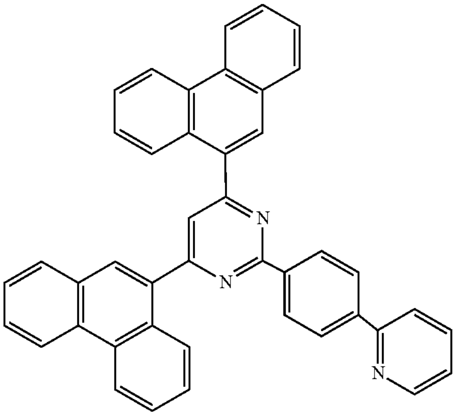

-continued
ET-19
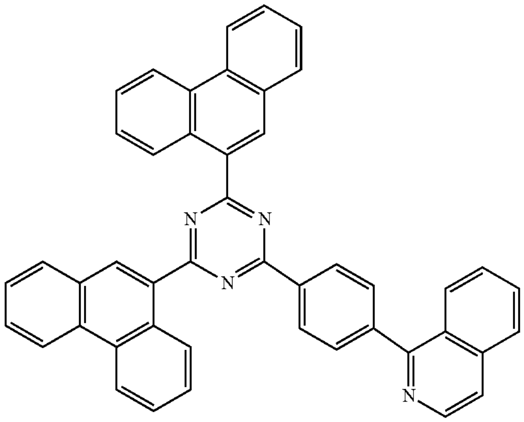
ET-20
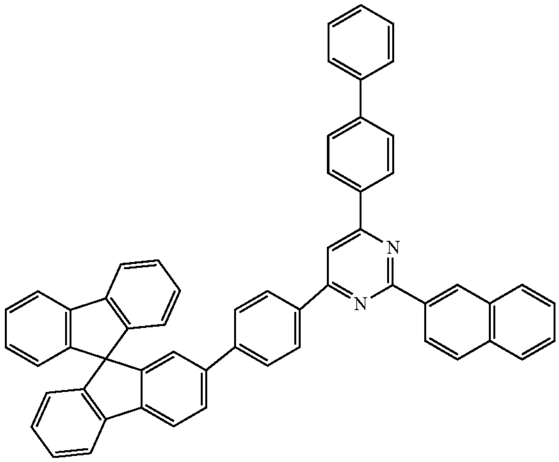
ET-21
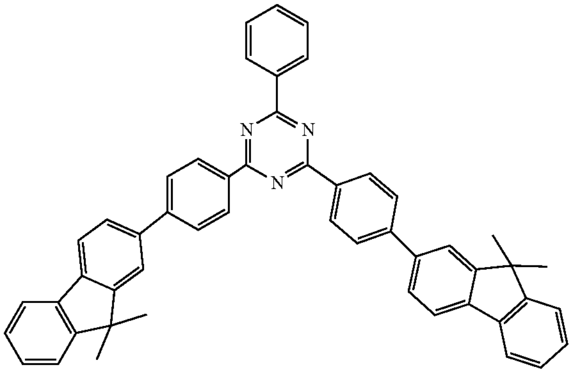
-continued
ET-22
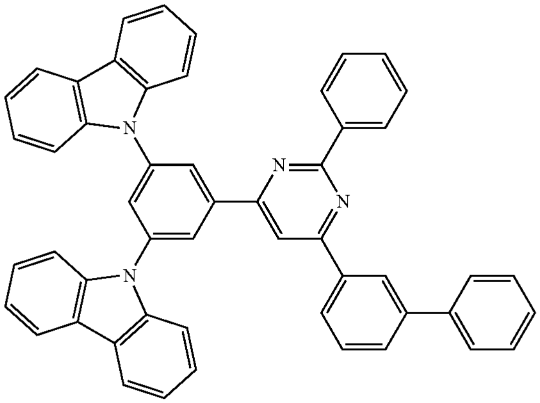
ET-23
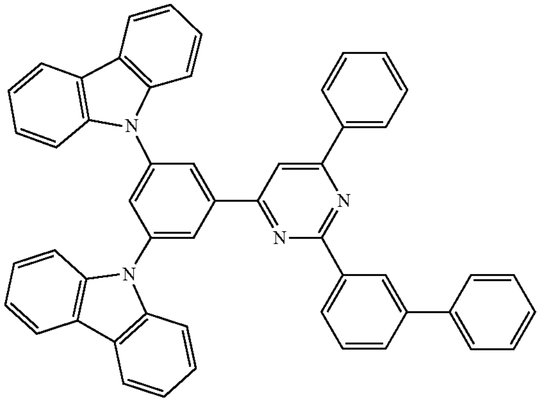
ET-24
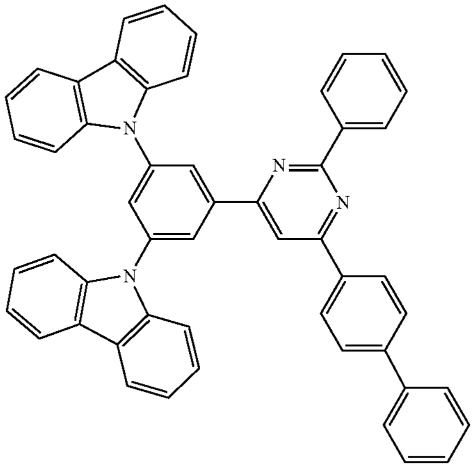

-continued
ET-25
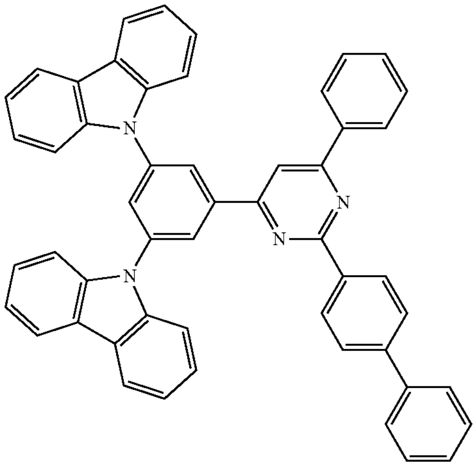
ET-26
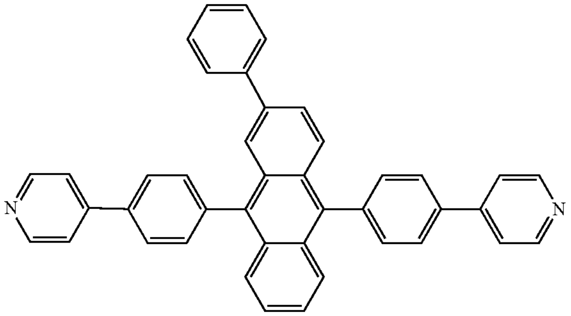
ET-27
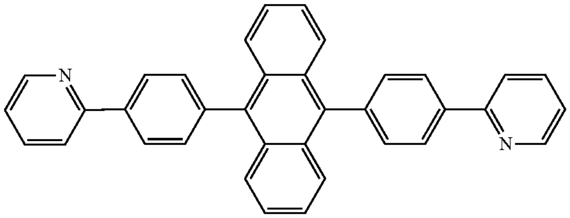
ET-28
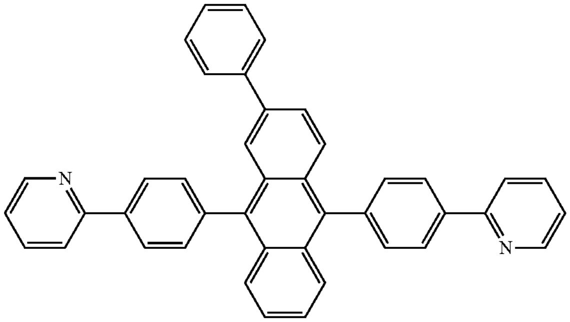
-continued
ET-29
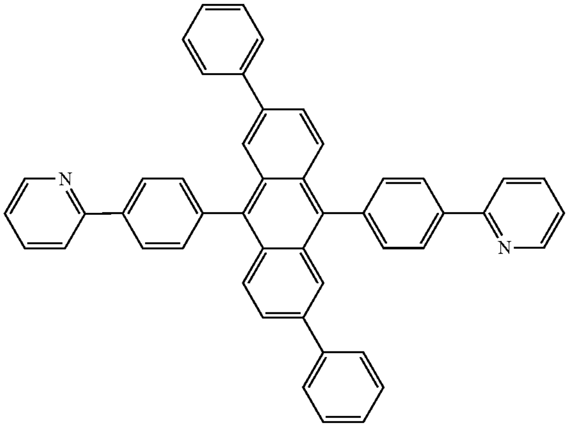
ET-30
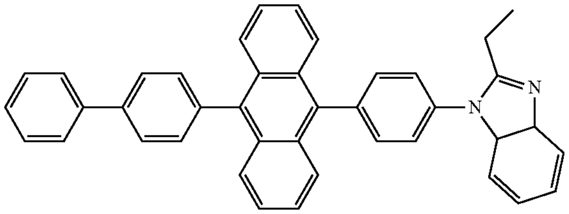
ET-31
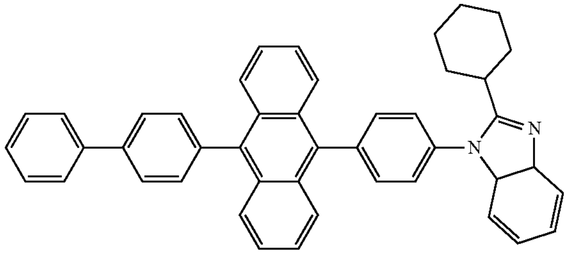
ET-32
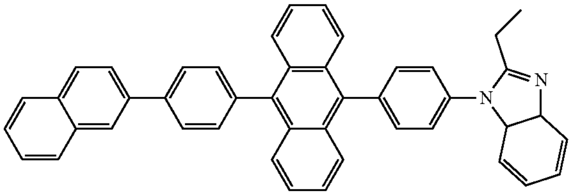
ET-33
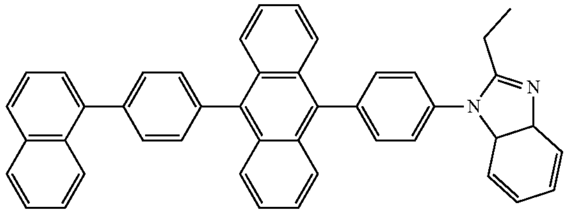

-continued
ET-34
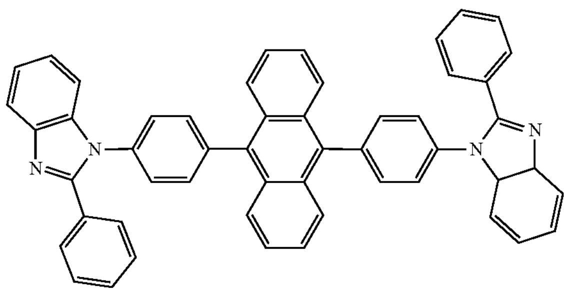
ET-35
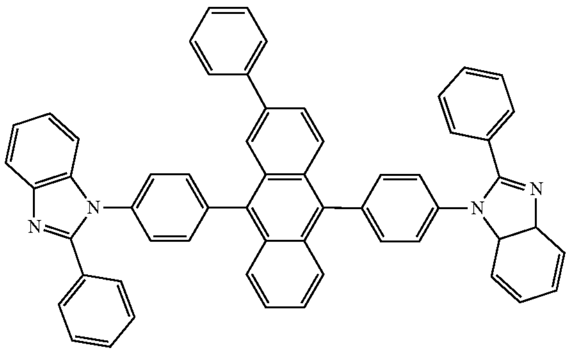
ET-36
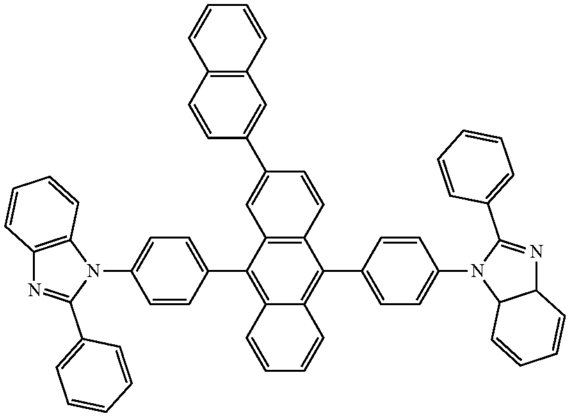
ET-37
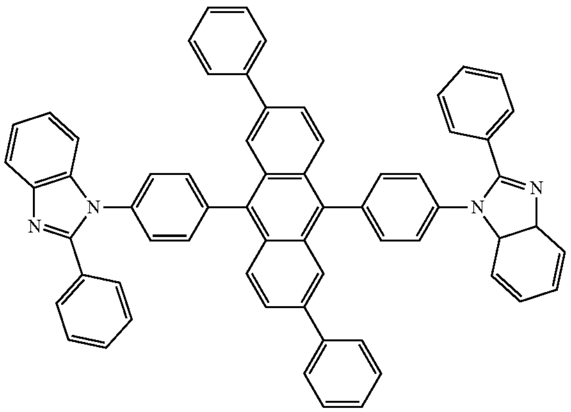
-continued
ET-38
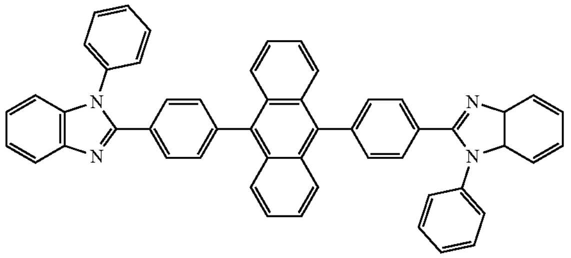
ET-39
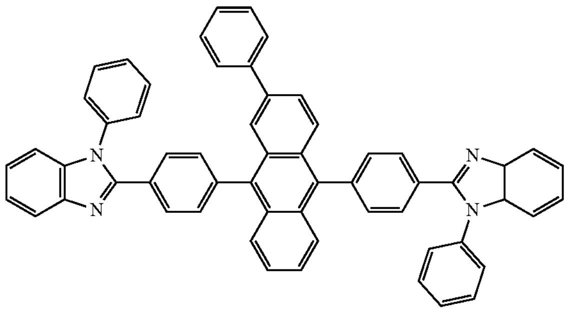
ET-40
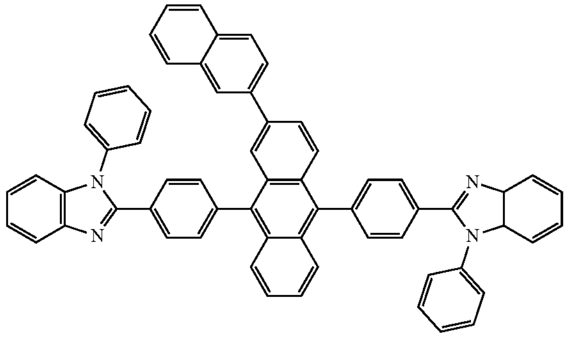
ET-41
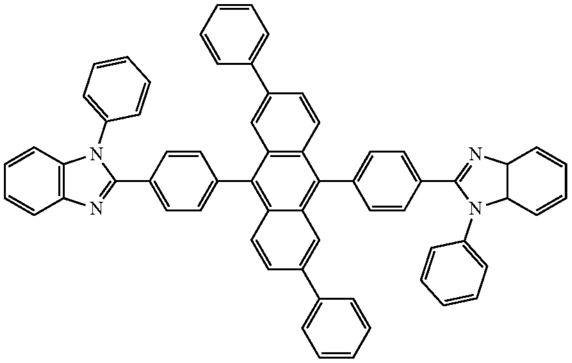

-continued
ET-42
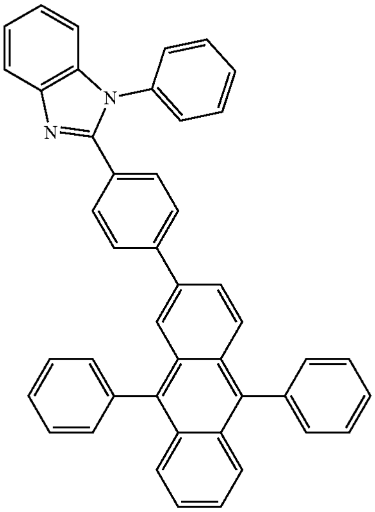
ET-43
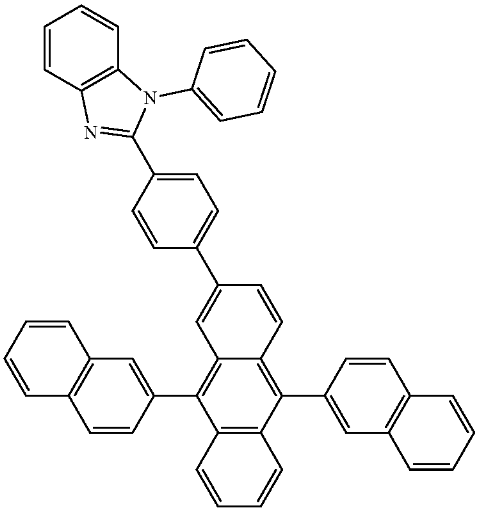
ET-44
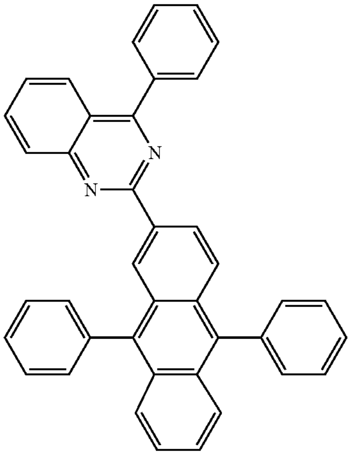
-continued
ET-45
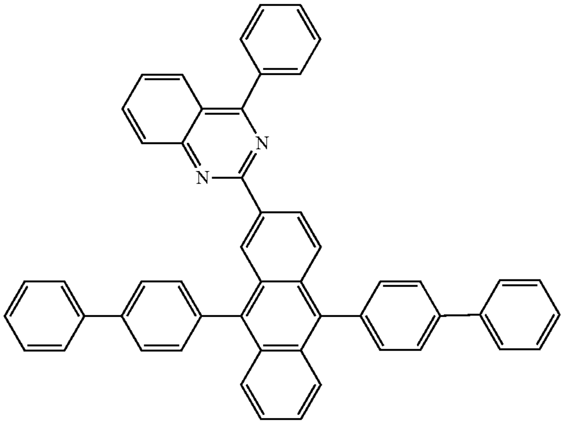
ET-46
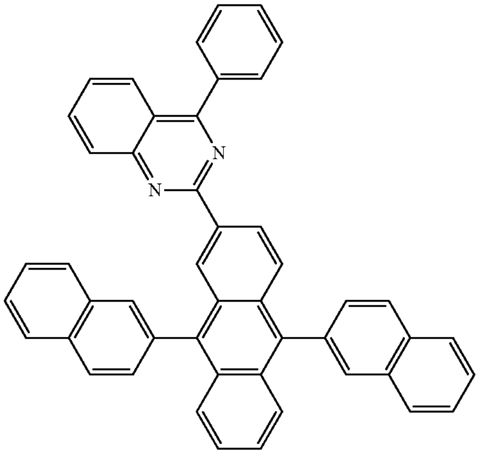
ET-47
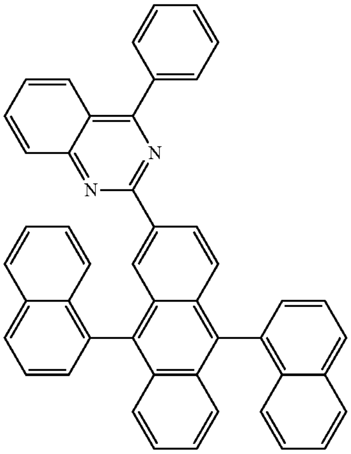

-continued
ET-48
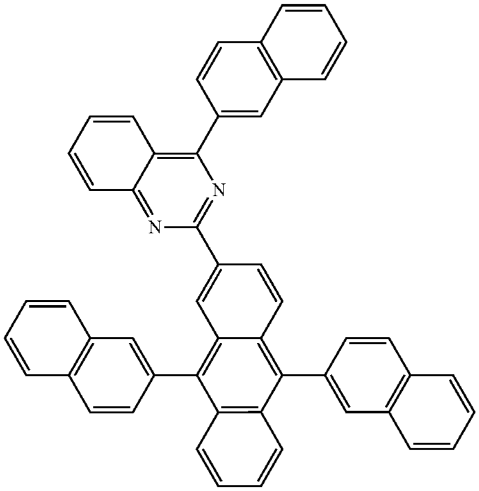
ET-49
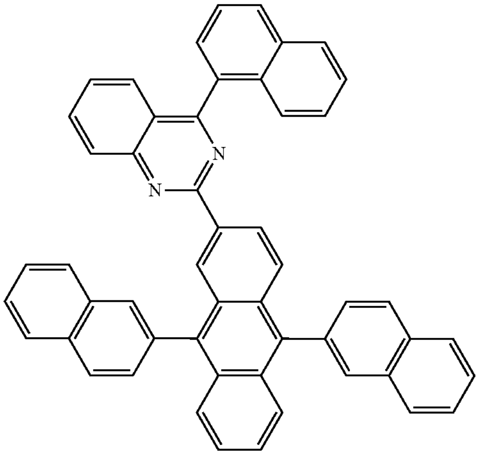
ET-50
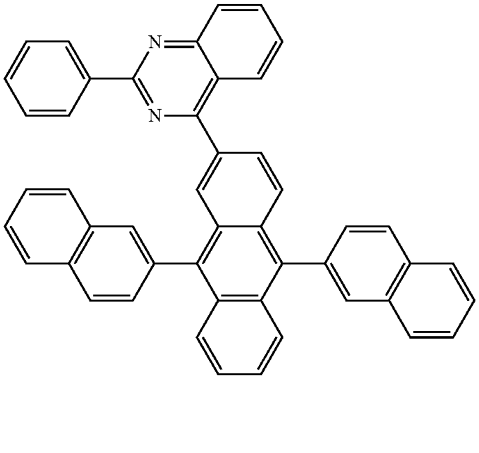
-continued
ET-51
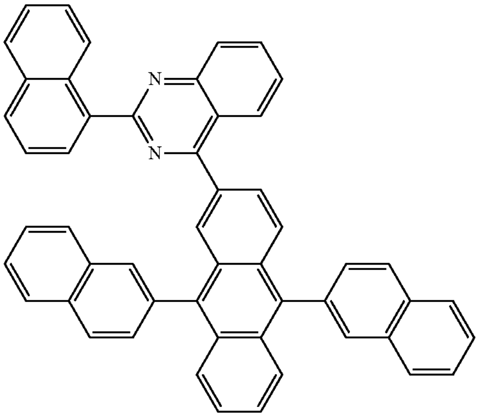
ET-52
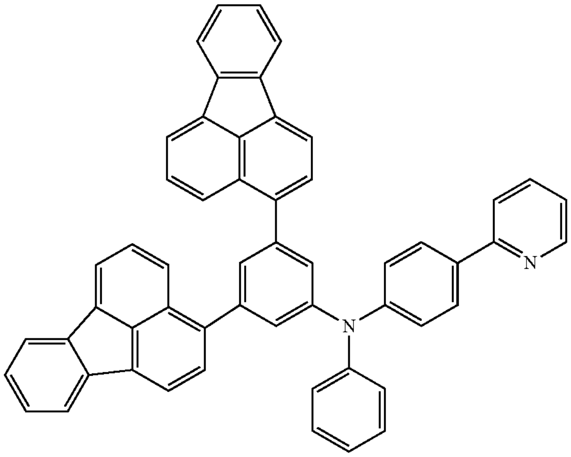
ET-53
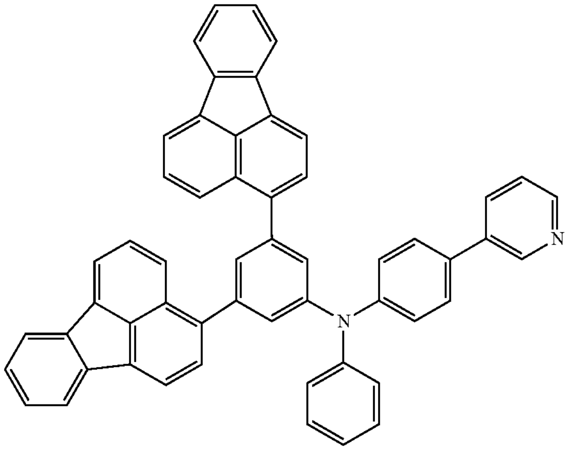

-continued

ET-54

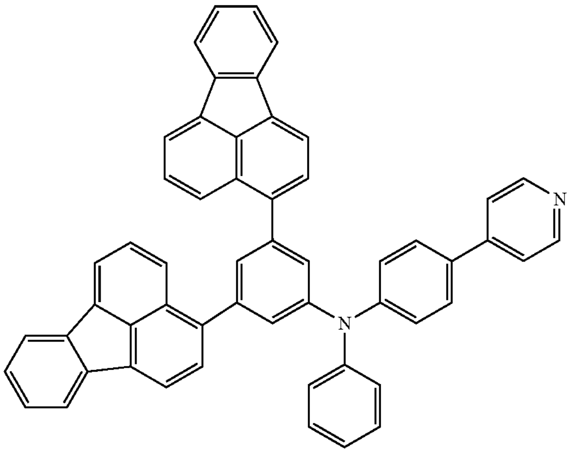

ET-55

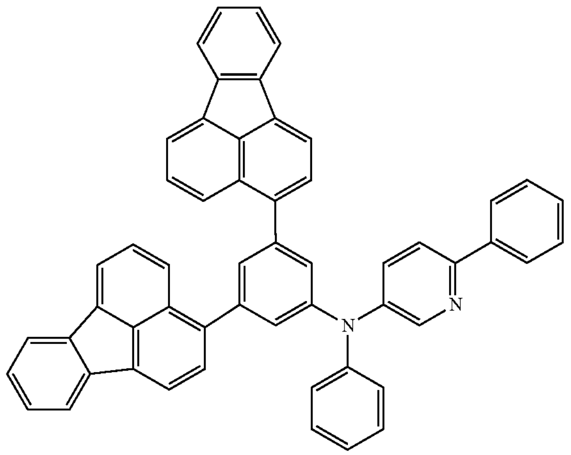

ET-56

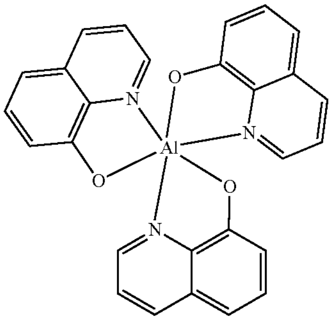

ET-57

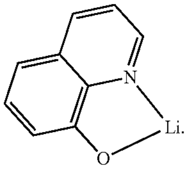

The structure of the light emitting device may further include an electron injection layer located between the electron transport layer and the cathode, and the material of the electron injection layer includes, but is not limited to, one or more of the following materials listed below:

LiQ, LiF, NaCl, CsF, $Li_2O$, $Cs_2CO_3$, BaO, Na, Li, Ca.

The thickness of each of the above layers may adopt a conventional thickness in the field.

The present application also provides a method for preparing the organic light emitting device, including sequentially depositing an anode, a hole transport region, a light-emitting layer, an electron transport region, and a cathode on a substrate, and then encapsulating. When preparing the light-emitting layer, the method of multi-source co-evaporation is used to adjust the evaporation rate of the host material and the evaporation rate of the dye so as to make the dye reach the preset doping ratio, and the light-emitting layer is formed by a method of co-evaporating a triplet-triplet annihilation material source and any one of the above boron-nitrogen material sources. The deposition patterns of the anode, the hole transport region, the electron transport region, and the cathode are the same as the existing patterns in the field.

An embodiment of the present application also provides a display apparatus, which includes the organic light emitting device described above. Specifically, the display apparatus may be a display device such as an OLED displayer, and any product or component with a display function, such as a TV, a digital camera, a mobile phone, a tablet computer, and the like including the display device. This display apparatus has the same advantages as the above organic light emitting device over the prior art, which will not be repeated here.

Hereinafter, a larger number of synthesis examples will be exemplified below to describe the specific preparation method of the boron-nitrogen material of the present application in detail, but the preparation method of the present application is not limited to these synthesis examples.

Various chemicals used in the present application such as petroleum ether, tert-butyl benzene, ethyl acetate, sodium sulfate, toluene, dichloromethane, potassium carbonate, boron tribromide, N,N-diisopropylethylamine, and basic chemical raw materials such as reaction intermediates were commercially available from Shanghai Titan Technology Co., Ltd. and Xilong Chemical Co., Ltd. The mass spectrometer used to determine the following compounds was ZAB-HS mass spectrometer (manufactured by Micromass Co., UK).

The method for synthesizing the boron-nitrogen material represented by Formula 1 of the present application is briefly described below (process (1)). First, the hydrogen atoms among $X^1$, $X^2$ and $X^3$ were treated with n-butyl lithium or tert-butyl lithium, etc. to perform ortho metalation. Next, after boron tribromide or phosphorus trichloride, etc. was added to perform lithium-boron or lithium-phosphorus metal exchange, Bronsted base such as N, N-diisopropylethylamine was added. In this way, Tandem Bora-Friedel-Crafts Reaction was carried out to obtain the target.

Process (1)

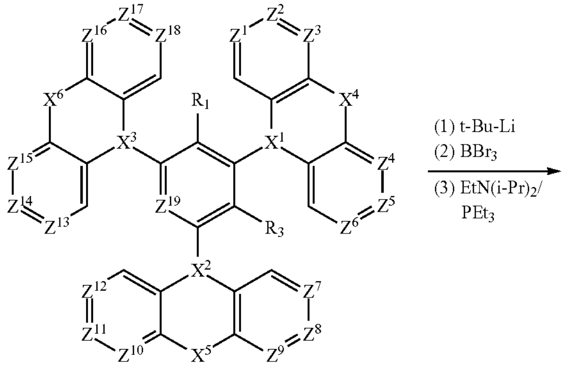

-continued

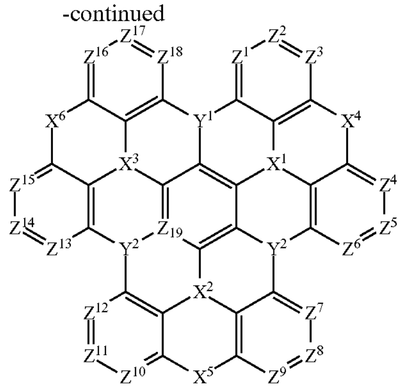

More specifically, the synthesis methods of representative specific compounds of the present application are given below.

SYNTHESIS EXAMPLE

Synthesis Example 1: Synthesis of Compound A-9

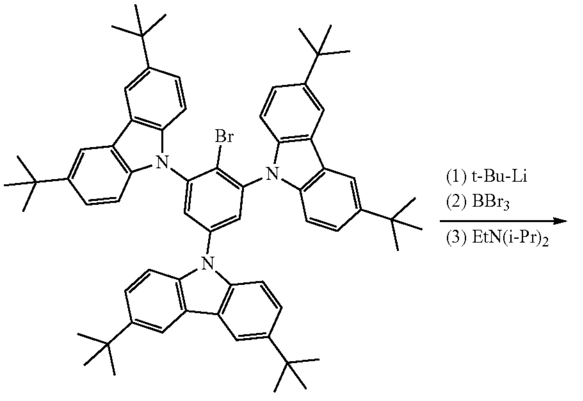

A-9-1

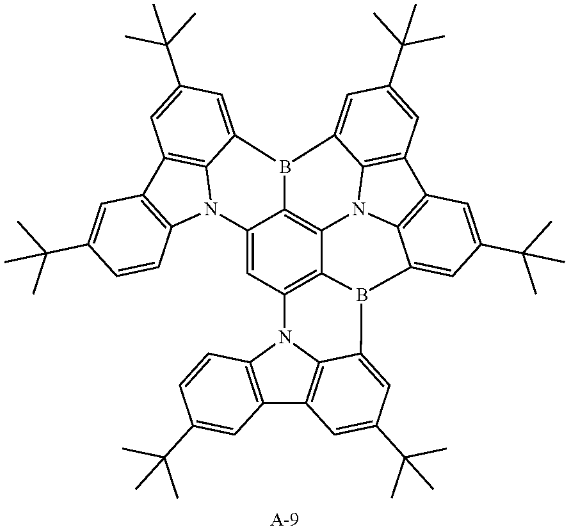

A-9

Under nitrogen atmosphere, the solution of tert-butyl lithium in pentane (18.96 mL, 1.60M, 30.34 mmol) was slowly added to the solution of Br-precursor A-9-1 (13.62 g, 13.79 mmol) in tert-butyl benzene (150 mL), and then sequentially heated to 80° C., 100° C., 120° C. and reacted for 1 hour, respectively. After the reaction, the temperature was lowered to −30° C., boron tribromide (7.6 g, 30.34 mmol) was slowly added, and stirring was continued at room temperature for 0.5 h. N,N-diisopropylethylamine (5.35 g, 41.37 mmol) was added at room temperature to continue the reaction at 145° C. for 5 h before stopping. The target compound C-9 as a yellow solid (1.00 g, yield: 8%, HPLC analytical purity: 99.56%), was obtained by vacuum spin-drying of the solvent and passing through a silica gel column (a developing solvent:ethyl acetate:petroleum ether=50:1). MALDI-TOF-MS results: molecular ion peak: 926.45; elemental analysis results: theoretical value: C: 85.62%; H: 7.51%; B: 2.33%; N: 4.545%; experimental value: C: 85.72%; H: 7.66%; B: 2.83%; N: 3.79%.

Synthesis Example 2: Synthesis of Compound A-29

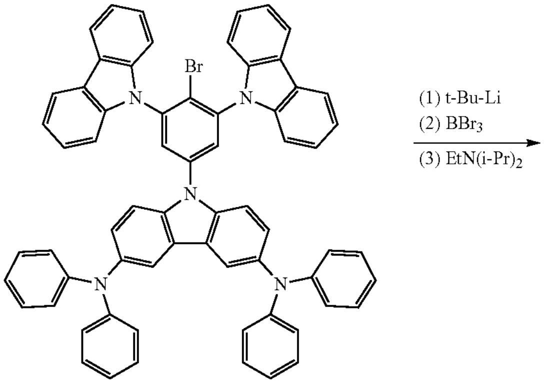

A-29-1

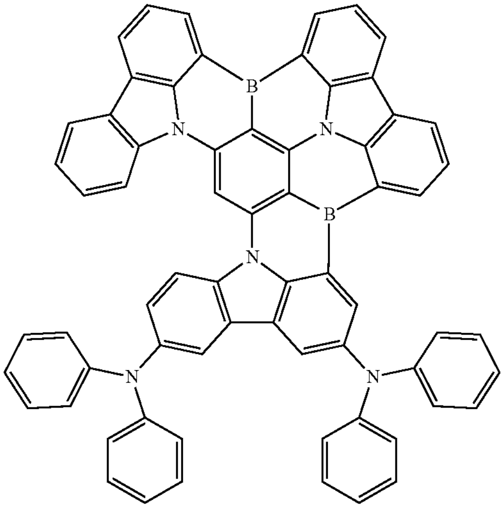

A-29

This example was basically the same as Synthesis Example 1, except that: in this example, A-9-1 was replaced with A-29-1 in equal amount of substance. The target compound A-29 (1.29 g, yield: 10%, HPLC analysis purity: 99.36%), was a yellow solid. MALDI-TOF-MS results: molecular ion peak: 923.31; elemental analysis results: theoretical value: C: 85.82%; H: 4.26%; B: 2.34%; N: 7.58%; experimental value: C: 85.83%; H: 4.25%; B: 2.24%; N: 7.68%.

Synthesis Example 3: Synthesis of Compound A-51

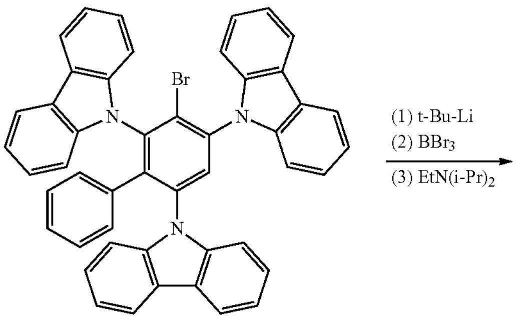

A-51-1

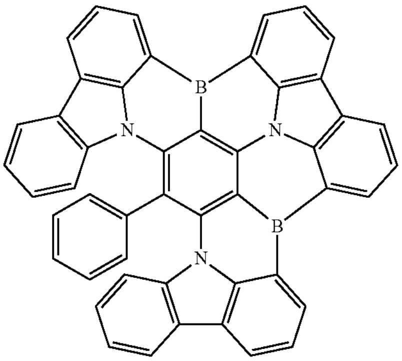

A-51

This example was basically the same as Synthesis Example 1, except that: in this example, A-9-1 was replaced with A-51-1 in equal amount of substance. The target compound A-51 (0.92 g, yield: 10%, HPLC analytical purity: 99.55%) was a yellow solid. MALDI-TOF-MS results: molecular ion peak: 665.62; elemental analysis results: theoretical value: C, 86.65%; H, 3.79%; B, 3.25%; N, 6.32%; experimental value: C, 86.85%; H, 3.59%; B, 3.05%; N, 6.52%.

Synthesis Example 4

Synthesis of Compound A-63

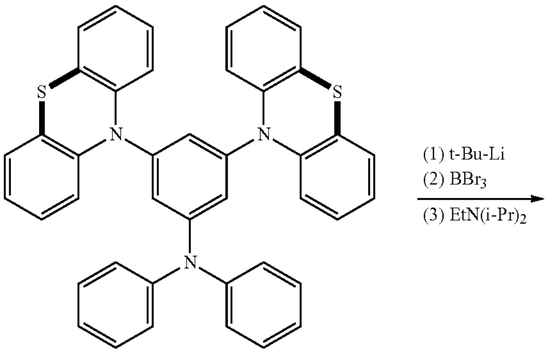

A-63-1

-continued

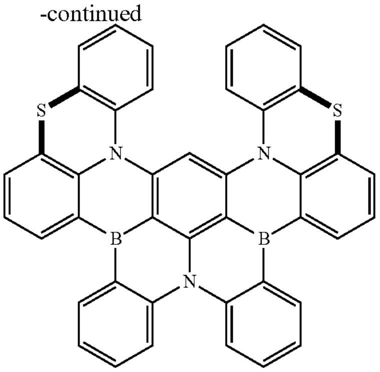

A-63

This example was basically the same as Synthesis Example 1, except that: in this example, A-9-1 was replaced with A-63-1 in equal amount of substance. The target compound A-63 (0.90 g, yield: 10%, HPLC analytical purity: 99.55%) was a yellow solid. MALDI-TOF-MS results: molecular ion peak: 655.48; elemental analysis results: theoretical value: C, 76.97%; H, 3.54%; B, 3.30%; N, 6.41%; S, 9.78%; experimental value: C, 76.77%; H, 3.74%; B, 3.50%; N, 6.31%; S, 9.68%.

Synthesis Example 5: Synthesis of Compound A-91

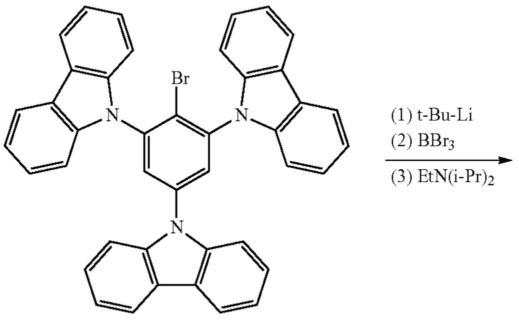

A-91-1

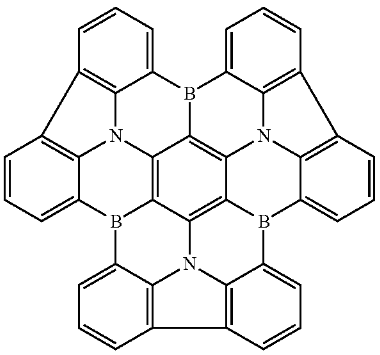

A-91

Under nitrogen atmosphere, the solution of tert-butyl lithium in pentane (31.03 mL, 1.60M, 49.64 mmol) was slowly added to 0° C. solution of A-91-1 (9.0 g, 13.79 mmol) in tert-butyl benzene (150 mL), and then sequentially heated to 80° C., 100° C., and 120° C. and reacted for 1 hour, respectively. After the reaction, the temperature was lowered to −30° C., boron tribromide (12.43 g, 49.64 mmol) was slowly added, and stirring was continued for 0.5 h at room temperature. N,N-diisopropylethylamine (8.99 g, 41.37 mmol) was added at room temperature to continue the reaction at 145° C. for 5 h before stopping. The target compound A-91 as a yellow solid (0.60 g, yield: 7.3%, HPLC analytical purity: 99.56%), was obtained by vacuum spin-drying of the solvent and passing through a silica gel column (a developing solvent:ethyl acetate:petroleum ether=50:1). MALDI-TOF-MS results: molecular ion peak: 597.68; elemental analysis results: theoretical value: C: 84.49%; H: 3.04%; B: 5.43%; N: 7.04%; experimental value: C: 84.64%; H: 3.35%; B: 4.83%; N: 7.18%.

Synthesis Example 6: Synthesis of Compound A-78

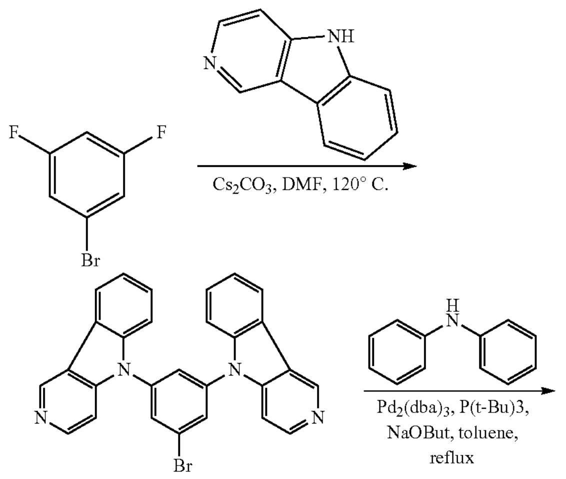

A-78-1

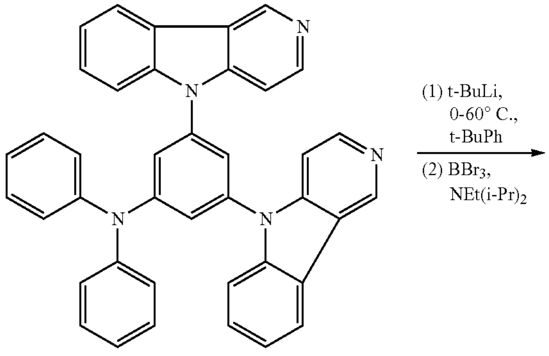

A-78-2

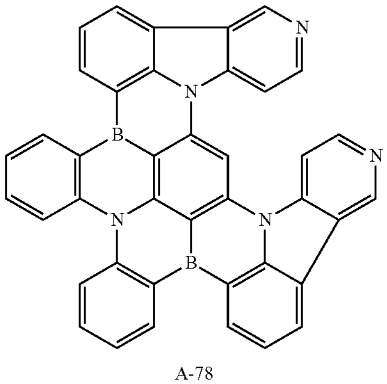

A-78

(1) Preparation of Intermediate A-78-1

At room temperature, γ-carboline (38.3 g, 227.9 mmol, 2.2 eq), 1-bromo-3,5-difluorobenzene (50.36 g, 103.60 mmol, 1 eq), and cesium carbonate (148.5 g, 455.8 mmol, 4.5 eq), and N, N-dimethyl formamide (600 mL) were added to a 1 L single-mouth flask, and performed reaction at 120° C. overnight under nitrogen protection.

After heating was stopped and the temperature was cooled to room temperature, 1000 mL of water was added and stirred for 10 min, to separate out a large amount of light white solid. 44.9 g of white solid, i.e. intermediate A-78-1 was obtained by suction filtration and column chromatography with PE:EA=30:1.

(2) Preparation of Intermediate A-78-2

At room temperature, the intermediate A-78-1 (24.4 g, 50 mmol, 1 eq), diphenylamine (9.3 g, 55 mmol, 1.1 eq), $Pd_2(dba)_3$ (2.54 g, 2.5 mmol, 0.05 eq), S-Phos (2.05 g, 5 mmol, 0.1 eq), sodium tert-butoxide (21.6 g, 225 mmol, 4.5 eq), and toluene (500 mL) were added to a 1000 mL single-mouth flask, which was vacuumized and filled with nitrogen for three times, and heated to 130° C. for reaction overnight.

The reaction solution was cooled to room temperature, mixed with celite for filtration. The filtrate was concentrated, then dissolved with dichloromethane, mixed with silica gel to concentrate, and treated by column chromatography (PE: EA=30:1) to obtain 29.6 g of white solid crude product. Ethanol was added to the crude product to boil and wash for 3 hours, to obtain 26.6 g of white solid product, namely intermediate A-78-2.

(3) Preparation of Compound A-78

In an ice bath, under the protection of nitrogen, the solution of n-butyl lithium in pentane (23 mL, 36.68 mmol, 1.6M) was added to the solution of intermediate A-78-2 (8.82 g, 15.3 mmol) in 4-tert-butyl toluene (200 mL) dropwise, After dripping, stirring was continued in an ice bath for 10 minutes, followed by shifting to an oil bath to react at 80° C. After 4 hours of reaction, the temperature was reduced to room temperature and cooled to below −40° C., boron tribromide (4.36 mL, 11.5 g, 46 mmol) was quickly introduced to the system via a needle, and underwent a reaction for 1 h after the room temperature was returned. N,N-diisopropylethylamine (10.76 mL, 7.9 g, 61.2 mol) was introduced via a syringe to the system, which is then moved to an oil bath to react at 130° C. for 5 hours. After the room temperature reached, a Buchner funnel loaded with celite was used for suction filtration to give a filtrate, and the filtrate was concentrated under reduced pressure, then dissolved with dichloromethane, and mixed with silica gel to concentrate for column chromatography.

Through column chromatography (PE/DCM=25:1), 5.9 g of yellow solid crude product was obtained. 50 mL of n-hexane was added to cook and wash the crude product for 5 h to give 4.8 g of yellow solid. TLC (PE/EA=50:1) passed through the column for several times to give approximately 1.6 g of pure product, namely compound A-78, with a purity of 99.8%.

Structure Characterization

Theoretical value of molecular weight of mass spectrometry: 593.26, and the detected value of molecular weight: 593.21.

Theoretical value of elemental analysis: C, 80.98%; H, 3.57%; N, 11.81%, the detected value of elemental analysis: C, 80.85%; H, 3.91%; N, 12.10%.

The organic light emitting device of the present application will be further explained by specific examples below.

Examples 1-26

Each of Examples 1-26 provide an organic light emitting device, the device structure of which in turn includes an ITO anode, a hole injection layer (HIL), a hole transport layer (HTL), a light emitting layer (EML), an electron transport layer (ETL), an electron injection layer (EIL) and a cathode.

Where the material for the hole injection layer is HI-3, and its total thickness is generally in the range of 1-10 nm, and is 2 nm in this example. The material of the hole transport layer is HT-28, and its total thickness is generally in the range of 5-50 nm, and is 30 nm in this example. The host material of the light-emitting layer is a triplet-triplet annihilation material, the dye is a boron-nitrogen material represented by Formula 1, and the thickness of the light-emitting layer is generally in the range of 1-60 nm, and is 20 nm in this example. The material of the electron transport layer is ET-52, and its thickness is generally in the range of 5-30 nm, and is 25 nm in this example. The material of the electron injection layer is LiQ (1 nm), and the material of the cathode is Al (150 nm).

In the organic light emitting devices provided in Examples 1-26, the specific selection of host materials and dyes and the doping concentration (mass proportion in the light-emitting layer) are shown in Table 1.

Comparative Examples 1-5

Comparative Examples 1-5 provide an organic light emitting device, the device structure of which is the same as those of Example 1-26, and the parameters of the corresponding functional layers are basically the same as those of Example 1-26, the only difference is that the host material of the light-emitting layer, the material used by the dye, or the doping concentration is inconsistent. The selection of specific materials is shown in Table 1.

A-151

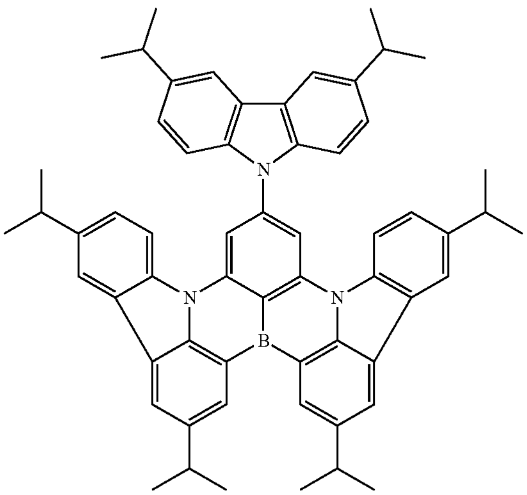

-continued

A-152

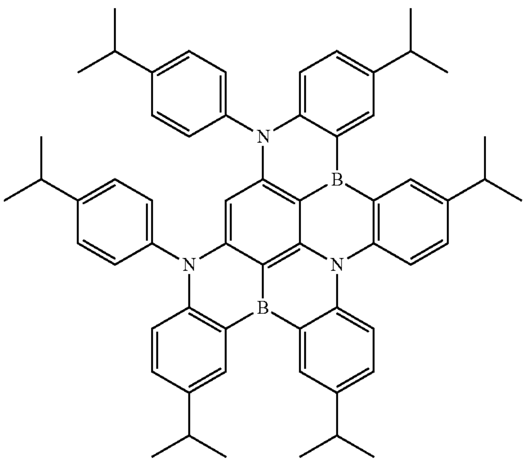

A-153

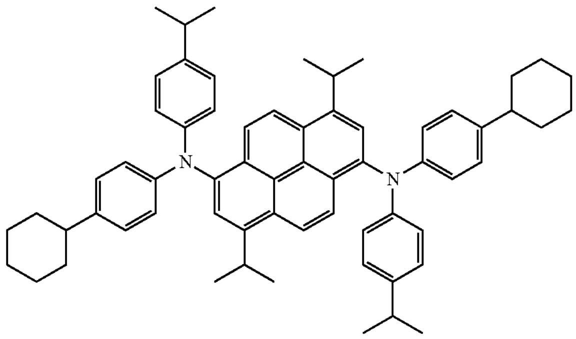

The following tests were performed on the devices in the examples and comparative examples, and the test results are shown in Table 1.

The organic light emitting devices prepared by the above process (Examples 1-26, Comparative examples 1-5) were tested for the following performance measurements: current, voltage, brightness, luminescence spectrum, current efficiency, external quantum efficiency and other characteristics of the device prepared were tested synchronously with PR 655 spectral scanning luminance meter and Keithley K 2400 digital source meter system.

TABLE 1

| | Host material | Dye and doping concentration | Half-peak width (nm) | External quantum efficiency @ 1000 nit |
|---|---|---|---|---|
| Example 1 | H2 | A7, 1% | 21 nm | 11.9% |
| Example 2 | H2 | A9, 1% | 22.3 nm | 13.9% |
| Example 3 | H2 | A17, 1% | 24.1 nm | 12.6% |
| Example 4 | H2 | A19, 1% | 22.2 nm | 13.6% |
| Example 5 | H2 | A27, 1% | 20.6 nm | 13.1% |
| Example 6 | H2 | A48, 1% | 22.8 nm | 12.2% |
| Example 7 | H2 | A51, 1% | 20.6 nm | 12.3% |
| Example 8 | H2 | A66, 1% | 22.6 nm | 11.9% |
| Example 9 | H2 | A67, 1% | 22.1 nm | 13.1% |
| Example 10 | H2 | A68, 1% | 22.9 nm | 12.4% |
| Example 11 | H2 | A88, 1% | 24.1 nm | 14.9% |
| Example 12 | H2 | A91, 1% | 23.2 nm | 15.2% |
| Example 13 | H2 | A118, 1% | 21.7 nm | 11.7% |
| Example 14 | H2 | A127, 1% | 23.6 nm | 12.6% |
| Example 15 | H2 | A137, 1% | 24.3 nm | 13.9% |
| Example 16 | H2 | A141, 1% | 22.7 nm | 14.4% |

TABLE 1-continued

| | Host material | Dye and doping con-centration | Half-peak width (nm) | External quantum efficiency @ 1000 nit |
|---|---|---|---|---|
| Example 17 | H6 | A9, 1% | 22.1 nm | 11.9% |
| Example 18 | H17 | A9, 1% | 22.4 nm | 11.7% |
| Example 19 | H34 | A9, 1% | 22.2 nm | 12.1% |
| Example 20 | H50 | A9, 1% | 22.7 nm | 12.9% |
| Example 21 | H2 | A9, 0.1% | 24 nm | 9.7% |
| Example 22 | H2 | A9, 0.5% | 22.5 nm | 10.9% |
| Example 23 | H2 | A9, 3% | 22.3 nm | 13.3% |
| Example 24 | H2 | A9, 5% | 22.9 nm | 12.7% |
| Example 25 | H2 | A9, 10% | 24.2 nm | 11.8% |
| Example 26 | H2 | A9, 35% | 26.2 nm | 10.6% |
| Comparative example 1 | H2 | A151, 1% | 30.4 nm | 11.4% |
| Comparative example 2 | H2 | A152, 1% | 24.1 nm | 9.9% |
| Comparative example 3 | H17 | A151, 1% | 31.2 nm | 11.2% |
| Comparative example 4 | H17 | A152, 1% | 24.4 nm | 10.2% |
| Comparative example 5 | H2 | A153, 1% | 33 nm | 8.6% |

According to Table 1, it can be seen that:

1. Compared with the comparative examples, when the compound represented by Formula 1 is used as the dye in the light-emitting layer, the half-peak width of the organic light emitting device is narrower and thus exhibits better color purity, while the light-emitting efficiency is significantly improved, and the overall properties are significantly better than the comparative example.
2. According to the comparison of Examples 2 and 21-26, it can be seen that when the dye in the light-emitting layer in the present application has a proportion in the range of 0.1 wt %-20 wt %, the device performance is relatively superior in terms of lifetime, half-peak width and light-emitting efficiency; and when the dye in the light-emitting layer has a proportion in the range of 0.5 wt %-5 wt %, the device performance is more superior in terms of lifetime, half-peak width, and light-emitting efficiency.

Finally, it should be noted that the above embodiments are only used to illustrate the technical solutions of the present application, not to limit it; although the present application has been described in detail with reference to the foregoing embodiments, those of ordinary skill in the art should understand that: the technical solutions described in the foregoing embodiments can still be modified, or some or all of the technical features can be equivalently replaced; and these modifications or replacements do not make the essence of the corresponding technical solutions deviate from the range of the technical solutions of the embodiments of the present application.

What is claimed is:

1. An organic light emitting device, comprising a light-emitting layer, wherein the light-emitting layer comprises a host material and a dye, the host material is a triplet-triplet annihilation material, and the dye is a boron-nitrogen material represented by Formula 1:

Formula 1

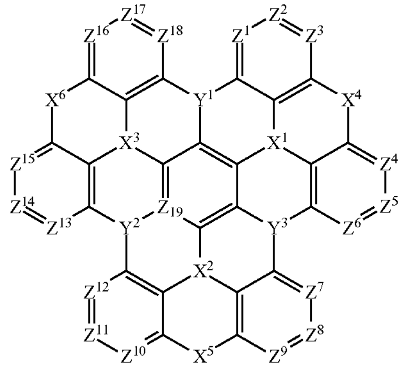

wherein, each of $Y^1$, $Y^2$, and $Y^3$ is B;

each of $X^1$, $X^2$, and $X^3$ is N;

each of $X^4$, $X^5$ and $X^6$ is independently selected from single bond, O, S or $CR_a$;

wherein $R_a$ is independently selected from one of the following groups: substituted or unsubstituted C1-C10 alkyl, substituted or unsubstituted C6-C30 monocyclic or polycyclic aromatic hydrocarbon, and C5-C30 monocyclic or polycyclic hetero-aromatic hydrocarbon;

each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$, wherein at least one of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is N, wherein $R_b$ is independently selected from one of hydrogen, deuterium, halogen, cyano, or one of the following groups: substituted or unsubstituted C1-C36 alkyl, substituted or unsubstituted C2-C6 alkenyl, substituted or unsubstituted C1-C6 alkoxy or thioalkoxy, substituted or unsubstituted C6-C48 monocyclic or polycyclic aromatic hydrocarbon, substituted or unsubstituted C3-C48 monocyclic or polycyclic heteroaromatic hydrocarbon, and two adjacent $R_b$ groups are independent to each other or at least two adjacent $R_b$ groups are bonded to each other to form C3-C10 cycloalkane, C6-C30 aromatic hydrocarbon or C5-C30 hetero-aromatic hydrocarbon;

$Z_{19}$ is C; and if substituents exist in the above group, each of the substituents is independently selected from one of deuterium, cyano, halogen, C1-C10 alkyl or cycloalkyl, C2-C6 alkenyl or cycloalkenyl, C1-C6 alkoxy or thioalkoxy, nitro, amine, carbonyl, carboxy, ester, C6-C30 aryl, and C3-C30 heteroaryl;

wherein a triplet energy level of the dye is higher than that of the triplet-triplet annihilation material;

wherein the dye has a mass proportion of 5%-20%, based on a total mass of the light-emitting layer.

2. The organic light emitting device according to claim 1, wherein the boron-nitrogen material has a structure represented by Formula 1-1, Formula 1-1

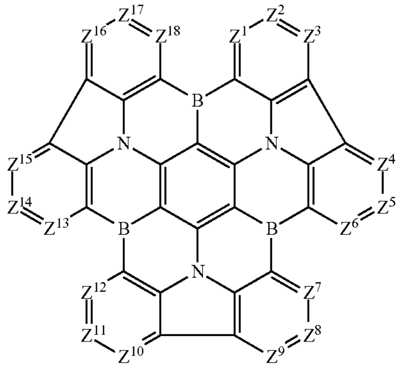

wherein, each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$.

3. The organic light emitting device according to claim 2, wherein in the Formula 1-1, $Y^1$, $Y^2$ and $Y^3$ are all selected as a B atom, and $X^1$, $X^2$ and $X^3$ are all selected as a N atom.

4. The organic light emitting device according to claim 1, wherein not more than six of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ are an N atom.

5. The organic light emitting device according to claim 1, wherein not more than three of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ are an N atom.

6. The organic light emitting device according to claim 2, wherein in Formula 1-1, at least one of $Z^2$, $Z^5$, $Z^8$, $Z^{11}$, $Z^{14}$, $Z^{17}$ is an N atom.

7. The organic light emitting device according to claim 6, wherein an N atom in an N heterocyclic ligand is disposed at γ position in a carbazole group.

8. The organic light emitting device according to claim 1, wherein the $R_b$ is independently selected from the group consisting of: hydrogen, deuterium, methyl, ethyl, n-propyl, isopropyl, n-butyl, isobutyl, sec-butyl, tert-butyl, 2-methylbutyl, n-pentyl, sec-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, methoxy, phenyl, naphthyl, anthryl, benzoanthryl, phenanthryl, benzophenanthryl, pyrenyl, cavity group, peryl, fluoranthenyl, tetracenyl, pentacenyl, benzopyrenyl, biphenyl, bisphenyl, terphenyl, triphenyl, quaterphenyl, fluorenyl, spirobifluorenyl, dihydrophenanthryl, dihydropyrenyl, tetrahydropyrenyl, cis or trans indenofluorenyl, trimetric indenyl, isotrimeric indenyl, spirotrimeric indenyl, spiroisotrimeric indenyl, furanyl, benzofuranyl, isobenzofuranyl, dibenzofuranyl, thienyl, methyl-substituted thienyl, benzothienyl, isobenzothienyl, dibenzothienyl, pyrrolyl, isoindolyl, carbazolyl, indenocarbazolyl, pyridyl, methyl-substituted pyridyl, quinolinyl, isoquinolinyl, acridinyl, phenanthridinyl, benzo-5,6-quinolinyl, benzo-6,7-quinolinyl, benzo-7,8-quinolinyl, pyrazolyl, indazolyl, imidazolyl, benzimidazolyl, naphthoimidazolyl, phenanthroimidazolyl, pyridoimidazolyl, pyrazinoimidazolyl, quinoxalinoimidazolyl, oxazolyl, benzoxazolyl, naphtho-oxazolyl, anthraoxazolyl, phenanthro-oxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthryl, 2,7-diazapyrenyl, 2,3-diazapyrenyl, 1,6-diazapyrenyl, 1,8-diazapyrenyl, 4,5-diazapyrenyl, 4,5,9,10-tetraazaperyl, pyrazinyl, phenazinyl, phenothiazinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, 9,9-dimethylacridinyl, (poly)halobenzene, (poly) cyanobenzene, (poly)trifluoromethylbenzene, or a combination of the above two substituent groups.

9. The organic light emitting device according to claim 1, wherein the boron-nitrogen material is selected from compounds represented by the following structures:

A-137

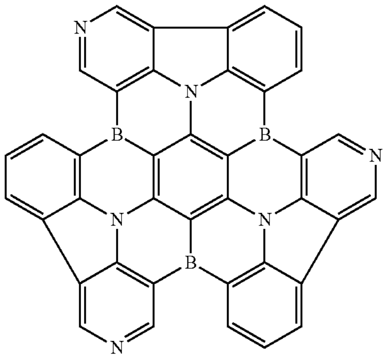

A-138

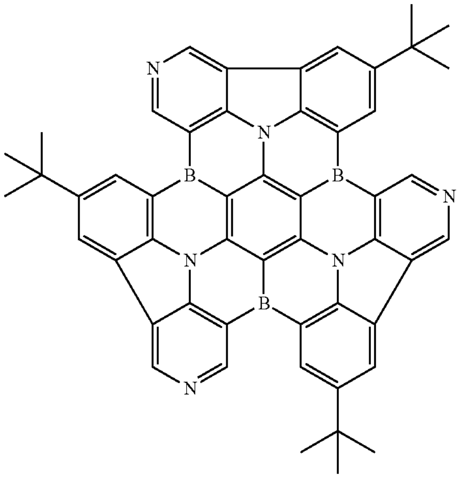

A-139

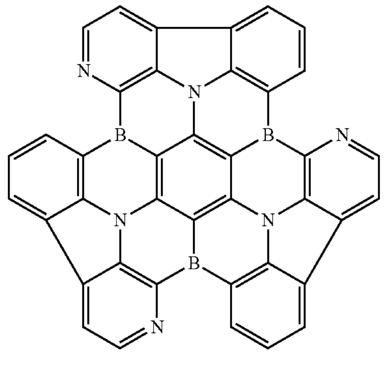

-continued
A-140
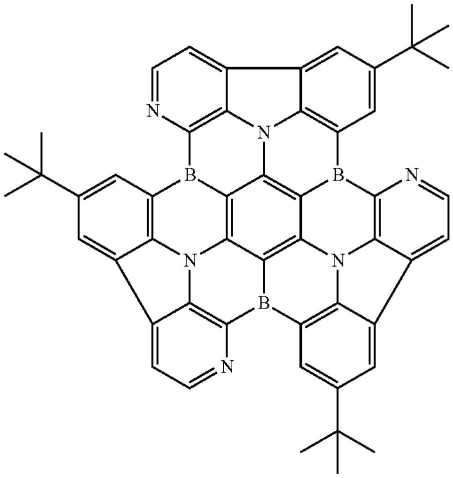
A-141
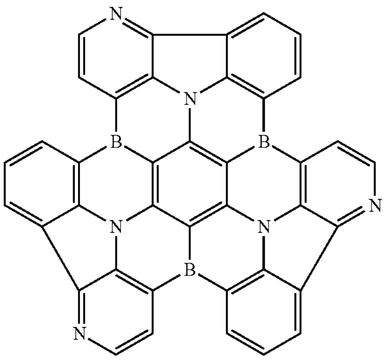
A-142
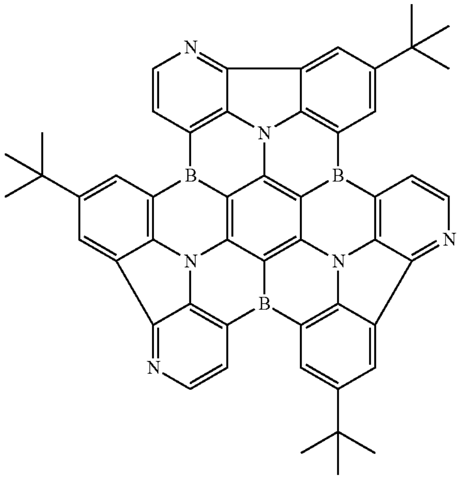
-continued
A-143
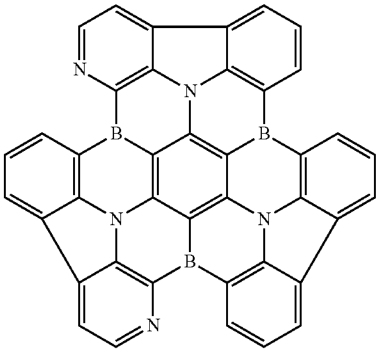
A-144
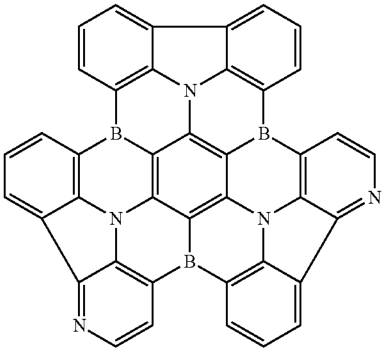
A-145
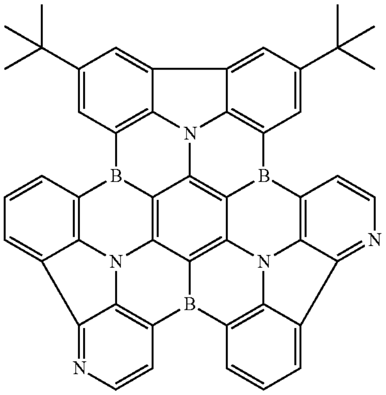
A-146
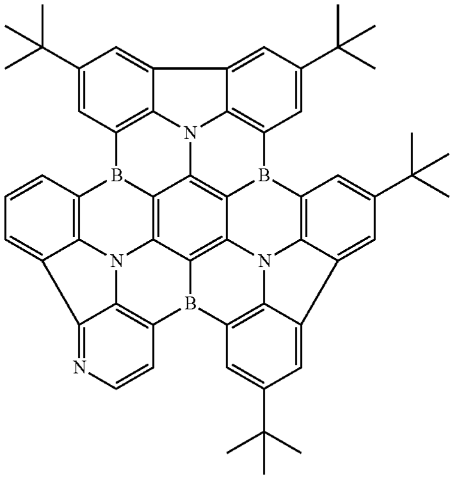

-continued

A-147

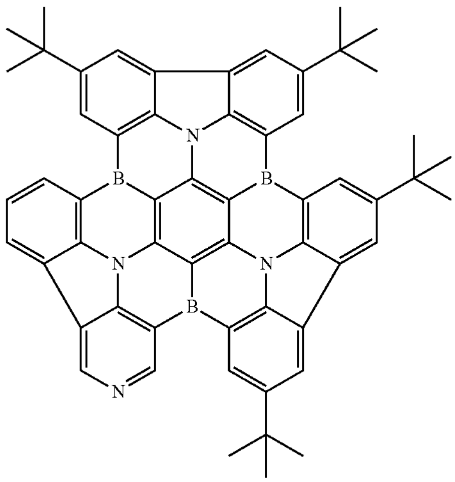

A-148

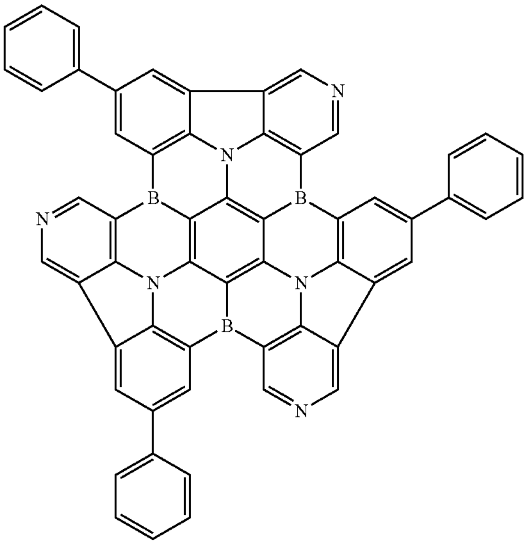

A-149

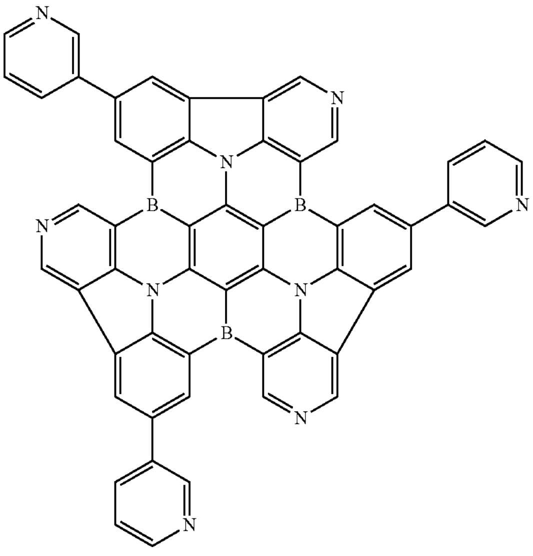

-continued

A-150

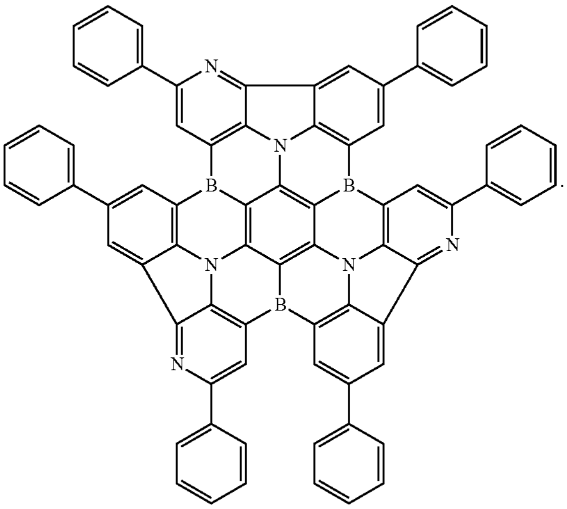

10. The organic light emitting device according to claim 1, wherein the singlet energy level of the triplet-triplet annihilation material is greater than that of the boron-nitrogen material, and the triplet energy level of the triplet-triplet annihilation material is less than that of the boron-nitrogen material.

11. The organic light emitting device according to claim 1, further comprising a hole transport region, the hole transport region is a multilayer structure comprising at least two layers of hole injection layer (HIL), a hole transport layer (HTL), and an electron blocking layer (EBL), wherein the material of the hole transport region is selected from a phthalocyanine derivative, a conductive polymer, a polymer containing a conductive dopant, and an aromatic amine derivative.

12. The organic light emitting device according to claim 11, wherein the material of the hole transport region is an aromatic amine derivative, which is one or more of HT-1 to HT-34 compounds,

HT-1

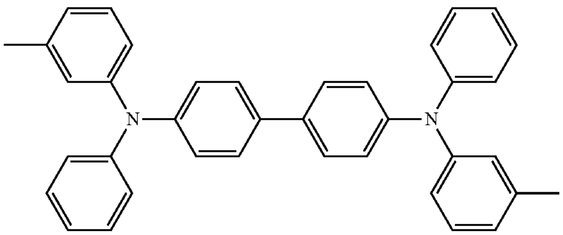

HT-2

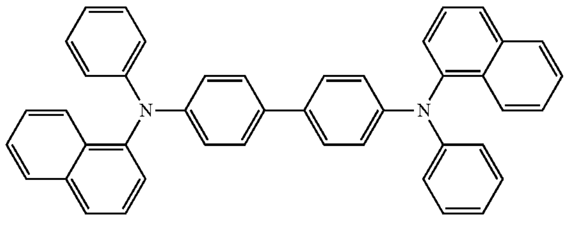

HT-3
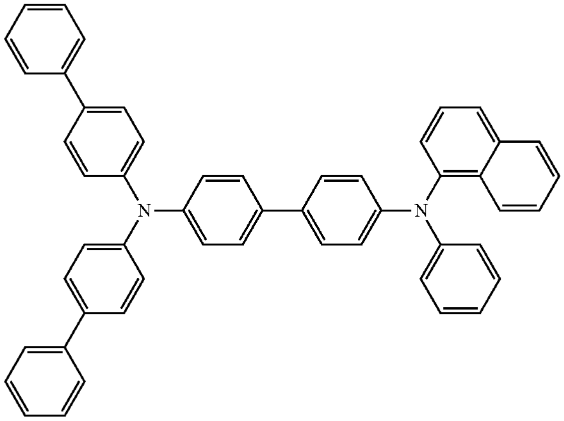
HT-4
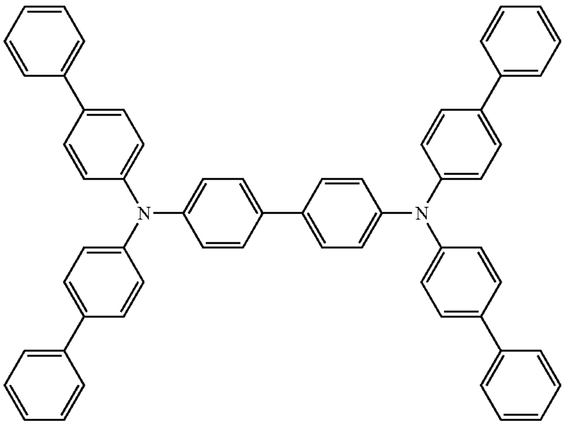
HT-5
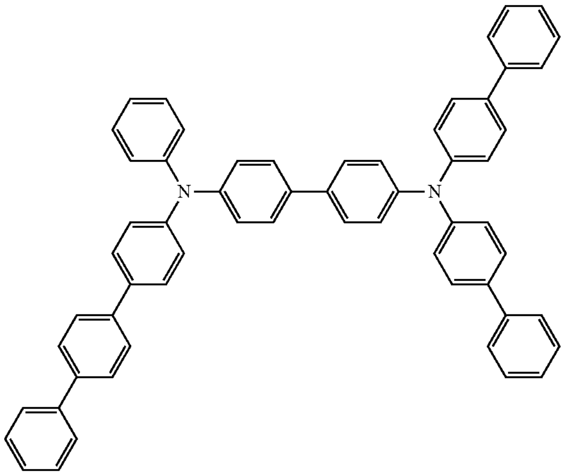
HT-6
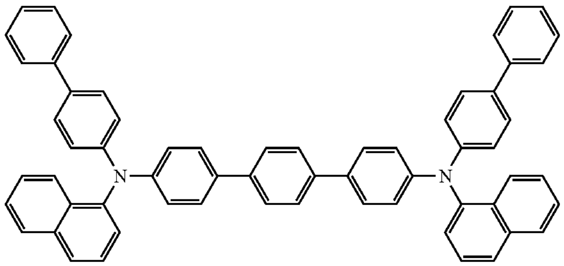
HT-7
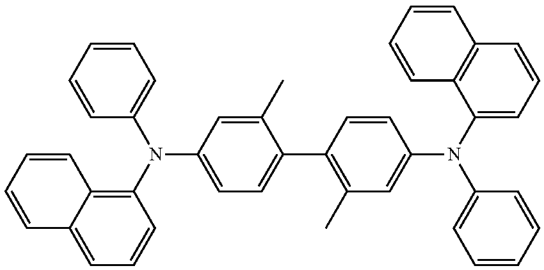
HT-8
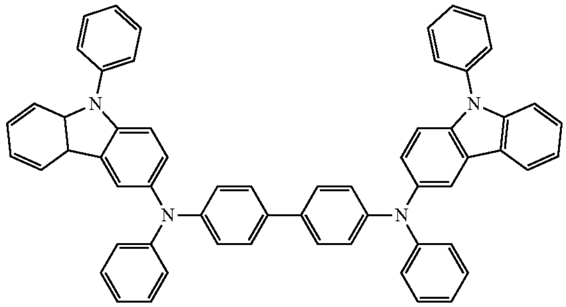
HT-9
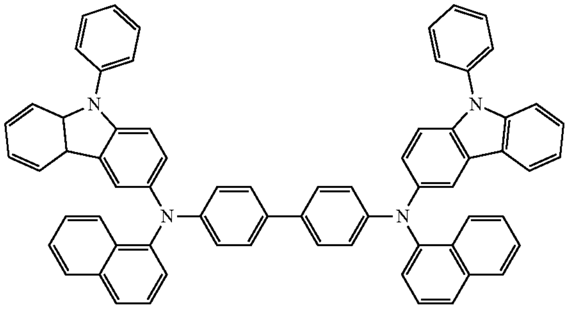
HT-10
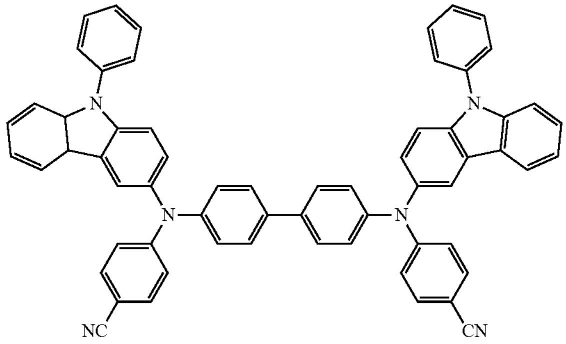

-continued
HT-11
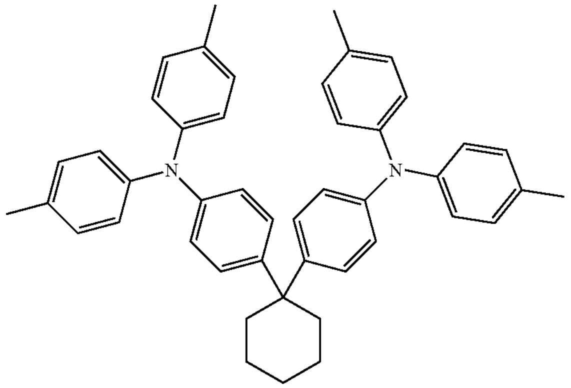
HT-12
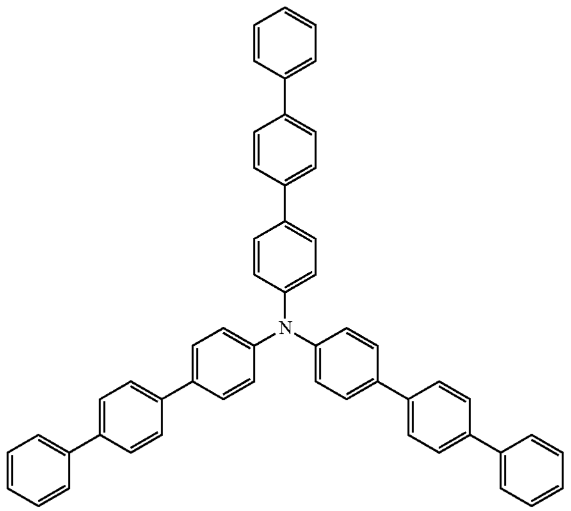
HT-13
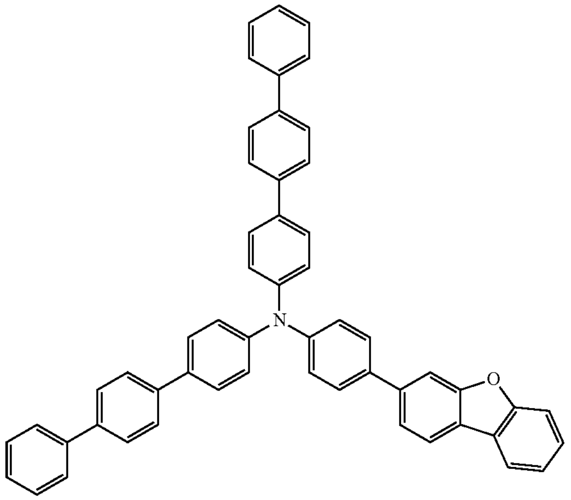
-continued
HT-14
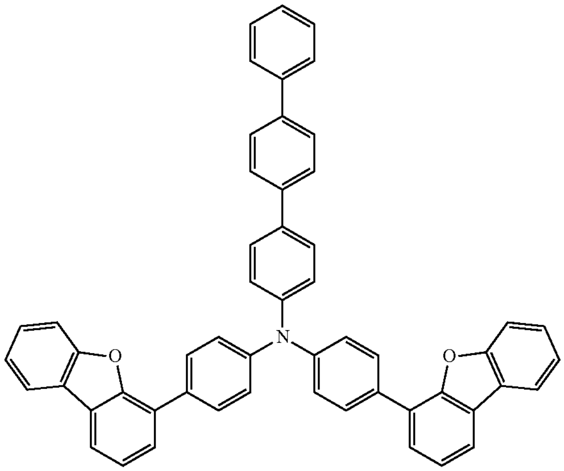
HT-15
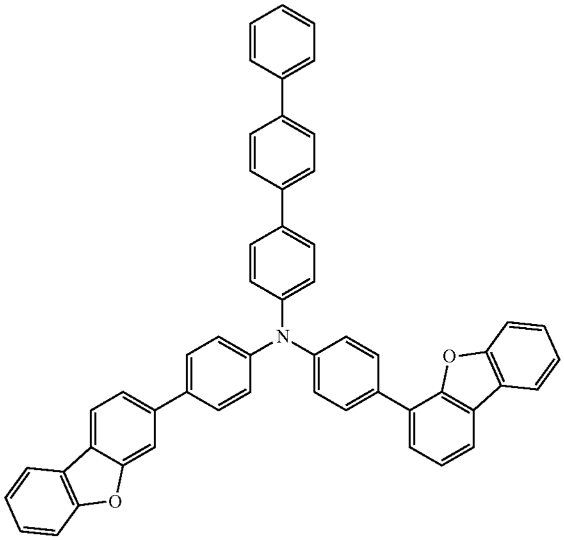
HT-16
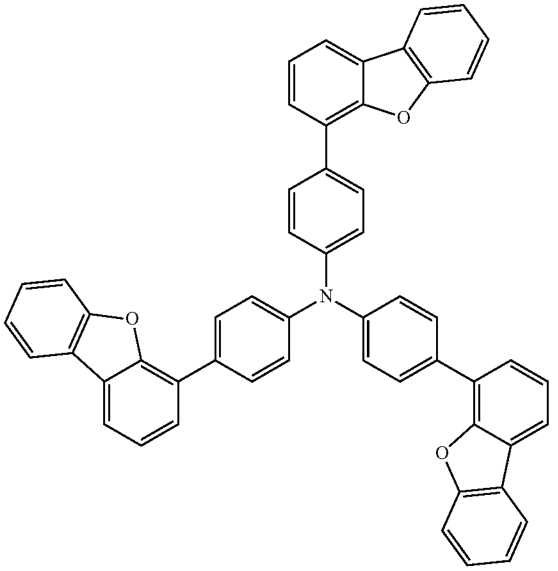

-continued
HT-17
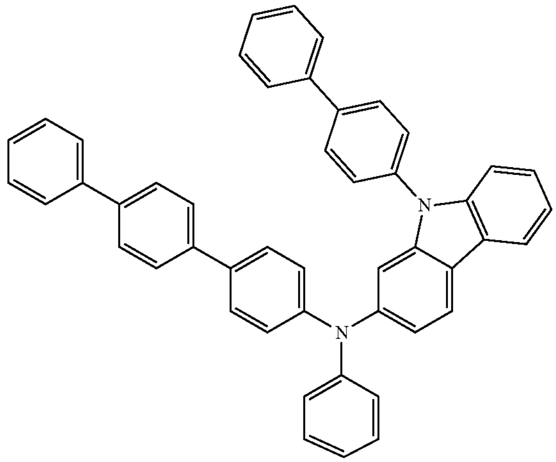
HT-18
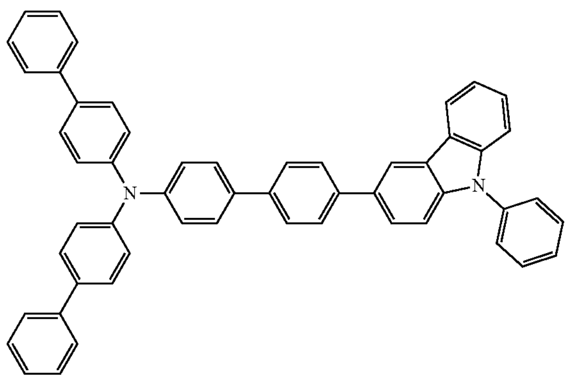
HT-19
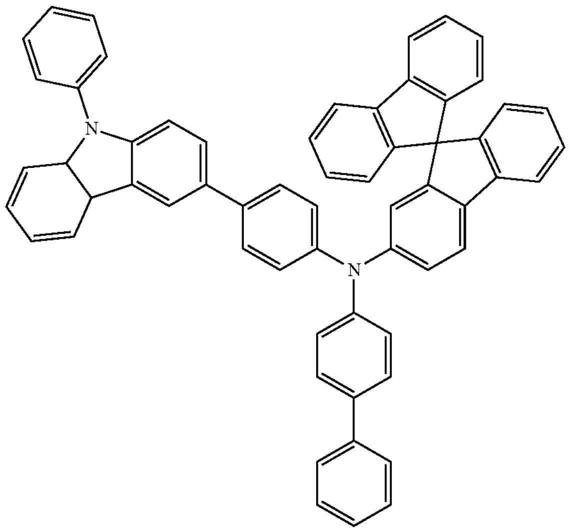
-continued
HT-20
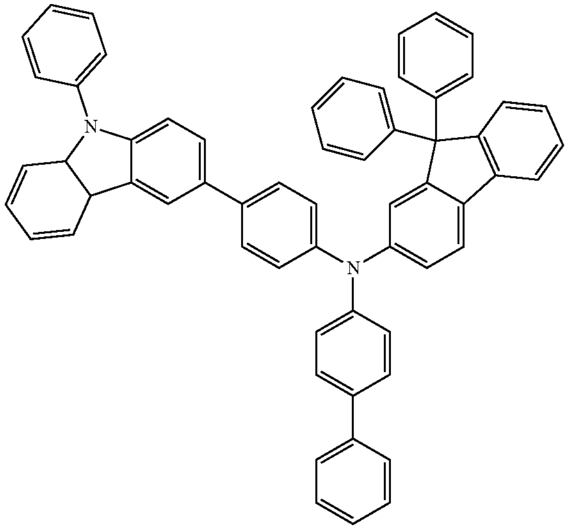
HT-21
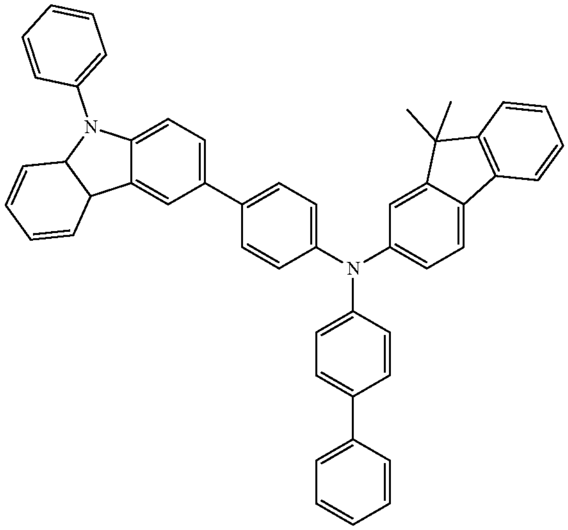
HT-22
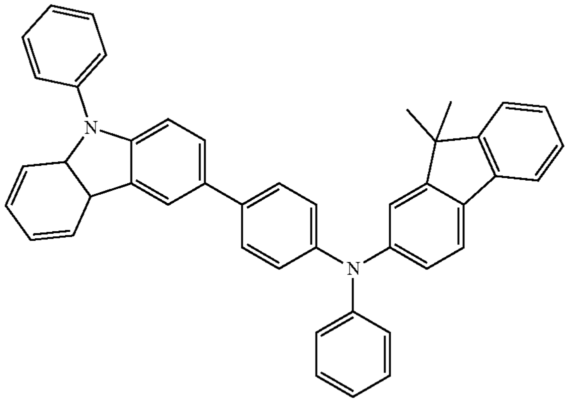

-continued
HT-23
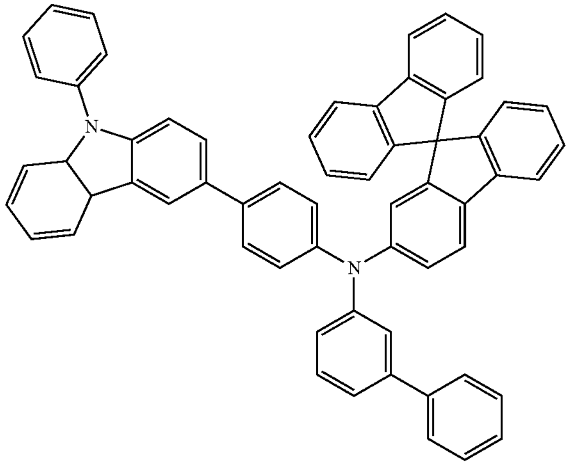
HT-24
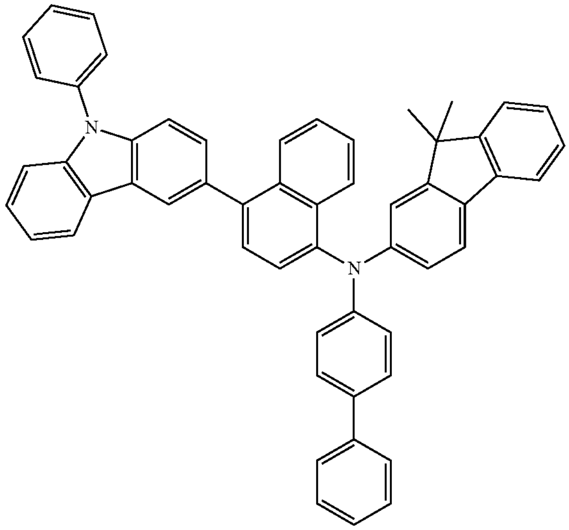
HT-25
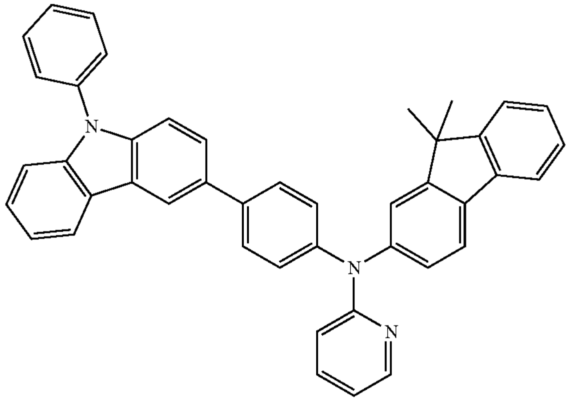
-continued
HT-26
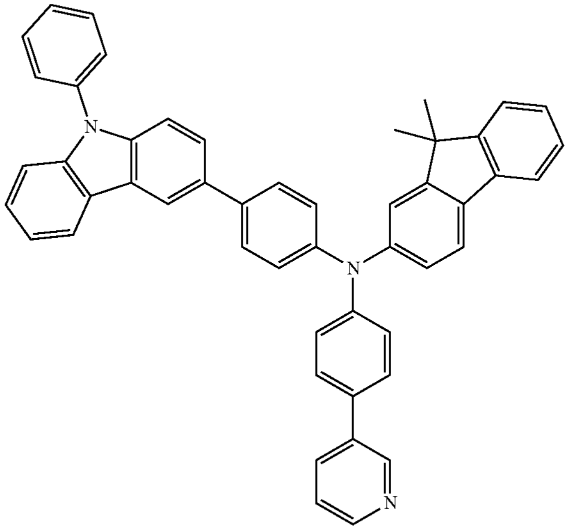
HT-27
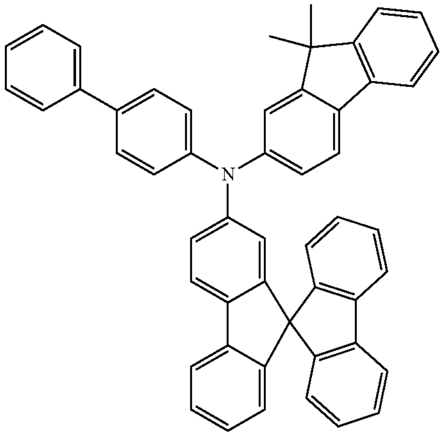
HT-28
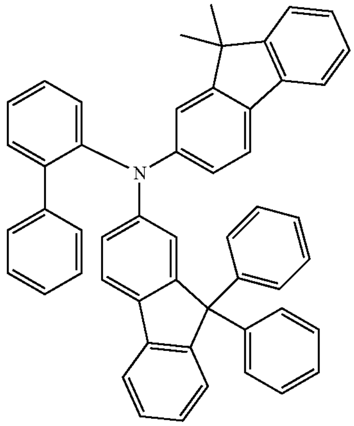

-continued

HT-29

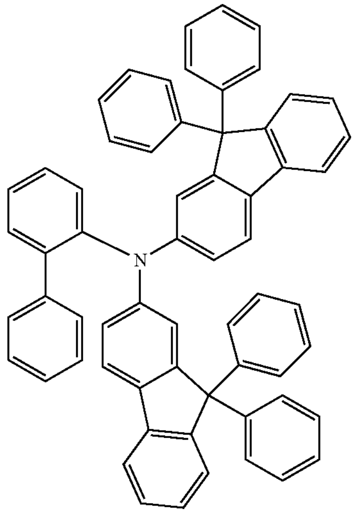

HT-30

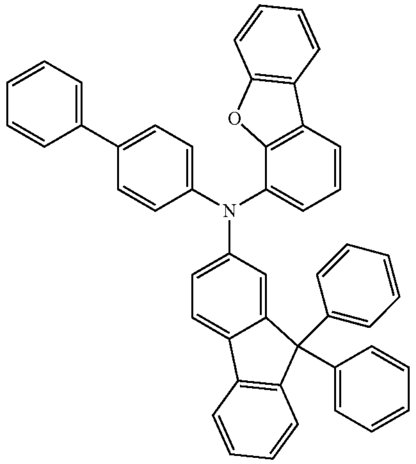

HT-31

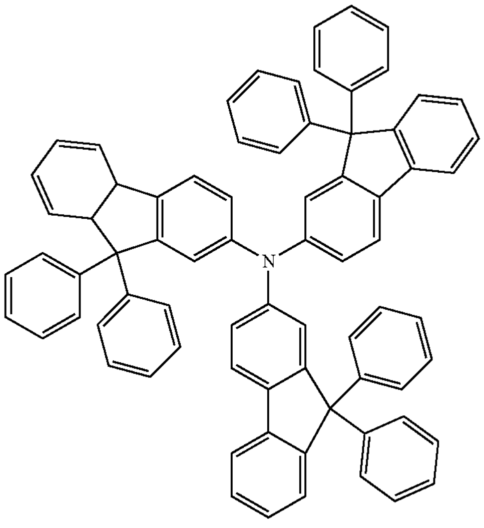

-continued

HT-32

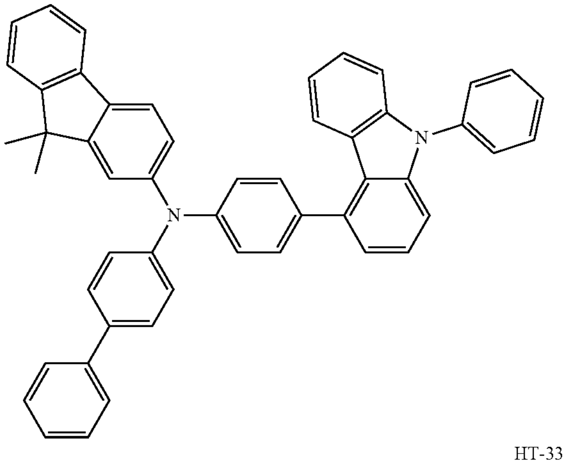

HT-33

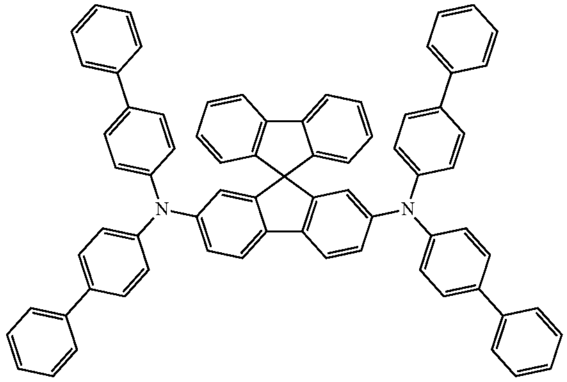

HT-34

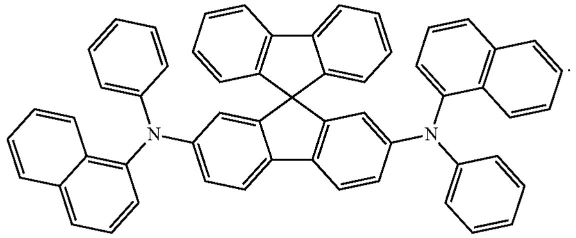

13. The organic light emitting device according to claim 11, wherein the phthalocyanine derivative comprises CuPc, and the conductive polymer or the polymer containing a conductive dopant comprises polyphenylene vinylene, polyaniline with dodecylbenzene sulfonic acid (Pani with DBSA), poly(3,4-ethylenedioxythiophene) with poly(4-styrene sulfonate) (PEDOT with PSS), polyaniline with camphorsulfonic acid (Pani with CSA), polyaniline with Poly (4-styrene sulfonate) (Pani with PSS).

14. The organic light emitting device according to claim 12, wherein the device contains a hole transport layer, wherein the hole injection layer is located between an anode and the hole transport layer, and the hole injection layer is a single compound material or the combination of multiple compounds.

15. The organic light emitting device according to claim 14, wherein the device contains a hole transport layer, wherein the hole injection layer uses one or more of the HT-1 to HT-34 compounds, or uses one of HI-1 to HI-3, or use one or more of the HT-1 to HT-34 compounds doped with one or more of the following HI-1 to HI-3 compounds,

HI-1

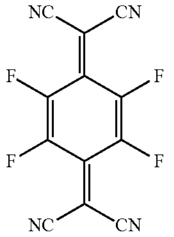

HI-2

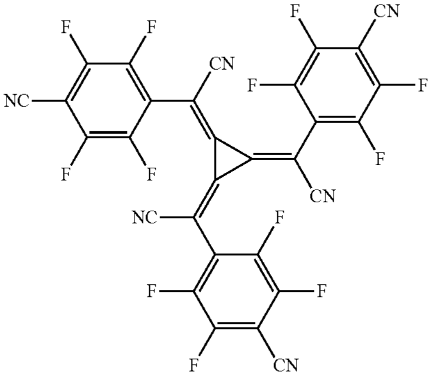

HI-3

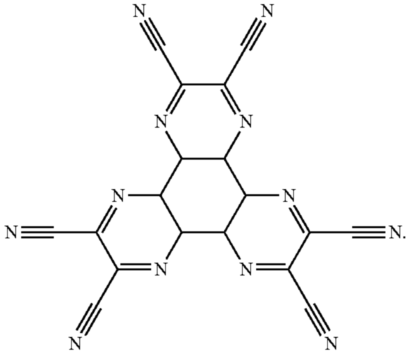

16. The organic light emitting device according to claim 1, further comprising an electron transport region, the electron transport region is a single-layered electron transport layer (ETL) which comprises a single-layer electron transport layer containing one compound and a single-layer electron transport layer containing multiple compounds, or the electron transport region is a multilayer structure comprising at least two layers of electron injection layer (EIL), the electron transport layer (ETL), and the hole blocking layer (HBL).

17. The organic light emitting device according to claim 16, wherein the device contains an electron transport layer, wherein the material of electron transport layer is selected from one or more of ET-1 to ET-57,

ET-1

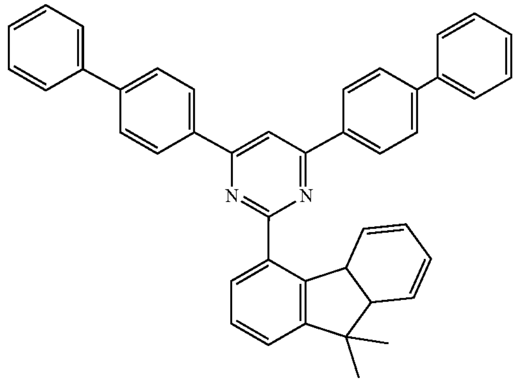

ET-2

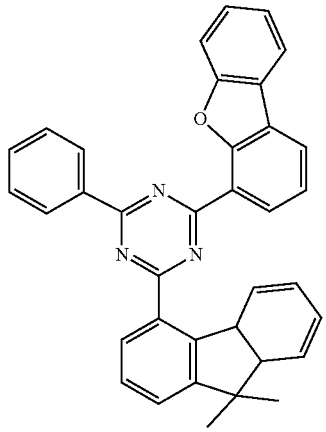

ET-3

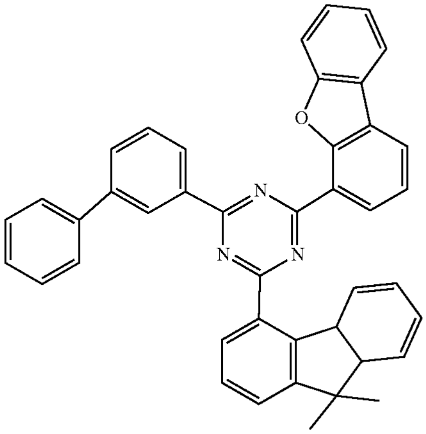

-continued
ET-4
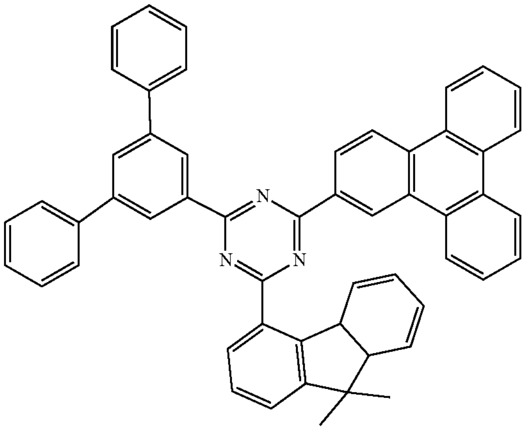
ET-5
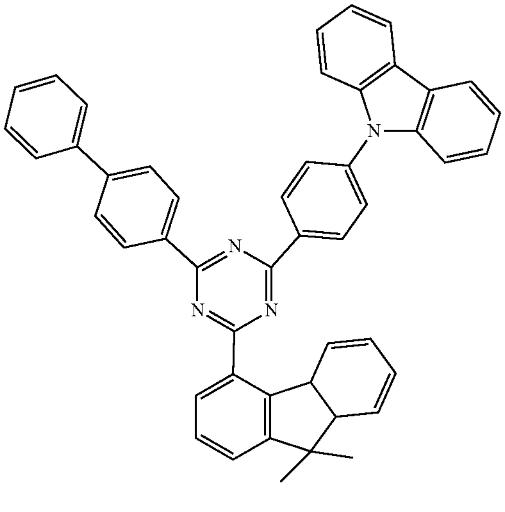
ET-6
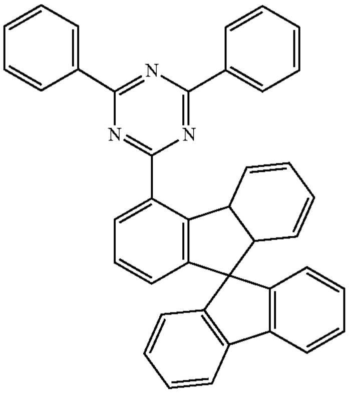
-continued
ET-7
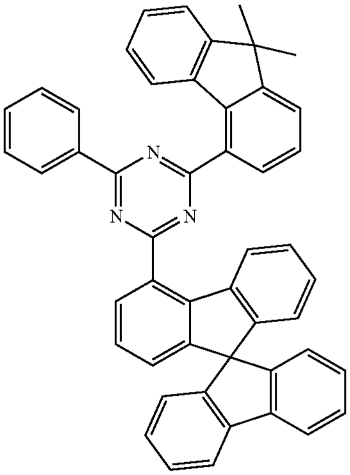
ET-8
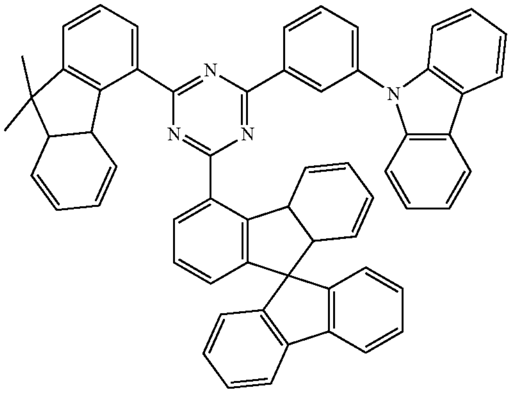
ET-9
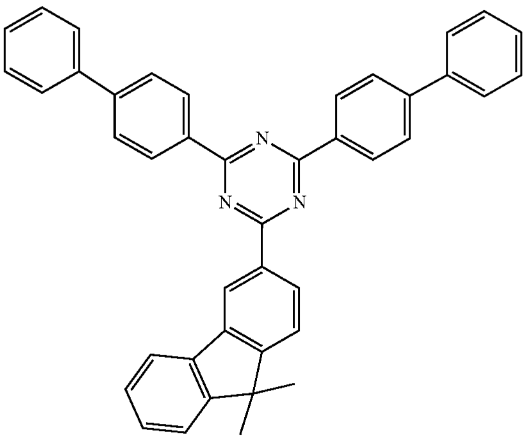

-continued
ET-10
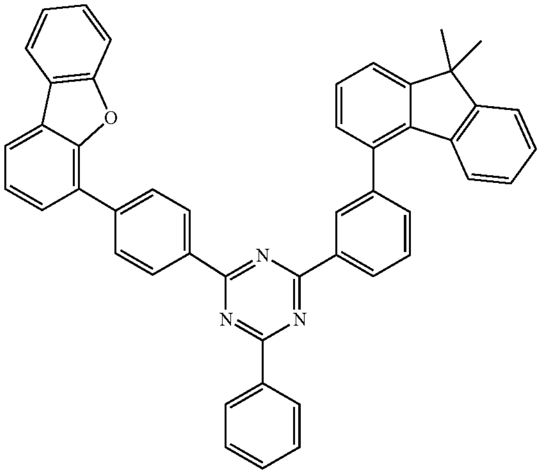
ET-11
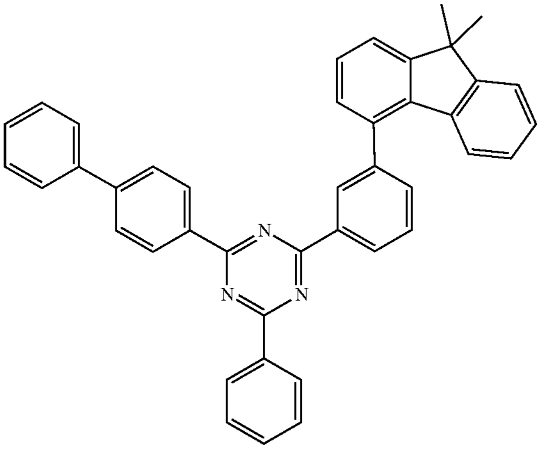
ET-12
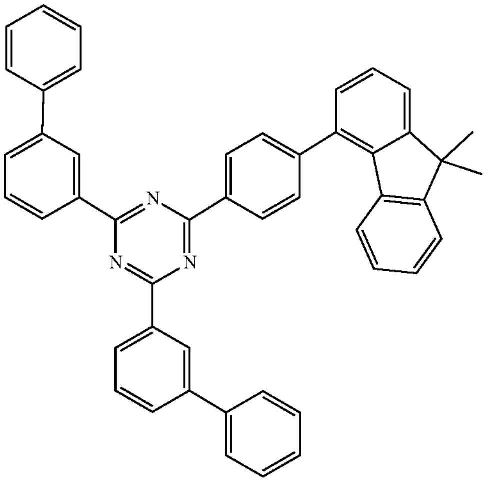
-continued
ET-13
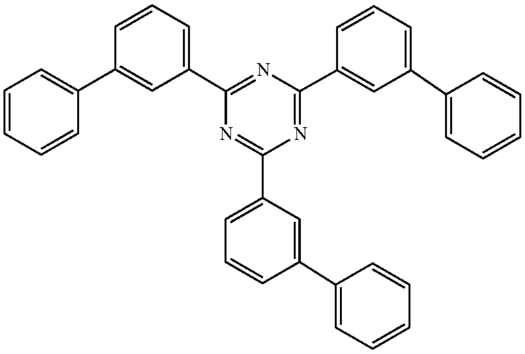
ET-14
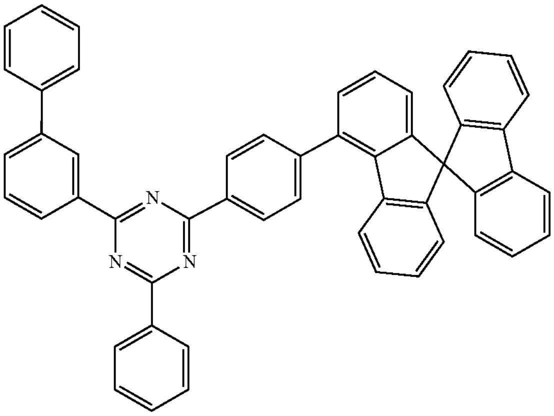
ET-15
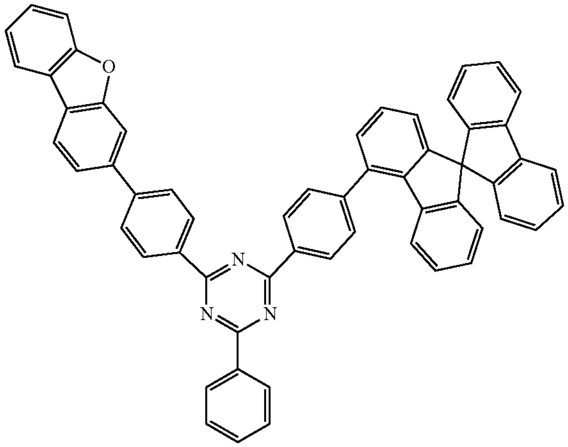

ET-16
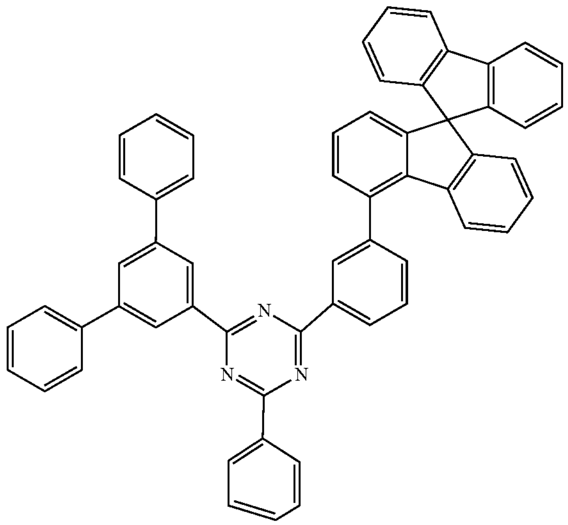
ET-17
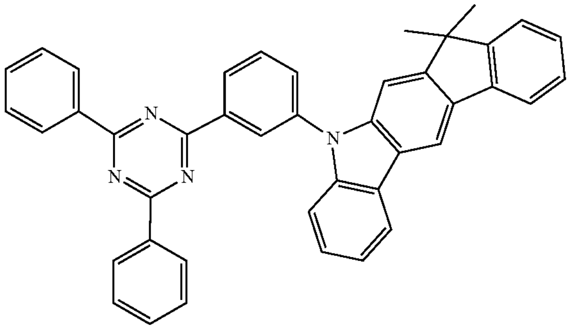
ET-18
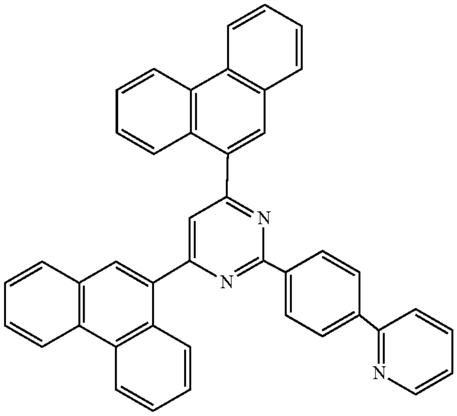
ET-19
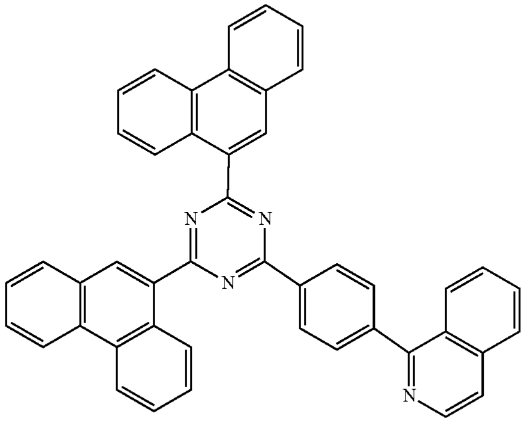
ET-20
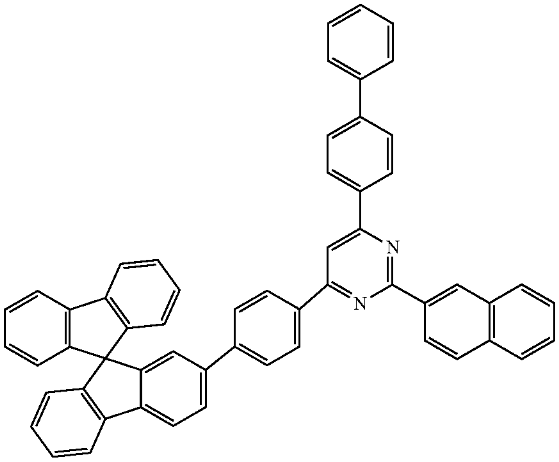
ET-21
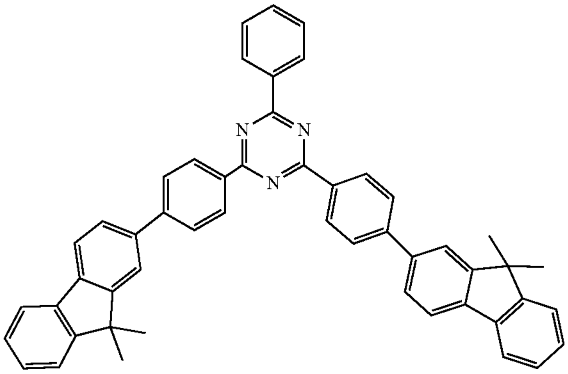

-continued
ET-22
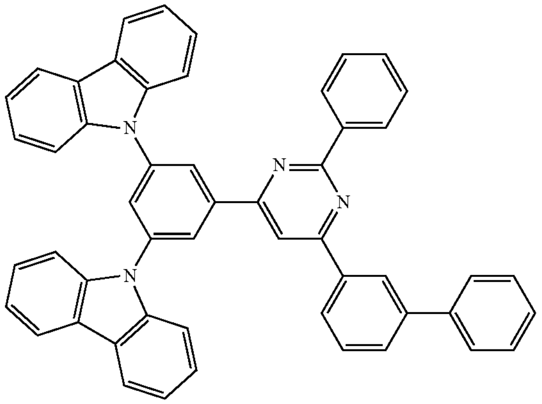
ET-23
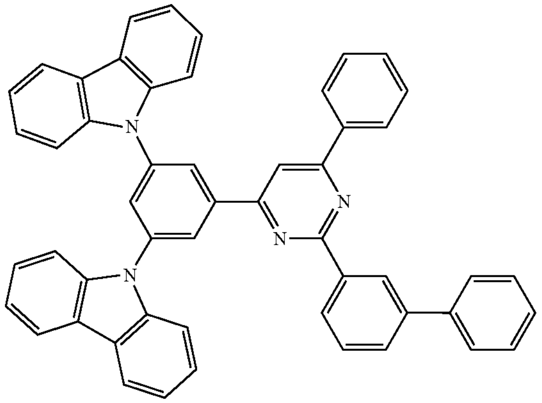
ET-24
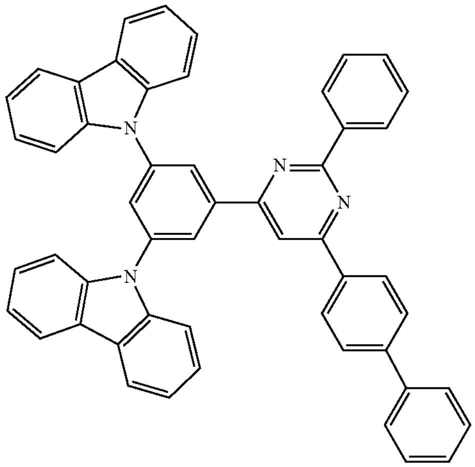
-continued
ET-25
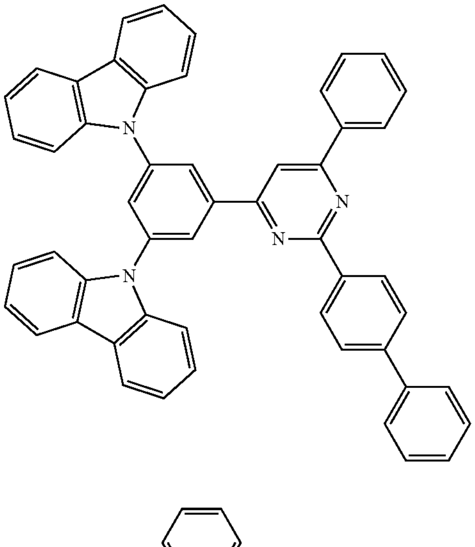
ET-26
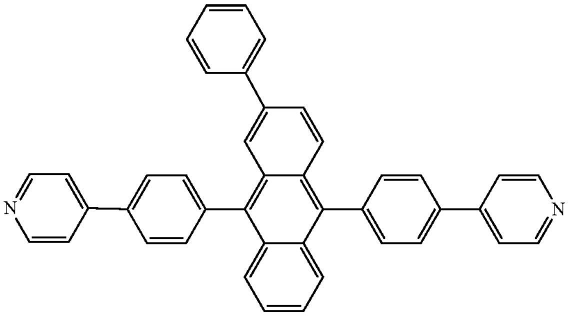
ET-27
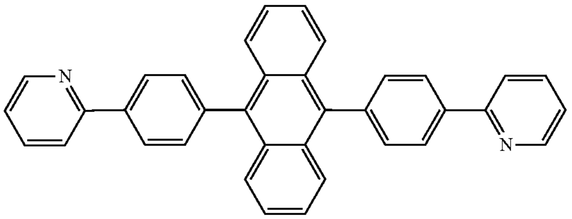
ET-28
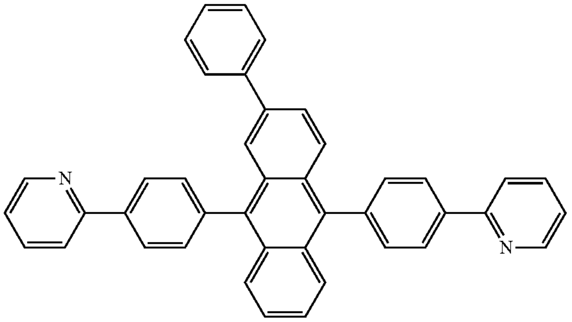

-continued
ET-29
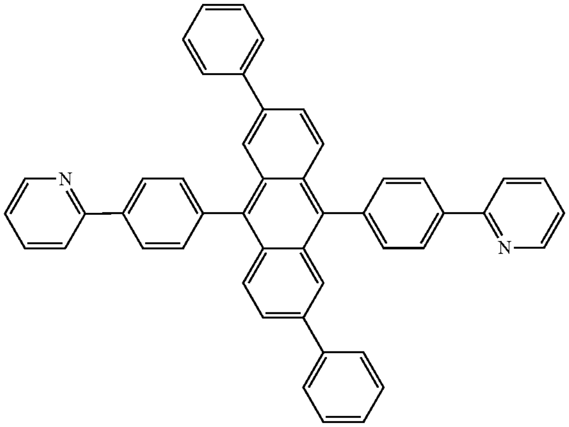
ET-30
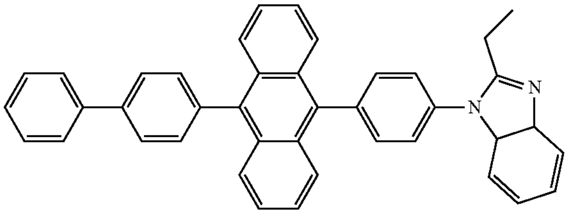
ET-31
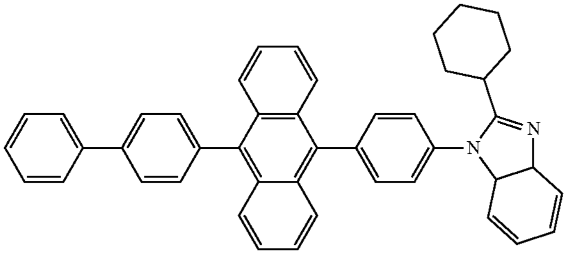
ET-32
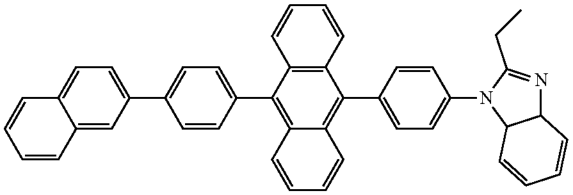
ET-33
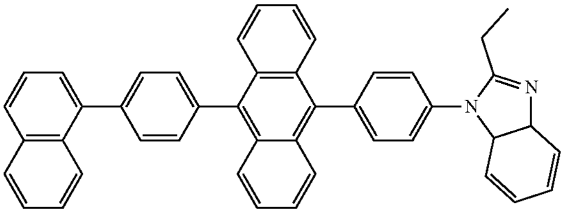
-continued
ET-34
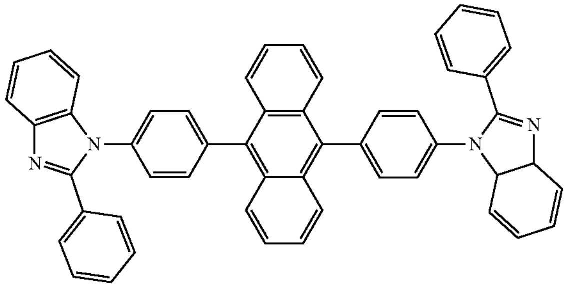
ET-35
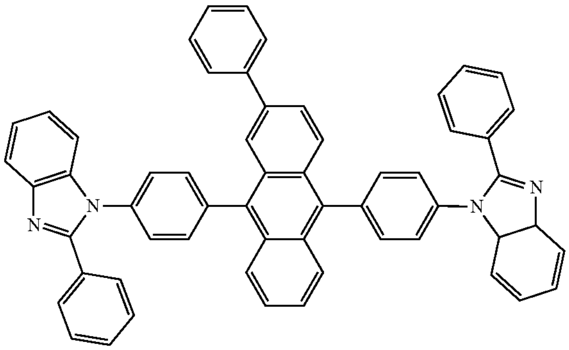
ET-36
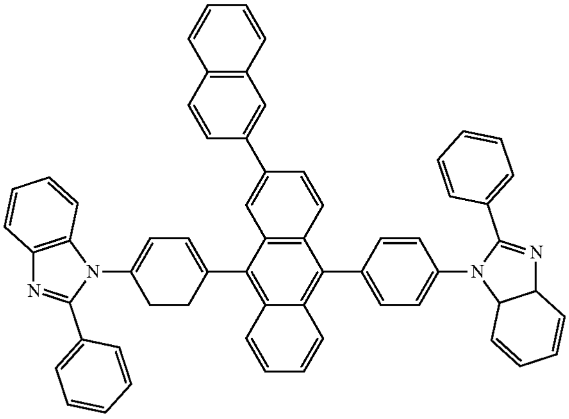
ET-37
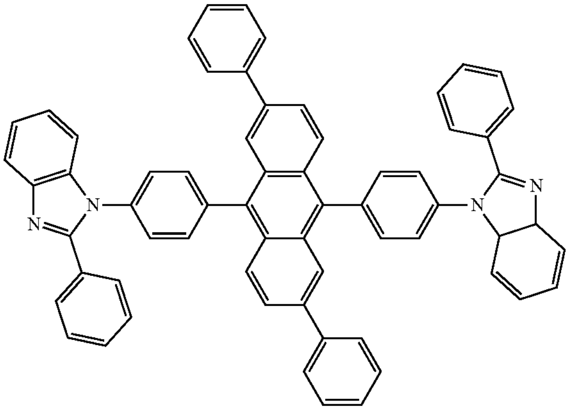

-continued
ET-38
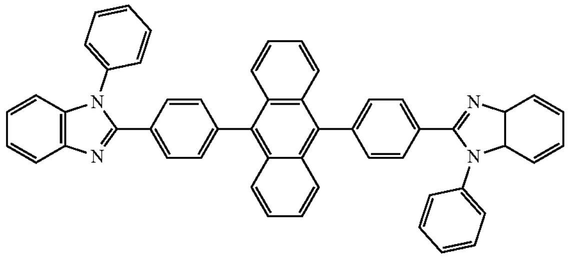
ET-39
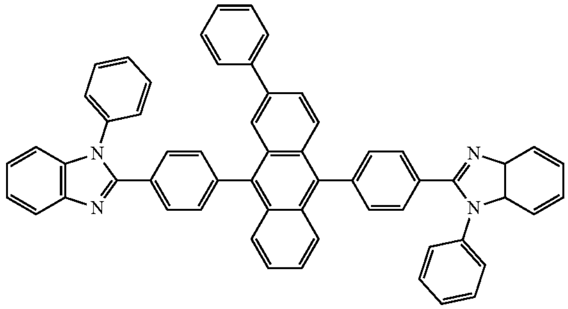
ET-40
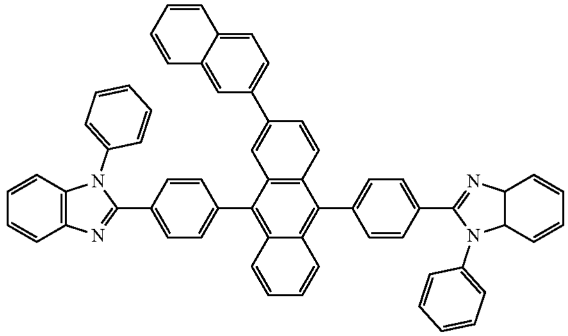
ET-41
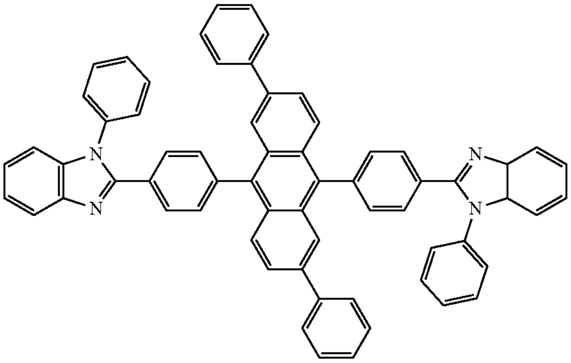
-continued
ET-42
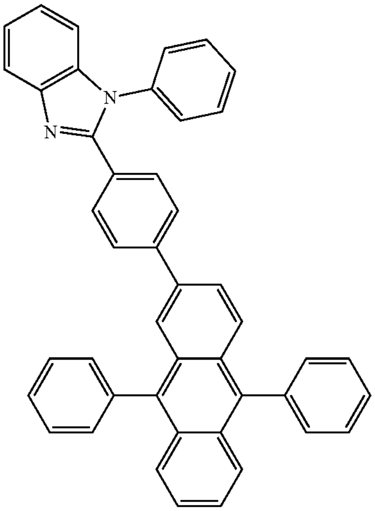
ET-43
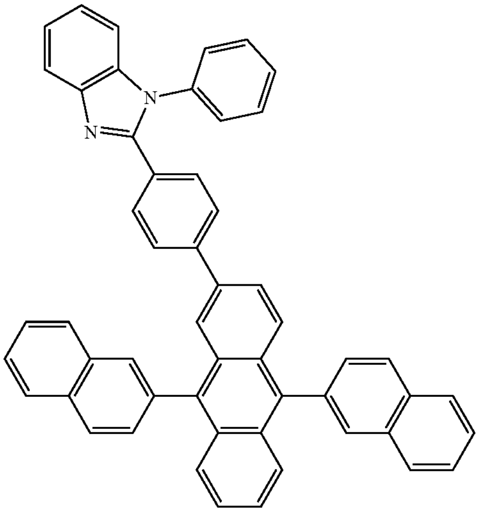
ET-44
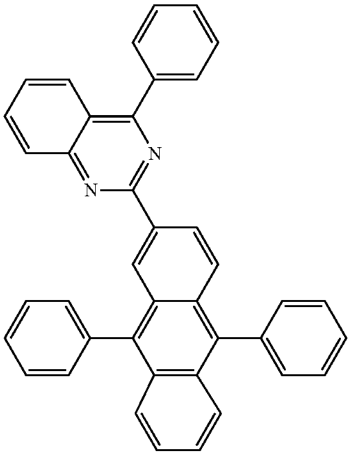

-continued
ET-45
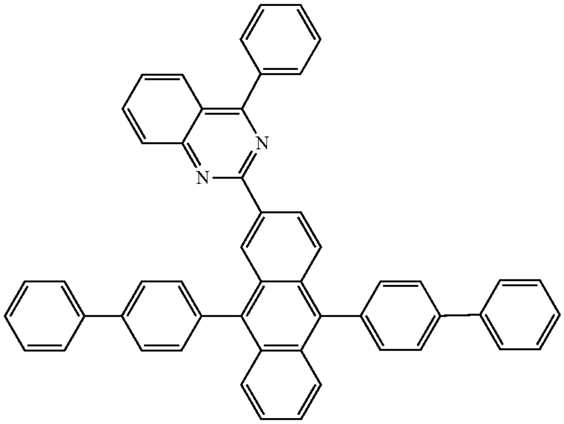
ET-46
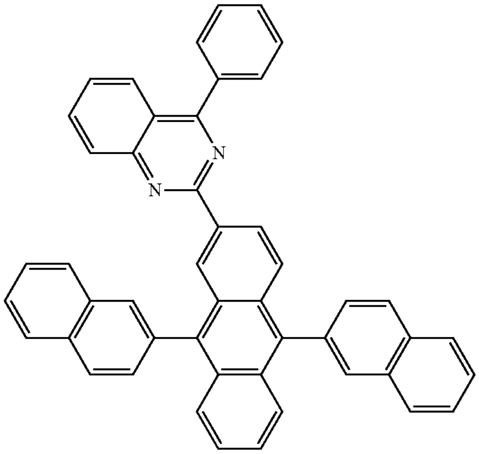
ET-47
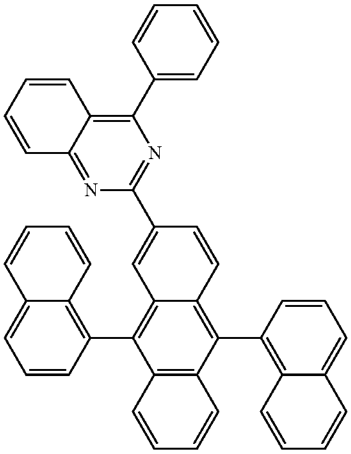
-continued
ET-48
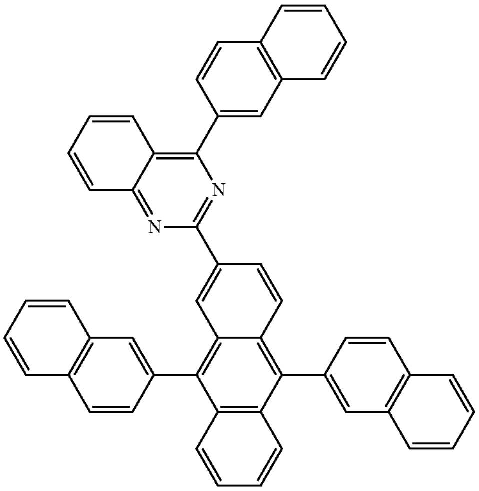
ET-49
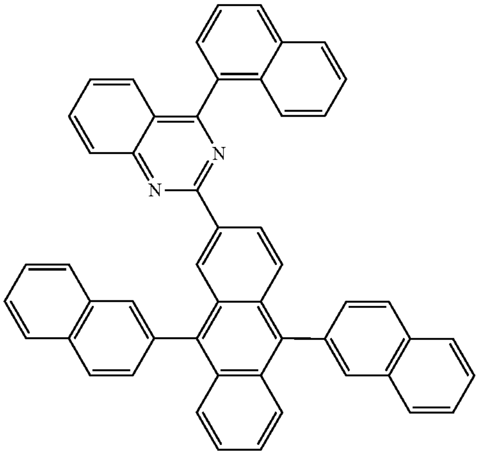
ET-50
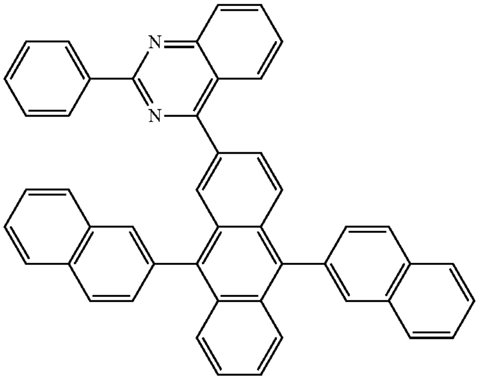

-continued
ET-51
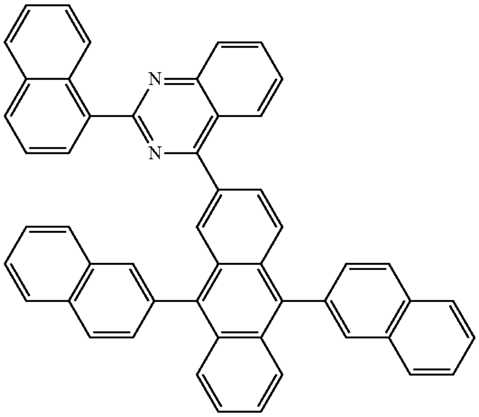
ET-52
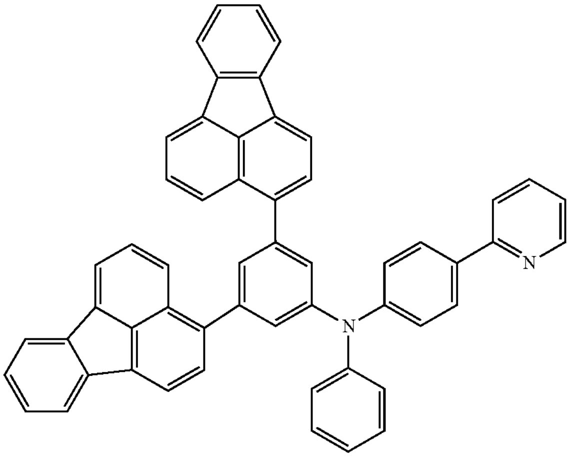
ET-53
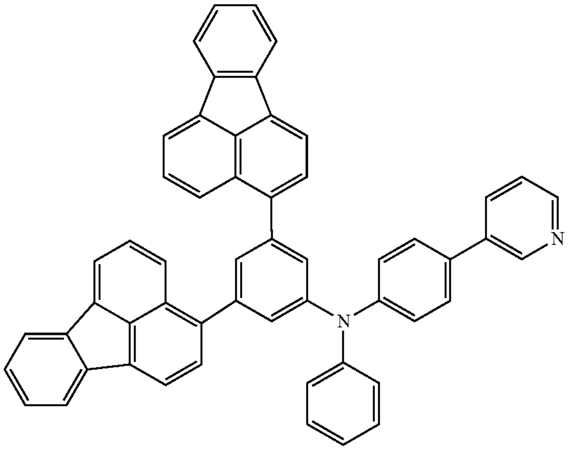
-continued
ET-54
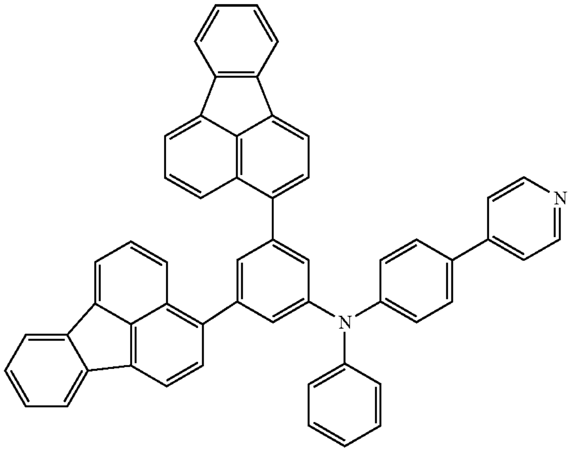
ET-55
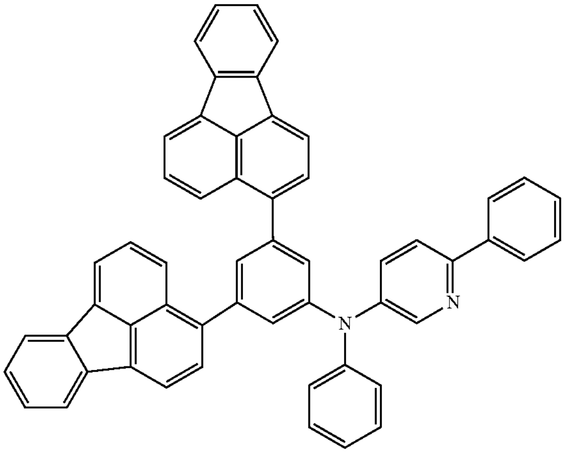
ET-56
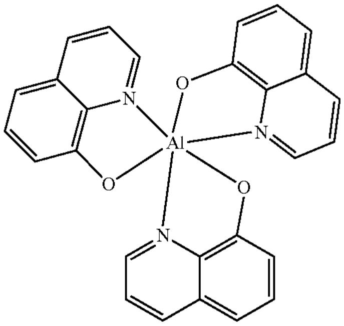
ET-57
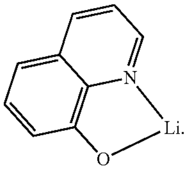

18. The organic light emitting device according to claim 1, wherein the host material is a H2 having the following structure,

H2

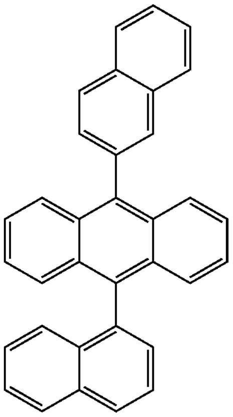

;

and the boron-nitrogen material is selected from compounds represented by the following structures:

A-137

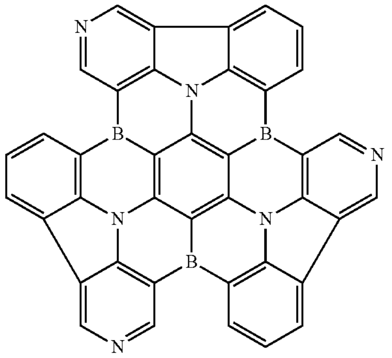

A-141

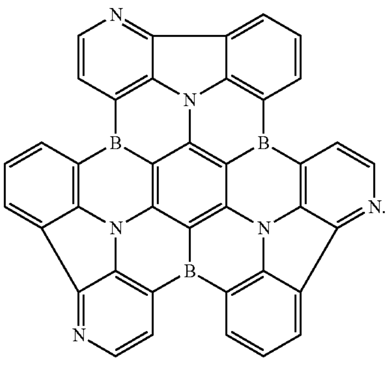

.

19. An organic light emitting device, comprising a light-emitting layer, wherein the light-emitting layer comprises a host material and a dye, the host material is a triplet-triplet annihilation material, and the dye is a boron-nitrogen material represented by Formula 1-1:

Formula 1-1

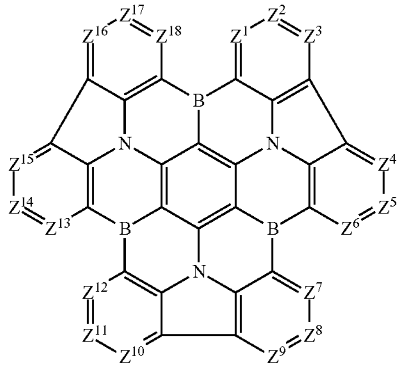

wherein, each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$;

wherein $R_b$ is independently selected from one of hydrogen, deuterium, halogen, cyano, or one of the following groups: substituted or unsubstituted C1-C36 alkyl, substituted or unsubstituted C2-C6 alkenyl, substituted or unsubstituted C1-C6 alkoxy or thioalkoxy, substituted or unsubstituted C6-C48 monocyclic or polycyclic aromatic hydrocarbon, substituted or unsubstituted C3-C48 monocyclic or polycyclic heteroaromatic hydrocarbon, and two adjacent $R_b$ groups are independent to each other or at least two adjacent $R_b$ groups are bonded to each other to form C3-C10 cycloalkane, C6-C30 aromatic hydrocarbon or C5-C30 hetero-aromatic hydrocarbon;

wherein at least one of $Z^2$, $Z^5$, $Z^8$, $Z^{11}$, $Z^{14}$, $Z^{17}$ is an N atom;

if substituents exist in the above group, each of the substituents is independently selected from one of deuterium, cyano, halogen, C1-C10 alkyl or cycloalkyl, C2-C6 alkenyl or cycloalkenyl, C1-C6 alkoxy or thioalkoxy, nitro, amine, carbonyl, carboxy, ester, C6-C30 aryl, and C3-C30 heteroaryl;

wherein a triplet energy level of the dye is higher than that of the triplet-triplet annihilation material.

20. An organic light emitting device, comprising a light-emitting layer, wherein the light-emitting layer comprises a host material and a dye, the host material is a triplet-triplet annihilation material, and the dye is a boron-nitrogen material represented by Formula 1:

Formula 1

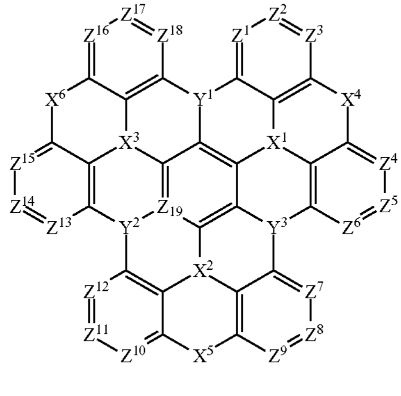

wherein, each of $Y^1$, $Y^2$, and $Y^3$ is B;

each of $X^1$, $X^2$, and $X^3$ is N;

each of $X^4$, $X^5$ and $X^6$ is independently selected from single bond, O, S or $CR_a$;

wherein $R_a$ is independently selected from one of the following groups: substituted or unsubstituted C1-C10 alkyl, substituted or unsubstituted C6-C30 monocyclic or polycyclic aromatic hydrocarbon, and C5-C30 monocyclic or polycyclic hetero-aromatic hydrocarbon;

each of $Z^1$, $Z^2$, $Z^3$, $Z^4$, $Z^5$, $Z^6$, $Z^7$, $Z^8$, $Z^9$, $Z^{10}$, $Z^{11}$, $Z^{12}$, $Z^{13}$, $Z^{14}$, $Z^{15}$, $Z^{16}$, $Z^{17}$, and $Z^{18}$ is independently selected from N or $CR_b$, wherein $R_b$ is independently selected from one of hydrogen, deuterium, halogen, cyano, or one of the following groups: substituted or unsubstituted C1-C36 alkyl, substituted or unsubstituted C2-C6 alkenyl, substituted or unsubstituted C1-C6 alkoxy or thioalkoxy, substituted or unsubstituted C6-C48 monocyclic or polycyclic aromatic hydrocarbon, substituted or unsubstituted C3-C48 monocyclic or polycyclic heteroaromatic hydrocarbon, and two adjacent $R_b$ groups are independent to each other or at least two adjacent $R_b$ groups are bonded to each other to form C3-C10 cycloalkane, C6-C30 aromatic hydrocarbon or C5-C30 hetero-aromatic hydrocarbon;

$Z_{19}$ is C; and if substituents exist in the above group, each of the substituents is independently selected from one of deuterium, cyano, halogen, C1-C10 alkyl or cycloalkyl, C2-C6 alkenyl or cycloalkenyl, C1-C6 alkoxy or thioalkoxy, nitro, amine, carbonyl, carboxy, ester, C6-C30 aryl, and C3-C30 heteroaryl;

wherein a triplet energy level of the dye is higher than that of the triplet-triplet annihilation material;

wherein the dye has a mass proportion of 5%-20%, based on a total mass of the light-emitting layer;

wherein the boron-nitrogen material is selected from compounds represented by the following structures:

A-120

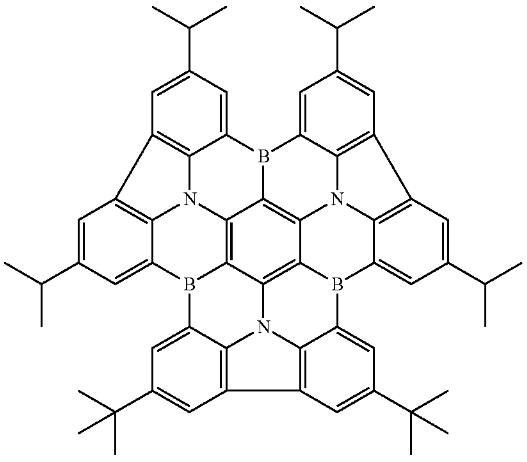

-continued

A-137

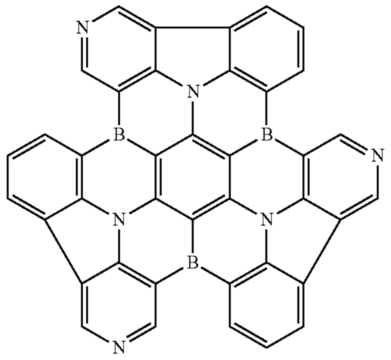

A-138

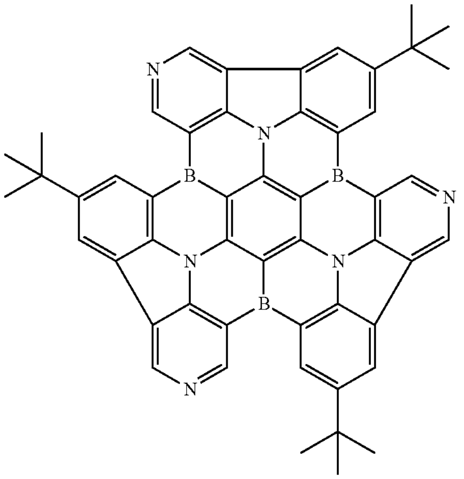

A-139

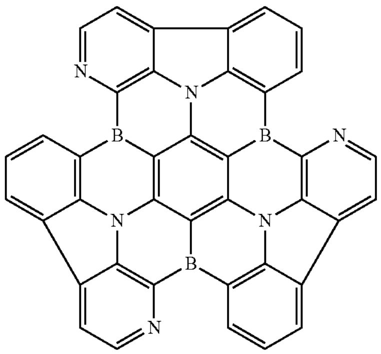

-continued
A-140
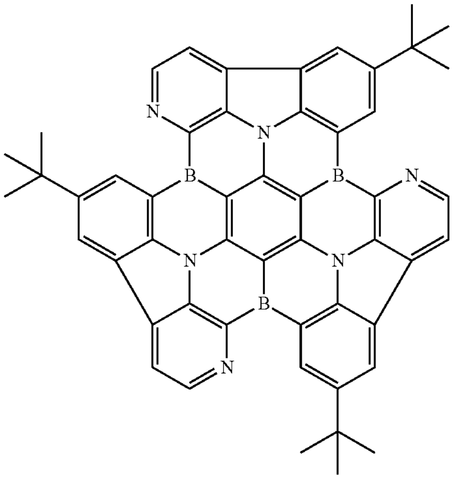
A-141
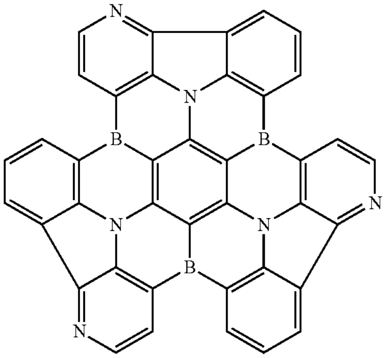
A-142
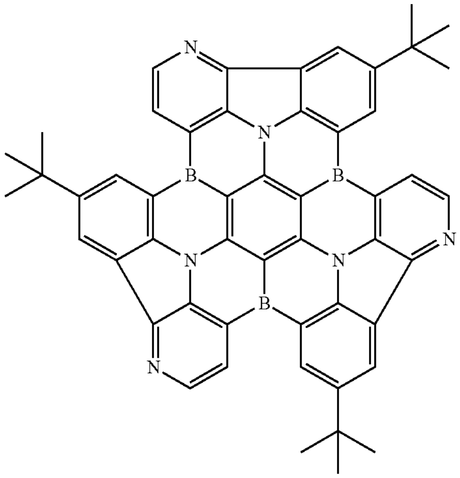
-continued
A-143
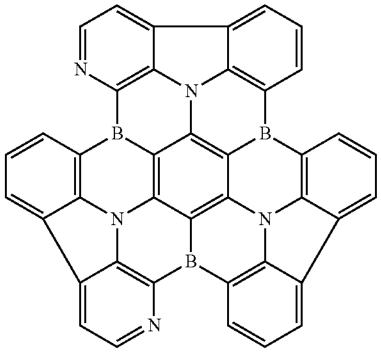
A-144
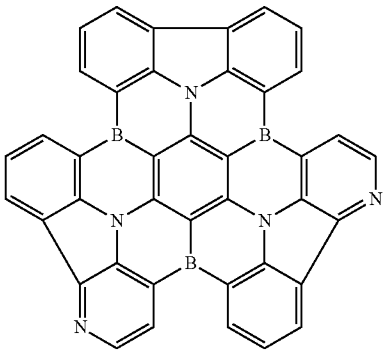
A-145
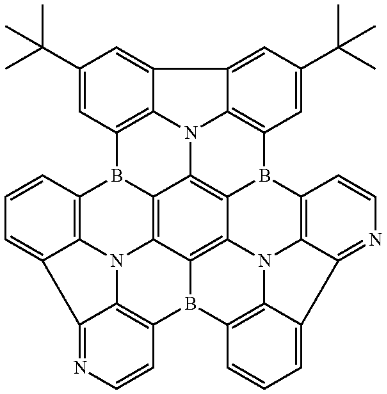
A-146
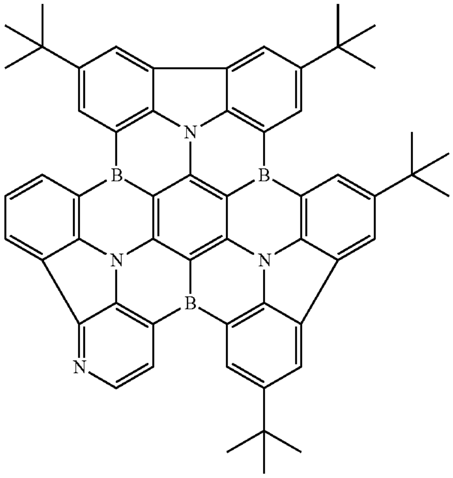

-continued
A-147
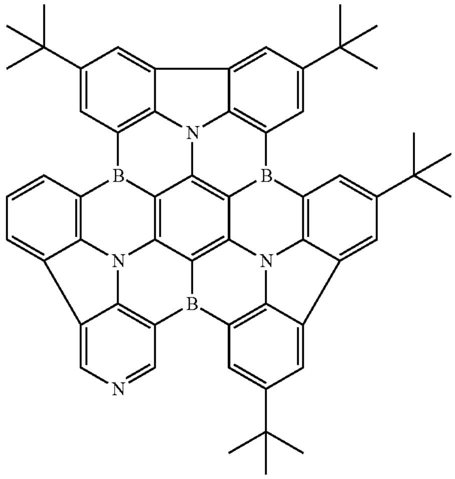
A-148
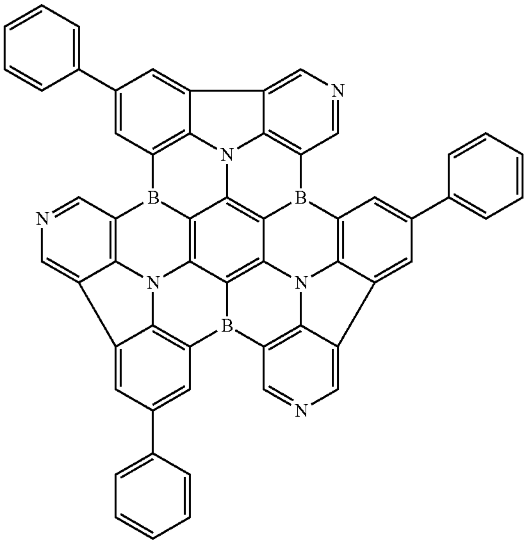
-continued
A-149
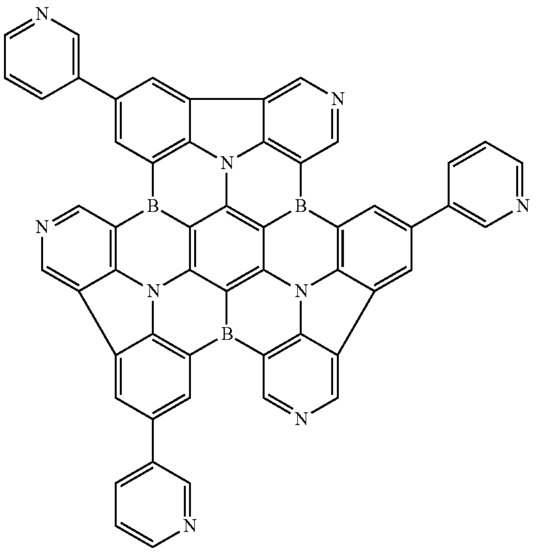
A-150
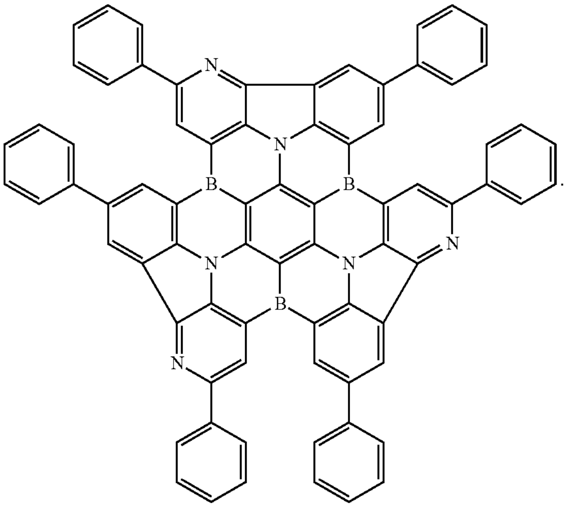
.
* * * * *